(12) United States Patent
Sato et al.

(10) Patent No.: US 8,040,708 B2
(45) Date of Patent: Oct. 18, 2011

(54) SEMICONDUCTOR DEVICE

(75) Inventors: Yukihiro Sato, Tokyo (JP); Tomoaki Uno, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 312 days.

(21) Appl. No.: 12/480,112

(22) Filed: Jun. 8, 2009

(65) Prior Publication Data

US 2010/0059875 A1      Mar. 11, 2010

(30) Foreign Application Priority Data

Sep. 10, 2008   (JP) ................................. 2008-231978

(51) Int. Cl.
*H02M 1/00* (2007.01)

(52) U.S. Cl. ......... 363/147; 363/146; 363/144; 323/282

(58) Field of Classification Search .................. 323/282; 363/144, 146, 147
See application file for complete search history.

(56) References Cited

U.S. PATENT DOCUMENTS

| 4,990,976 | A  | * | 2/1991 | Hattori .......................... 257/379 |
| 6,316,922 | B1 | * | 11/2001 | Sugahara et al. .............. 323/224 |
| 6,700,793 | B2 | * | 3/2004 | Takagawa et al. ............. 361/777 |
| 2007/0228534 | A1 | | 10/2007 | Uno et al. | |

FOREIGN PATENT DOCUMENTS

JP           2007-266218 A       10/2007

* cited by examiner

*Primary Examiner* — Bao Q Vu
(74) *Attorney, Agent, or Firm* — Mattingly & Malur, PC

(57) ABSTRACT

The reliability of a semiconductor device is improved. A package of a semiconductor device internally includes a first semiconductor chip and a second semiconductor chip in which power MOS•FETs are formed and a third semiconductor chip in which a control circuit controlling the first and second semiconductor chips is formed. The first to third semiconductor chips are mounted on die pads respectively. Source electrode bonding pads of the first semiconductor chip on a high side are electrically connected with a first die pad of the die pads via a metal plate. On a top surface of the die pad 7D2, a plated layer formed in a region where the second semiconductor chip is mounted, and another plated layer formed in a region where the metal plate is joined are provided and the plated layers are separated each other with a region where no plated layer is formed in between.

21 Claims, 37 Drawing Sheets

SEMICONDUCTOR DEVICE

CROSS-REFERENCE TO RELATED APPLICATION

The disclosure of Japanese Patent Application No. 2008-231978 filed on Sep. 10, 2008 including the specification, drawings and abstract is incorporated herein by reference in its entirety.

BACKGROUND OF THE INVENTION

The present invention relates to a semiconductor device and, more particularly, to a technique effective when applied to a semiconductor device including a DC-DC converter.

In recent years, in order to achieve the reduction in size and the high-speed response of a power source circuit etc., the frequency of a power MOS•FET (Metal Oxide Semiconductor Field Effect Transistor) to be used in a power source circuit is increased.

In particular, the current and frequency of a CPU or DSP of a personal computer of desktop or notebook type, server, gaming machine, etc., tend to increase. Because of this, a power MOS•FET constituting a non-insulating DC-DC converter that controls the power source of the CPU (Central Processing Unit) and DSP (Digital Signal Processor) is being developed to achieve a technique capable of coping with large currents and high frequencies.

A DC-DC converter widely used as an example of a power source circuit has a configuration in which a power MOS•FET for a high-side switch and a power MOS•FET for a low-side switch are connected in series. The power MOS•FET for a high-side switch has a switch function for controlling a DC-DC converter and the power MOS•FET for a low-side switch has a switch function for synchronous rectification and the voltage of the power source is converted by alternately turning on/off these two power MOS•FETs in synchronization with each other.

In Japanese patent laid-open No. 2007-266218 (patent document 1), a technique relating to a semiconductor device is described, in which a semiconductor chip having a power MOS•FET for a high-side switch formed, a semiconductor chip having a power MOS•FET for a low-side switch formed, and a semiconductor chip having a control circuit formed that controls their operations are included in one package.

SUMMARY OF THE INVENTION

According to the study made by the present inventors, the following has been found.

The present inventors have studied a semiconductor device in which a semiconductor chip having a power MOS•FET for a high-side switch constituting a DC-DC converter formed, a semiconductor chip having a power MOS•FET for a low-side switch formed, and a semiconductor chip having a control circuit formed that controls the operation of the power MOS•FETs are sealed in the same package.

In the semiconductor device, each semiconductor chip is mounted on each die pad. Because of a circuit configuration of a DC-DC converter, it is necessary to electrically connect the source electrode of the semiconductor chip having a power MOS•FET for a high-side switch formed to the drain electrode of the semiconductor chip having a power MOS•FET for a low-side switch formed. At this time, in the semiconductor chip having a power MOS•FET for a low-side switch formed, a drain back surface electrode is formed on the back surface of the semiconductor chip, and therefore, it is preferable to connect by soldering the semiconductor chip onto the die pad and electrically connect via a metal plate the die pad and a source electrode bonding pad of the semiconductor chip having a power MOS•FET for a high-side switch formed. By using a metal plate, it is possible to reduce the loss of conduction and improve the electrical characteristics of the semiconductor device compared to a case where a bonding wire is used.

When joining a semiconductor chip or metal plate to a die pad, it is preferable to use solder from the standpoint of improvement in electrical conductivity, improvement in thermal conductivity, improvement in joint strength, etc.

When connecting by soldering a semiconductor chip or metal plate to a die pad, it is desirable to form a plated layer in advance to the die pad. In particular, it is preferable for a die pad to be formed by copper (Cu) or copper (Cu) alloy because processing is easy, thermal conductivity is high, and the cost is relatively low, however, copper (Cu) or copper (Cu) alloy has poor solder wettability, and therefore, it is desirable to form a plated layer in advance in order to improve solder wettability because there is a possibility that a joint region may be unstable if connection by soldering is performed directly to copper (Cu) or copper (Cu) alloy.

Because of this, in order to stabilize a joint region and increase joint strength, it is preferable to form a plated layer in advance on the top surface of a die pad on which a semiconductor chip having a power MOS•FET for a low-side switch formed is mounted and to which a metal plate is joined in order to improve solder wettability, and connect by soldering a semiconductor chip having a power MOS•FET for a low-side switch formed and a metal plate onto the plated layer.

However, when connecting by soldering a semiconductor chip having a power MOS•FET for a low-side switch formed and a metal plate onto the plated layer formed on the top surface of a die pad, there is a possibility that the solder that joins the semiconductor chip to the die pad and the solder that joins the metal plate to the die pad spread due to wettability on the plated layer and come into contact and communicate with each other in the solder reflow process. Because of this, there is a possibility that the thickness of the solder that joins the semiconductor chip having a power MOS•FET for a low-side switch formed to the die pad is reduced, or conversely, that the thickness of the solder that joins the metal plate to the die pad is reduced, or that the metal plate moves accompanying the movement of the solder to join the metal plate to the die pad.

If the thickness of the solder that joins the semiconductor chip having a power MOS•FET for a low-side switch formed to the die pad is reduced, there is a possibility that the joint strength of the semiconductor chip is reduced or that the semiconductor chip inclines. If the thickness of the solder that joins the metal plate to the die pad is reduced, there is a possibility that the joint strength of the metal plate is reduced. In addition, if the thickness of the solder is insufficient, it becomes vulnerable to the distortion due to thermal stress. Further, if the metal plate moves, the metal plate comes into contact with unnecessary parts in the semiconductor chip and there is a possibility that a short circuit failure etc. is caused. These reduce the reliability of the semiconductor device.

In order to suppress movement of solders, it can be conceived to make the mounting position of the semiconductor chip having a power MOS•FET for a low-side switch formed in the die pad distant from the joint position of the metal plate, however, this causes an increase in size of the semiconductor device (increase in planar dimensions).

An object of the present invention is to provide a technique capable of improving reliability of a semiconductor device.

The other purposes and the new feature of the present invention will become clear from the description of the present specification and the accompanying drawings.

The following explains briefly the outline of a typical invention among the inventions described in the present application.

A semiconductor device according to a typical embodiment includes a high-side semiconductor chip having a high-side MOSFET of a DC-DC converter formed, a low-side semiconductor chip having a low-side MOSFET of the DC-DC converter formed, and a driver semiconductor chip having a driver circuit of the high-side MOSFET and the low-side MOSFET formed. The high-side semiconductor chip, the low-side semiconductor chip, and the driver semiconductor chip are mounted over a high-side chip mounting part, a low-side chip mounting part, and a driver chip mounting part, respectively, and a source electrode pad of the high-side semiconductor chip and the low-side chip mounting part are electrically connected by a metal plate and these are sealed with a sealing body. Over the top surface of the low-side chip mounting part, a low-side chip connecting plated layer formed in a region where the low-side semiconductor chip is mounted and a metal plate connecting plated layer formed in a region where the metal plate is joined are provided and the low-side chip connecting plated layer and the metal plate connecting plated layer are separated from each other with a region where no plated layer is formed interposed in between.

The following explains briefly the effect acquired by the typical invention among the inventions disclosed in the present application.

According to a typical embodiment, the reliability of a semiconductor device can be improved.

BRIEF DESCRIPTION OF THE DRAWINGS

FIG. 38 is used;

FIG. 43 is used;

DETAILED DESCRIPTION OF THE PREFERRED EMBODIMENTS

Figure 1:
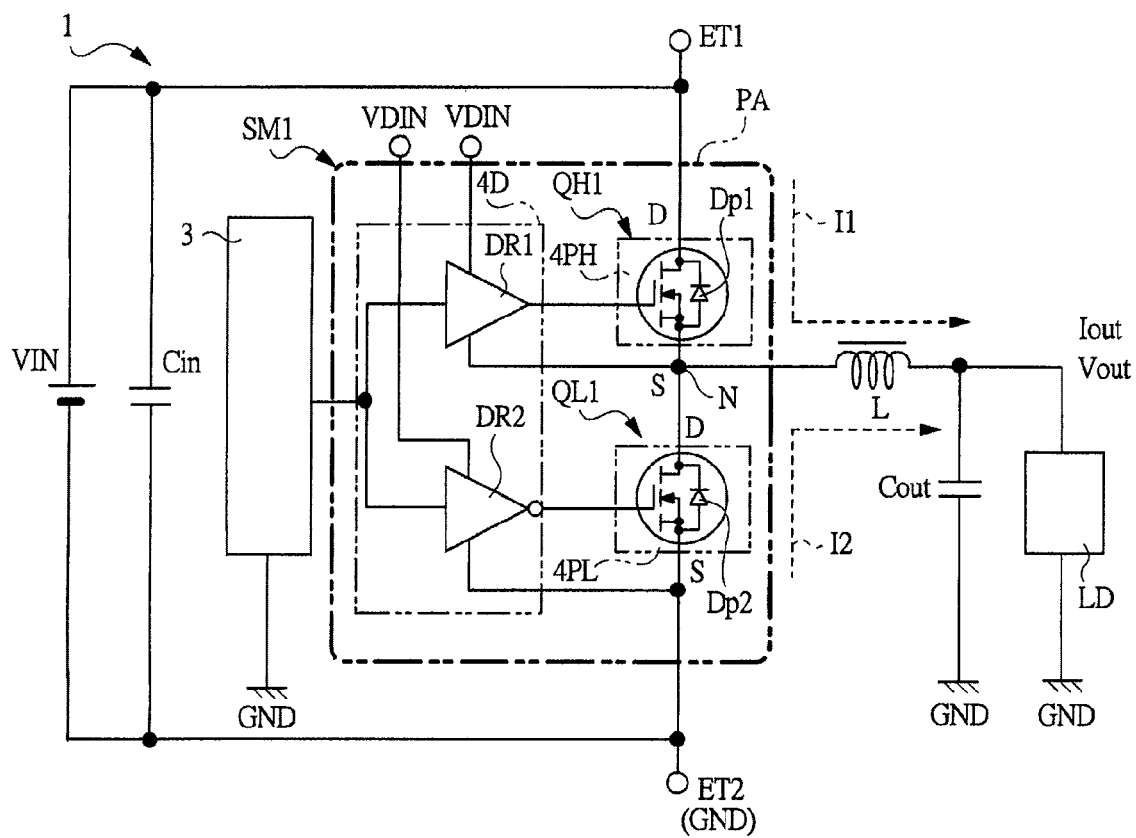
FIG. 1 is a circuit diagram showing an example of a DC-DC converter having a semiconductor device according to an embodiment of the present invention.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another. Further, in the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the following embodiments, it is needless to say that an element (including an element step etc.) is not necessarily indispensable, except for the case where it is clearly specified in particular and where it is considered to be clearly indispensable from a theoretical point of view, etc. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

Hereinafter, embodiments of the present invention will be described in detail referring to the drawings. In all the drawings for describing embodiments, the same symbol is attached to a member having the same function and the repeated description thereof is omitted. In the following embodiments, the description of the same or similar parts is not repeated, as a principle, except when it is necessary in particular.

In the drawings used in the embodiments, in order to make a drawing easier-to-see, hatching may be omitted even if it is a section view. Further, in order to make a drawing easier-to-see, hatching may be attached even if it is a plan view.

In the present application, a field effect transistor is referred to as a MOSFET (Metal Oxide Semiconductor Field Effect Transistor) or referred to simply as a MOS, however, a non-oxide film is not excluded as a gate insulating film.

First Embodiment

Figure 2:
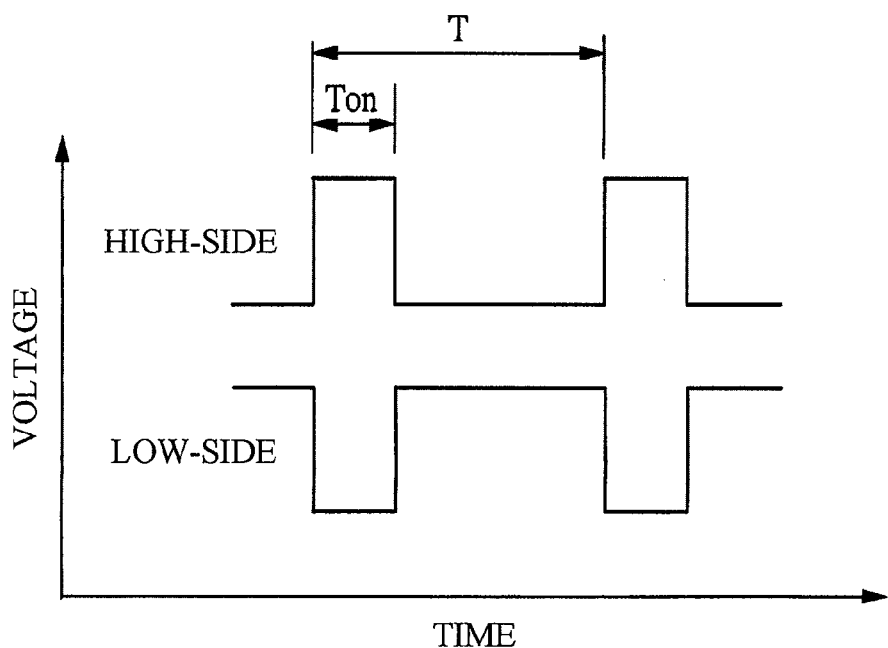
FIG. 2 is a basic operation waveform diagram of the DC-DC converter in FIG. 1.

FIG. 1 is a circuit diagram showing an example of a DC-DC converter, here, a non-insulating DC-DC converter (DC-DC converter) 1, having a semiconductor device (semiconductor package) SM1 in an embodiment of the present invention, and FIG. 2 is a basic operation waveform chart of the non-insulating DC-DC converter 1 in FIG. 1.

The non-insulating DC-DC converter 1 is used in a power source circuit of electronics, such as a personal computer of desktop type, personal computer of notebook type, server, gaming machine, etc., having the semiconductor device SM1, a control circuit 3, an input capacitor Cin, an output capacitor Cout, and a coil L. Symbol VIN denotes an input power source, GND denotes a reference potential (for example, 0 V at ground potential), Iout denotes an output current, and Vout denotes an output voltage.

The semiconductor device SM1 has two driver circuits (drive circuits) DR1, DR2, which are drive circuits, and two power MOS•FETs (Metal Oxide Semiconductor Field Effect Transistors: hereinafter, referred to simply as a power MOS) QH1, QL1. The driver circuits DR1, DR2 and the power MOS•FETs QH1, QL1 are sealed (housed) in the same single package PA (package PA constituting the semiconductor device SM1).

The driver circuits (drive circuits) DR1, DR2 are circuits that respectively control the potentials of gate terminals of the power MOS's QH1, QL1 and control the operation of the power MOS's QH1, QL1 in accordance with a pulse width modulation (PWM) signal supplied from the above-mentioned control circuit 3. The output of the driver circuit DR1, one of the driver circuits, is electrically connected to the gate terminal of the power MOS QH1. The output of the other driver circuit DR2 is electrically connected to the gate terminal of the power MOS QL1. The two driver circuits DR1, DR2 are formed in the same semiconductor chip (driver semiconductor chip) 4D. VDIN denotes the input power source of the driver circuits DR1, DR2.

The above-mentioned power MOS's QH1, QL1 are connected in series between a high potential (first power source potential) supply terminal (first power source terminal) ET1 of the input power source VIN and a reference potential (second power source potential) GND supply terminal (second power source terminal) ET2. That is, the source/drain path of the power MOS QH1 is connected in series between the high potential supply terminal ET1 of the input power source VIN and an output node (output terminal) N and the source/drain path of the power MOS QL1 is connected in series between the output node N and the reference potential GND supply terminal ET2. Symbol Dp1 denotes a parasitic diode (internal diode) of the power MOS QH1 and Dp2 denotes a parasitic diode (internal diode) of the power MOS QL1. Symbol D denotes the drain of the power MOS's QH1, QL1 and S denotes the source of the power MOS's QH1, QL1.

The power MOS (field effect transistor, power transistor) QH1 is a field effect transistor for a high-side switch (high potential side: first operating voltage; hereinafter, referred simply to as high-side) and has a switch function to store energy in the above-mentioned coil L. The coil L is an element that supplies power to the output (input of a load LD) of the non-insulating DC-DC converter 1.

The high-side power MOS QH1 is formed in a semiconductor chip (high-side semiconductor chip) 4PH different from the above-mentioned semiconductor chip 4D. In addition, the power MOS•FET QH1 is formed by, for example, an n-channel type field effect transistor. Here, the channel of the field effect transistor is formed in the thickness direction of the semiconductor chip 4PH. In this case, it is possible to increase the channel width per unit area and reduce the ON resistance compared to a field effect transistor in which its channel is formed along the main surface of the semiconductor chip 4PH (surface perpendicular to the thickness direction of the semiconductor chip 4PH), and therefore, reduction in size of the element can be realized and packaging can be made compact.

On the other hand, the power MOS (field effect transistor, power transistor) QL1 is a field effect transistor for a low-side switch (low potential side: second operating voltage; hereinafter, referred to simply as low-side) and has a function to perform rectification by reducing the resistance of the transistor in synchronization with the frequency from the control circuit 3. That is, the power MOS QL1 is a transistor for rectification of the non-insulating DC-DC converter 1.

The low-side power MOS QL1 is formed in a semiconductor chip (low-side semiconductor chip) 4PL different from the above-mentioned semiconductor chips 4D, 4PH. The power MOS QL1 is formed by, for example, an n-channel type power MOS and its channel is formed in the thickness direction of the semiconductor chip 4PL like the above-mentioned power MOS QH1. The reason of using a power MOS having the channel formed in the thickness direction of the semiconductor chip 4PL is that as shown in the basic operation waveform of the non-insulating DC-DC converter 1 in FIG. 2, its ON time (time applying a voltage) of the low-side power MOS QL1 is longer than the ON time of the high-side power MOS QH1 and the loss due to the ON resistance seems larger than the switching loss, and therefore, when a field effect transistor having the channel formed in the thickness direction of the semiconductor chip 4PL is used, it is possible to increase the channel width per unit area compared to the case where a field effect transistor having the channel formed along the main surface of the semiconductor chip 4PL is used. That is, by forming the low-side power MOS QL1 by a field effect transistor having the channel formed in the thickness direction of the semiconductor chip 4PL, the ON resistance can be reduced, and therefore, it is possible to improve voltage conversion efficiency even if the current that flows through the non-insulating DC-DC converter 1 increases. Here, in FIG. 2, Ton denotes the pulse width when the high-side power MOS QH1 is ON and T denotes the pulse period.

It is possible to regard the above-mentioned high-side power MOS QH1 as a high-side MOSFET of a DC-DC converter (here, non-insulating DC-DC converter 1) and the above-mentioned low-side power MOS QL1 as a low-side MOSFET of a DC-DC converter (here, non-insulating DC-DC converter 1). In addition, it is possible to regard the above-mentioned driver circuits DR1, DR2 as a driver circuit (drive circuit) of the power MOS's QH1, QL1.

The above-mentioned control circuit 3 is a circuit that controls the operation of the power MOS's QH1, QL1 and includes, for example, a PWM (Pulse Width Modulation) circuit. The PWM circuit compares an instruction signal with the amplitude of a triangle wave and outputs a PWM signal (control signal). It is designed so that the PWM signal is used to control the output voltage (that is, the width of the voltage switch ON (ON time) of the power MOS's QH1, QL1) of the power MOS's QH1, QL1 (that is, non-insulating DC-DC converter 1).

The output of the control circuit 3 is electrically connected to the inputs of the driver circuits DR1, DR2. The outputs of the driver circuits DR1, DR2 are electrically connected to the gate terminal of the power MOS QH1 and the gate terminal of the power MOS QL1, respectively.

The above-mentioned input capacitor Cin is a power source that temporarily stores energy (charges) supplied from the input power source VIN and supplies the stored energy to the main circuit of the non-insulating DC-DC converter 1, and is electrically connected in parallel with the input power source VIN. The above-mentioned output capacitor Cout is electrically connected between the output wire that connects the above-mentioned coil L and the load LD and the reference potential GND supply terminal.

The wire that connects the source of the power MOS QH1 and the drain of the power MOS QL1 of the non-insulating DC-DC converter 1 is provided with the above-mentioned output node N that supplies the output power source potential to the outside. The output node N is electrically connected with the coil L via the output wire and is further electrically connected with the load LD via the output wire. The load LD includes, for example, a hard disk drive HDD, ASIC (Application Specific Integrated Circuit), FPGA (Field Programmable Gate Array), extension card (PCI CARD), memory (DDR memory, DRAM (Dynamic RAM), flash memory, etc.), CPU (Central Processing Unit), etc.

In such a non-insulating DC-DC converter 1, conversion of the power source voltage is performed by alternately turning ON/OFF the power MOS's QH1, QL1 in synchronization with each other. That is, when the high-side power MOS QH1 is ON, a current (first current) I1 flows from the terminal ET1 to the output node N through the power MOS QH1. On the other side, when the high-side power MOS QH1 is OFF, a current I2 flows resulting from the counter electromotive force of the coil L. It is possible to reduce voltage drop by turning ON the low-side power MOS QL1 while the current I2 is flowing.

Figure 3:
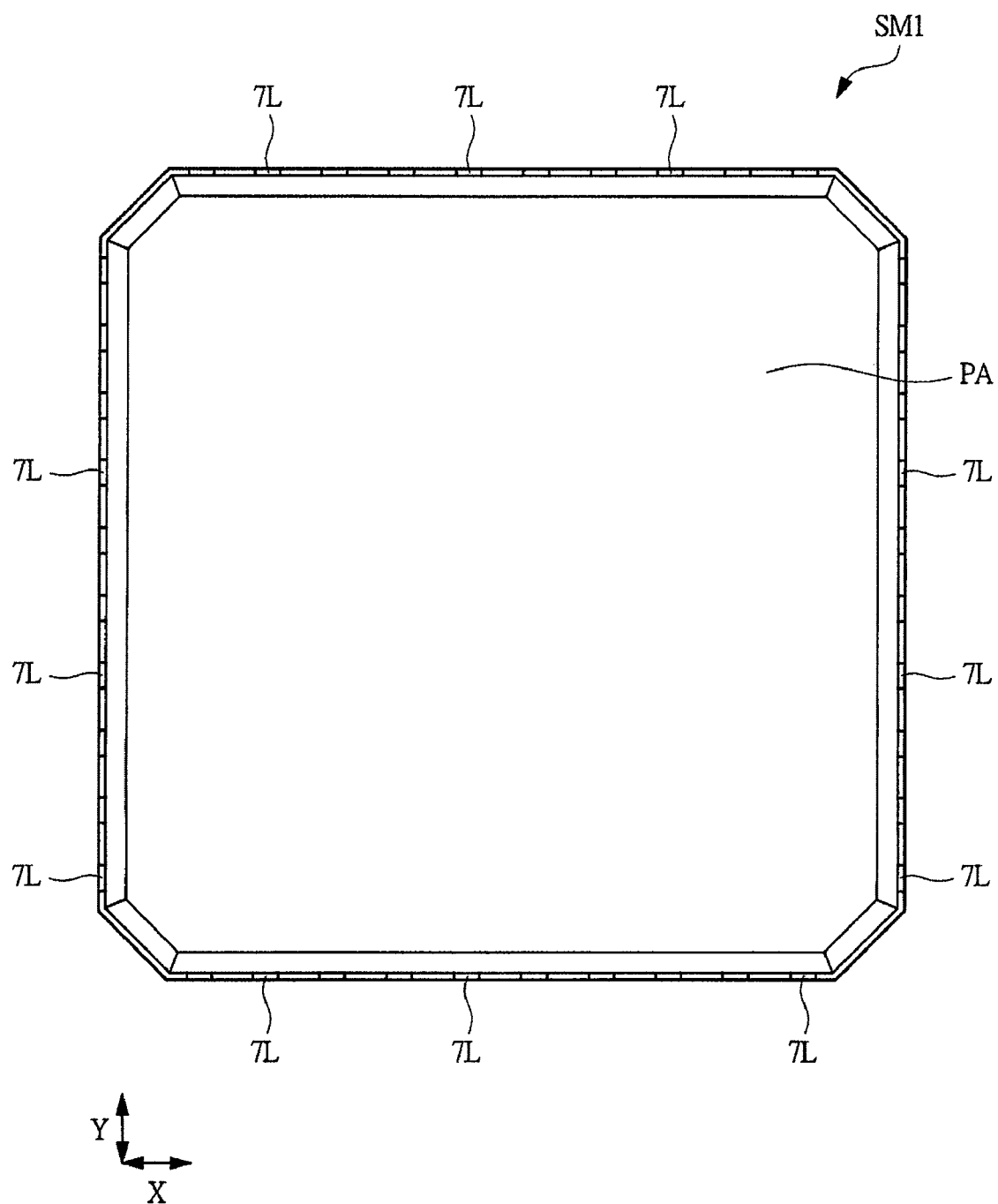
FIG. 3 is a top view of a semiconductor device according to an embodiment of the present invention.
Figure 4:
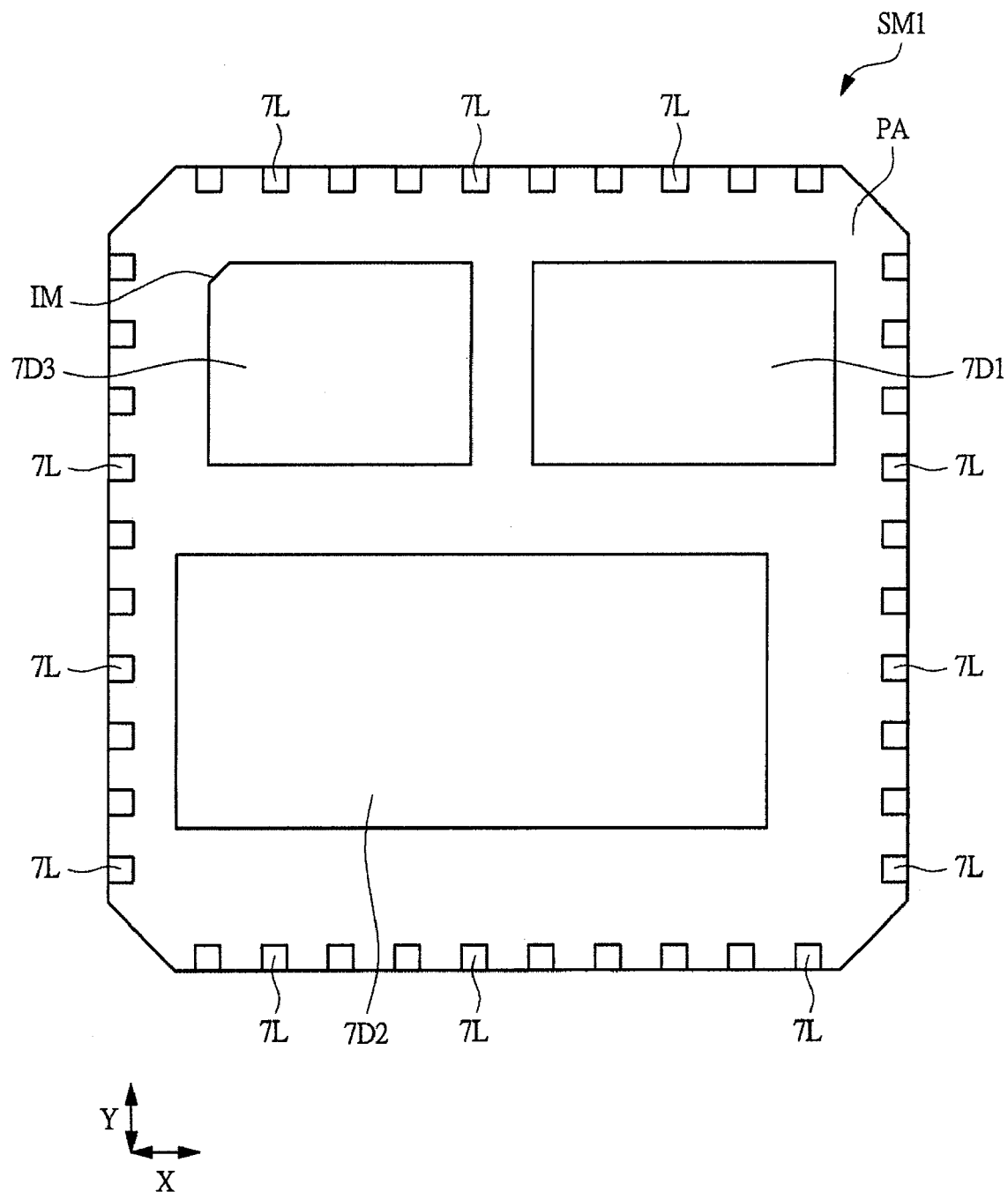
FIG. 4 is a bottom view (back view) of a semiconductor device according to an embodiment of the present invention.
Figure 5:
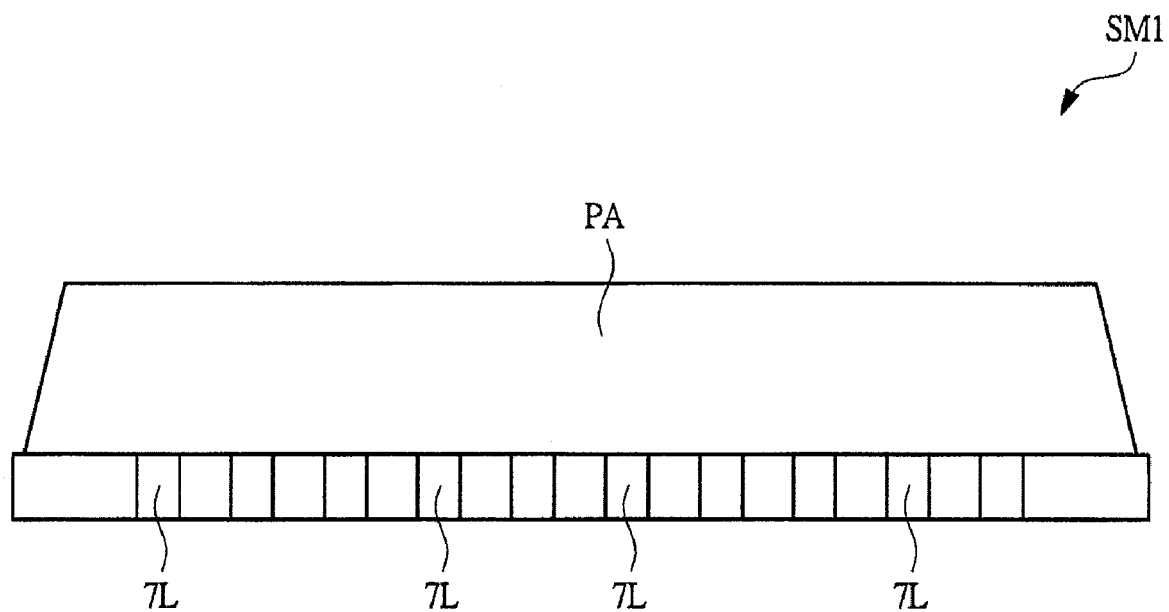
FIG. 5 is a side view of a semiconductor device according to an embodiment of the present invention.

Next, FIG. 3 shows an overall plan view on the main surface side of the package PA that forms the external appearance of the semiconductor device SM1 in FIG. 1, FIG. 4 shows an overall plan view on the back surface side of the package PA in FIG. 3, and FIG. 5 shows a side view of the package PA in FIG. 3 and FIG. 4. Symbol X denotes a first direction and symbol Y denotes a second direction perpendicular to the first direction X.

As described above, in the present embodiment, the semiconductor chip 4D having the driver circuits (drive circuits) DR1, DR2 formed, the semiconductor chip 4PH having the power MOS QH1, a field effect transistor for a high-side switch, formed, and the semiconductor chip 4PL having the power MOS QL1, a field effect transistor for a low-side switch, formed are integrated (packaged) into one semiconductor package to be one semiconductor device SM1. As a result, it is possible to reduce the wire parasitic inductance as well as realizing the reduction in size and thickness of the non-insulating DC-DC converter 1, and therefore, high frequencies and high efficiency can also be realized.

As described above, the semiconductor device SM1 in the present embodiment is a semiconductor device including a DC-DC converter (here, non-insulating DC-DC converter 1). In other words, the semiconductor device SM1 is a semiconductor device constituting at least part of a DC-DC converter (here, non-insulating DC-DC converter 1) and includes at least part of a DC-DC converter (here, non-insulating DC-DC converter 1).

The semiconductor device SM1 in the present embodiment has a surface mount type package (sealing body, sealing resin body, sealing resin) PA of, for example, QFN (Quad Flat Non-leaded package) type. That is, the package PA constituting the semiconductor device SM1 has an external appearance in the shape of a thin plate, surrounded by the main surface (first main surface) and the back surface (second main surface) located on the sides in opposition to each other along the thickness direction, and side surfaces intersecting them. The planar figure of the main surface and the back surface of the package PA is formed into, for example, the shape of an octagon.

The material of the package PA (material of sealing resin part) includes, for example, epoxy-based resin, however, for the reason of an attempt to reduce stress etc., it may be possible to use, for example, phenol-based curing agent, biphenyl-based thermosetting resin, to which silicone rubber, filler, etc., have been added.

On the side surface of and along the circumference of the back surface of the package PA, a plurality of leads (external terminals) 7L is exposed along the circumference of the package PA. Here, the lead 7L is formed so as not to project considerably to the outside of the package PA.

On the back surface of the package PA, the back surfaces of three die pads (first, second, and third chip mounting parts) 7D1, 7D2 and 7D3 in the shape of, for example, substantially a planar rectangle, are exposed. Among these, the exposure area of the die pad 7D2 is the largest and the exposure area of the die pad 7D1 is the second largest. At a part corresponding to one corner of the die pad 7D3 with the smallest area, a positioning taper IM (index mark) is formed.

However, the configuration of the package PA is not limited to the QFN configuration but can be modified in various ways, and for example, another flat package configuration, such as a QFP (Quad Flat Package) configuration and an SOP (Small Out-line Package) configuration, may be accepted. In the case of the QFP configuration, the leads 7L are exposed in a state where they project considerably to the outside from the four sides (side surface and circumference of back surface) of the package PA. In the case of the SOP configuration, the leads 7L are exposed in a state where they project considerably to the outside from the two sides (side surface and circumference of back surface) of the package PA.

Figure 6:
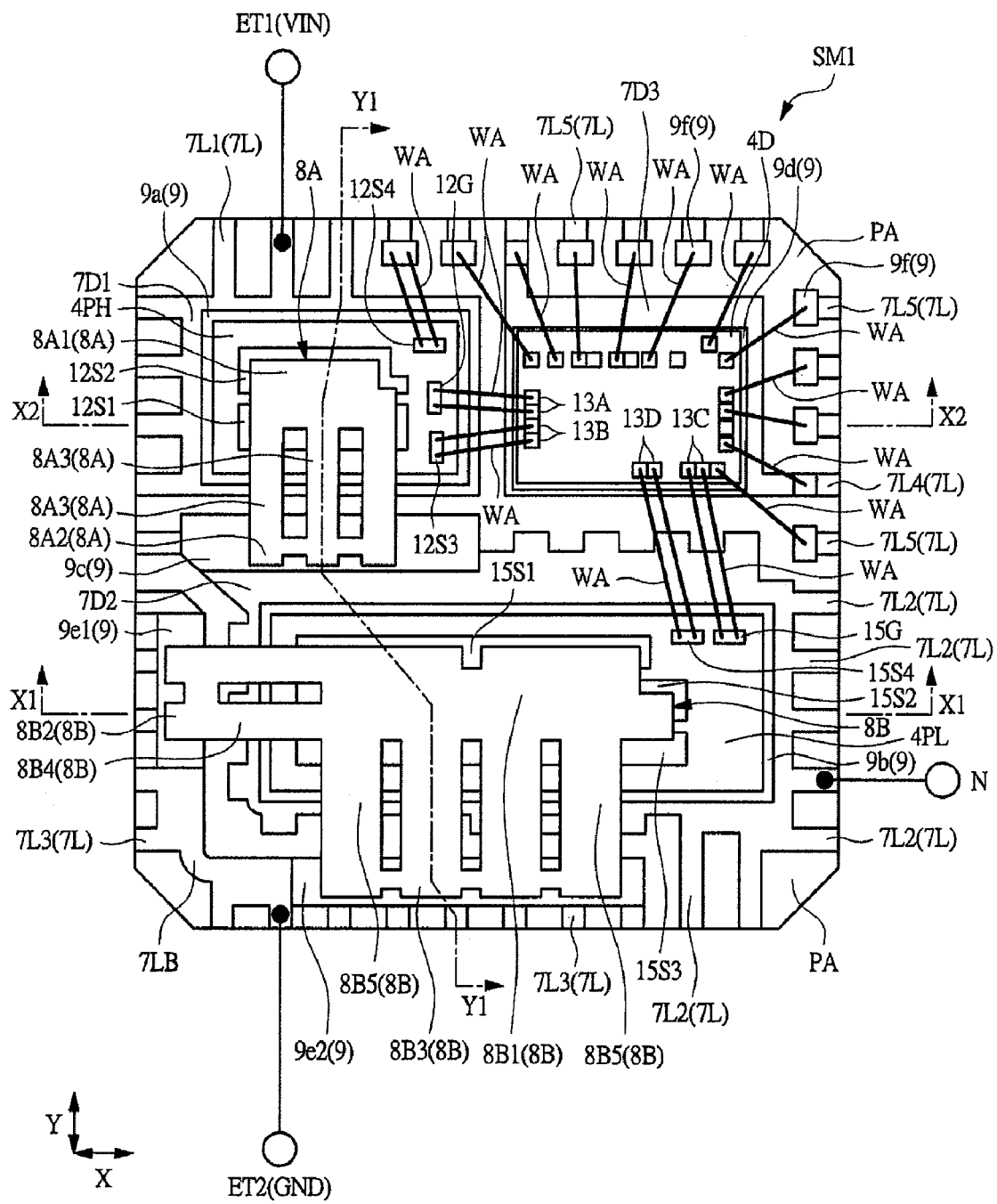
FIG. 6 is a plan perspective view of a semiconductor device according to an embodiment of the present invention.
Figure 7:
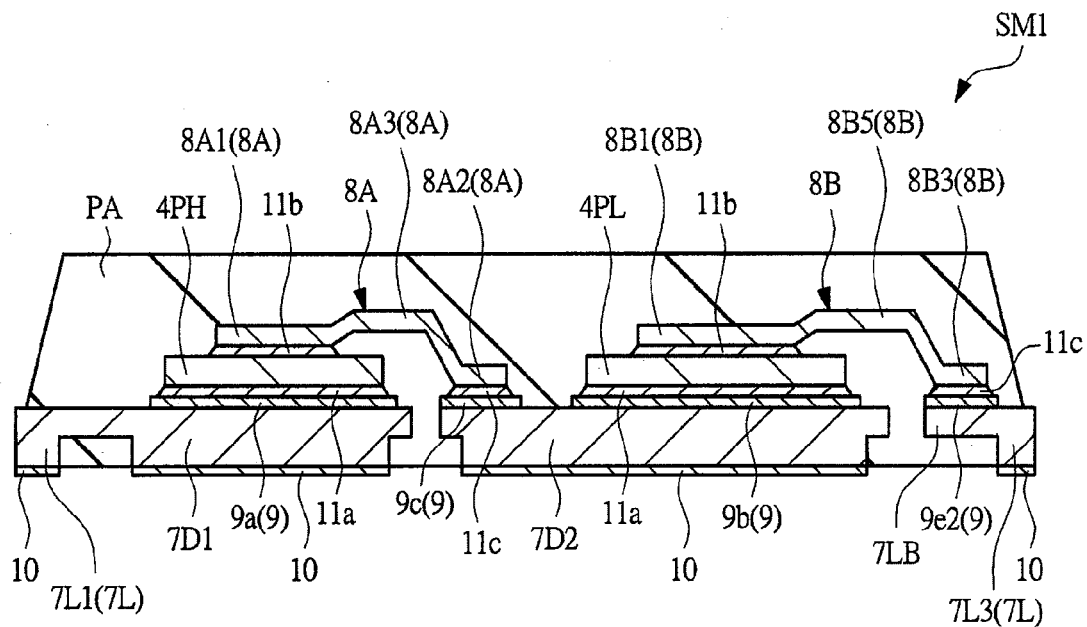
FIG. 7 is a section view of a semiconductor device according to an embodiment of the present invention.
Figure 8:
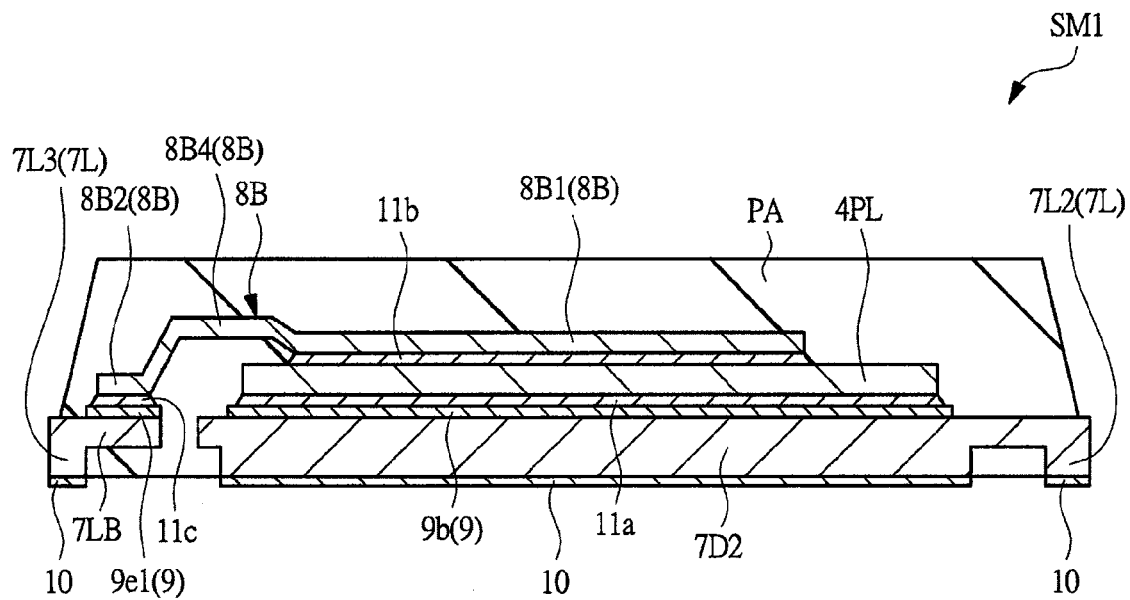
FIG. 8 is a section view of a semiconductor device according to an embodiment of the present invention.
Figure 9:
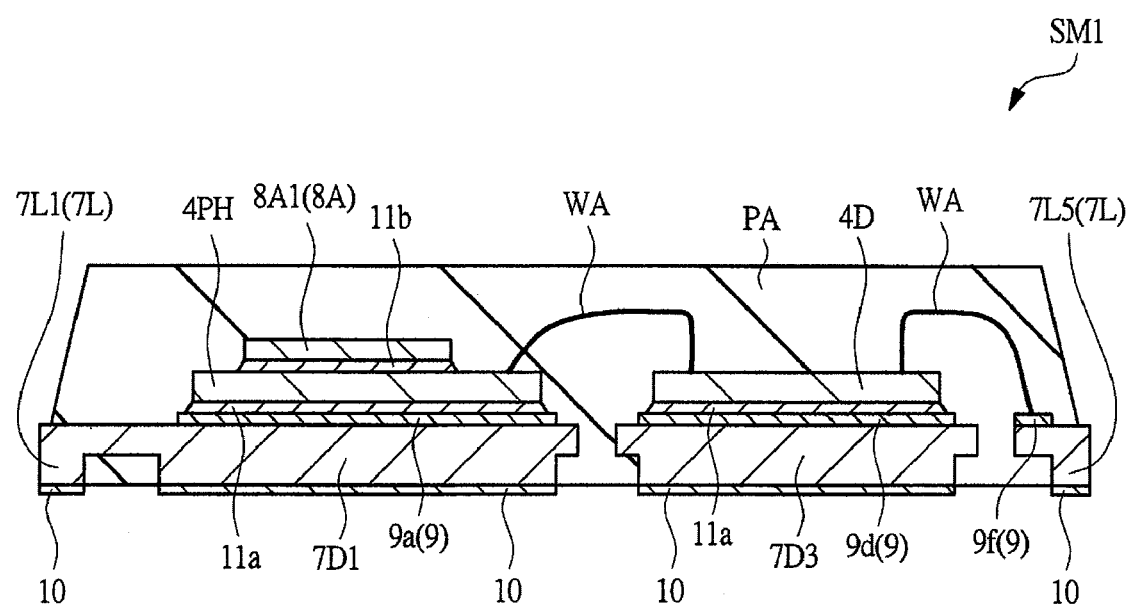
FIG. 9 is a section view of a semiconductor device according to an embodiment of the present invention.
Figure 10:
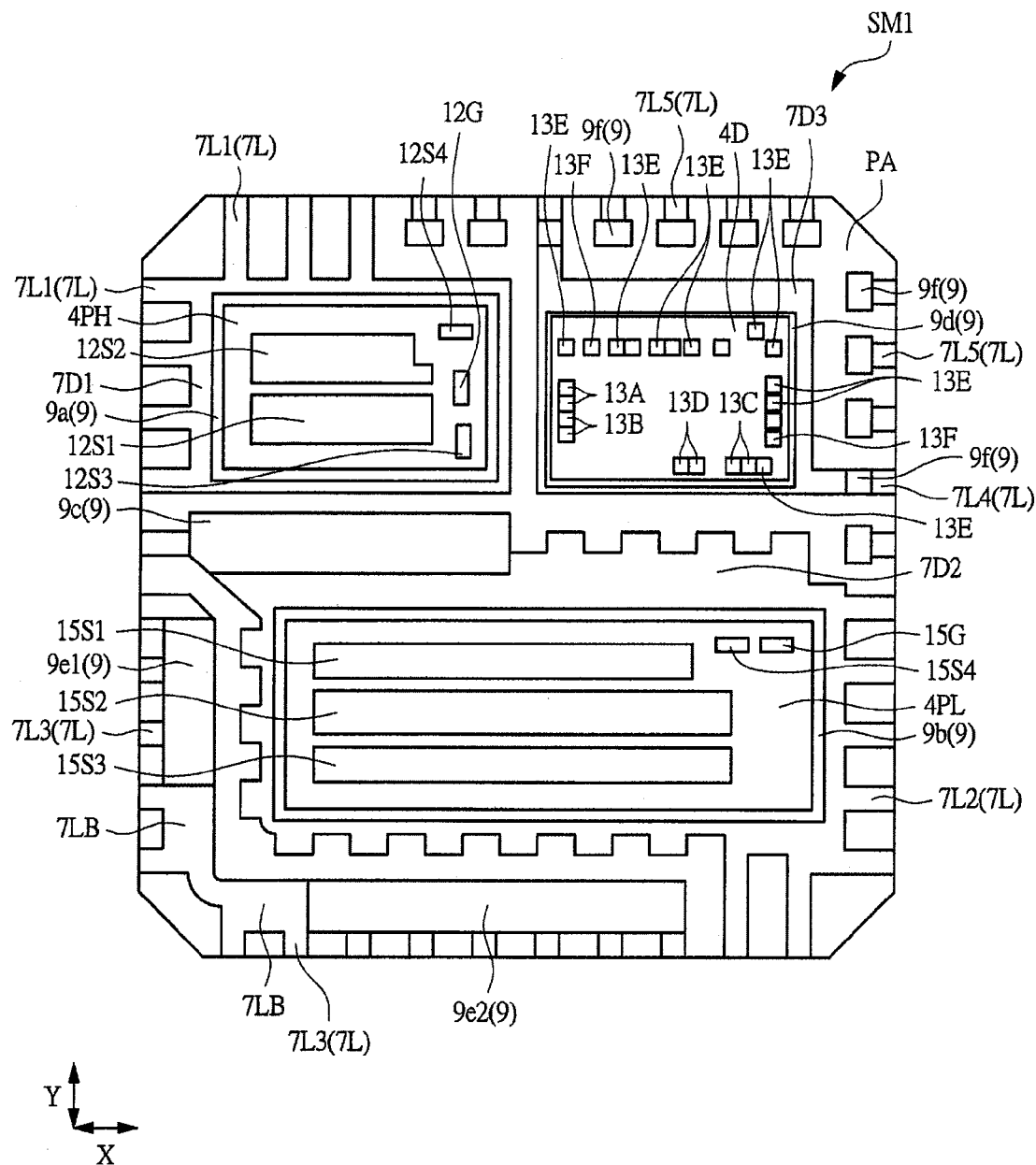
FIG. 10 is a plan perspective view of a semiconductor device according to an embodiment of the present invention.
Figure 11:
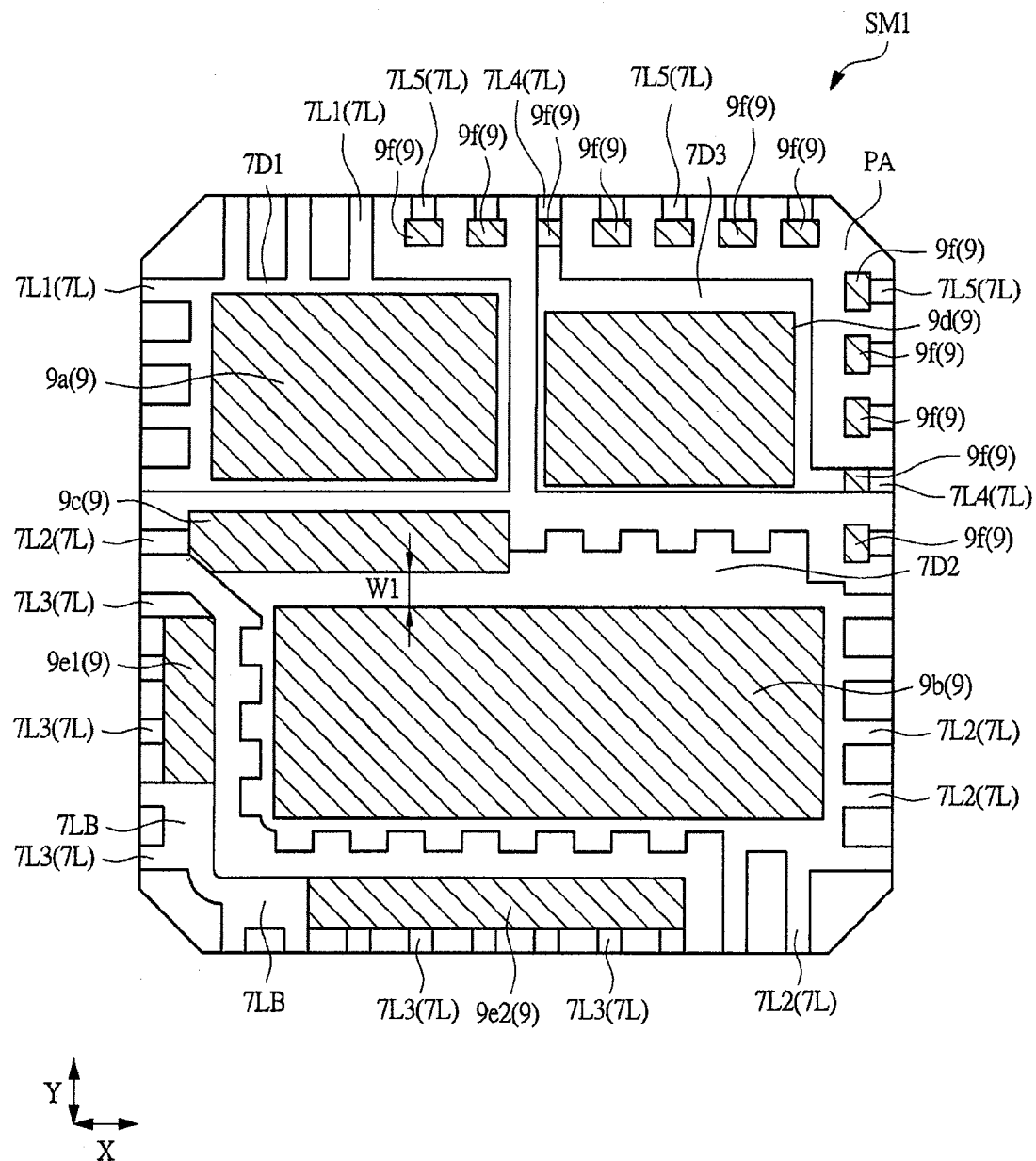
FIG. 11 is a plan perspective view of a semiconductor device according to an embodiment of the present invention.
Figure 12:
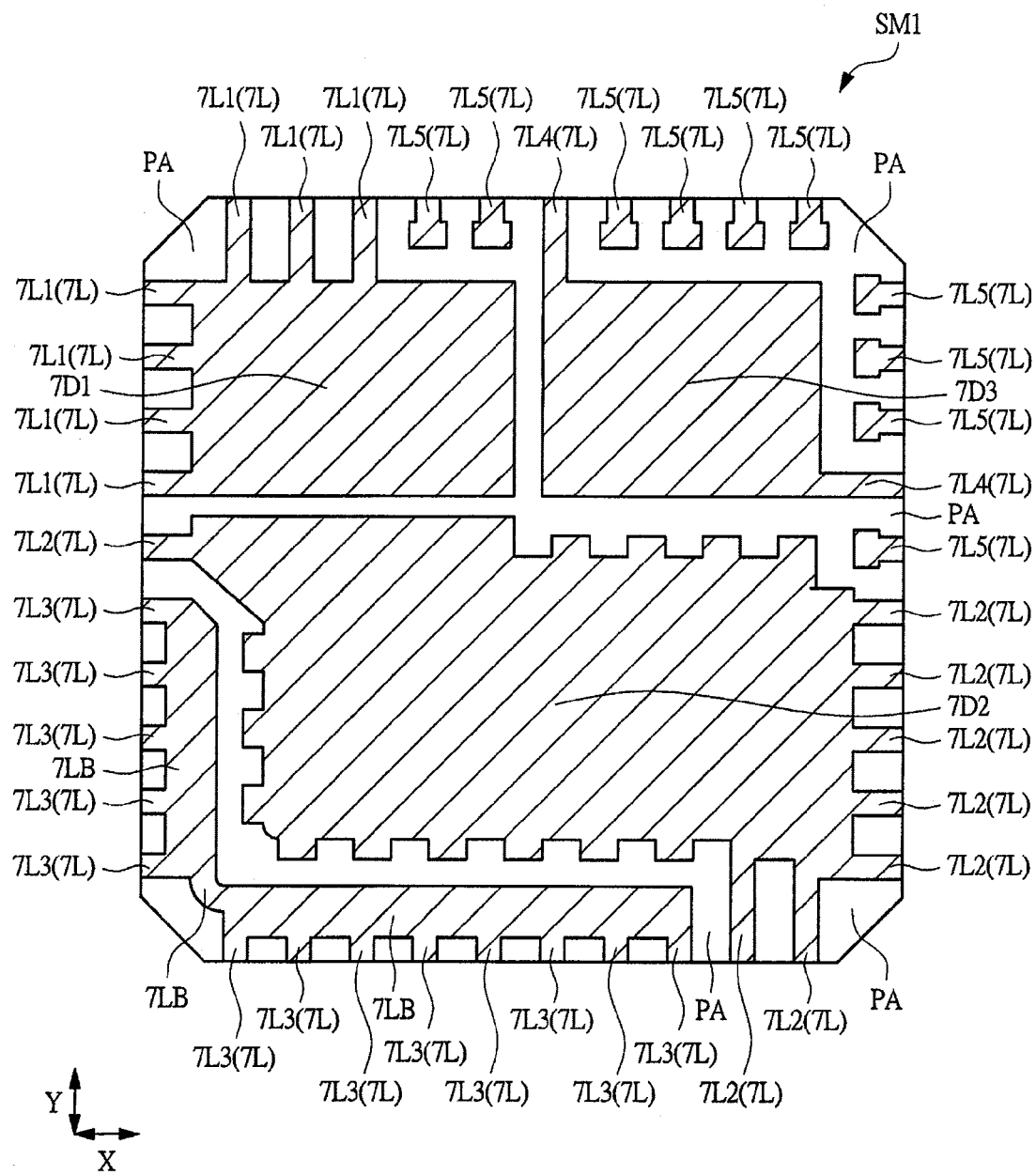
FIG. 12 is a plan perspective view of a semiconductor device according to an embodiment of the present invention.
Figure 13:
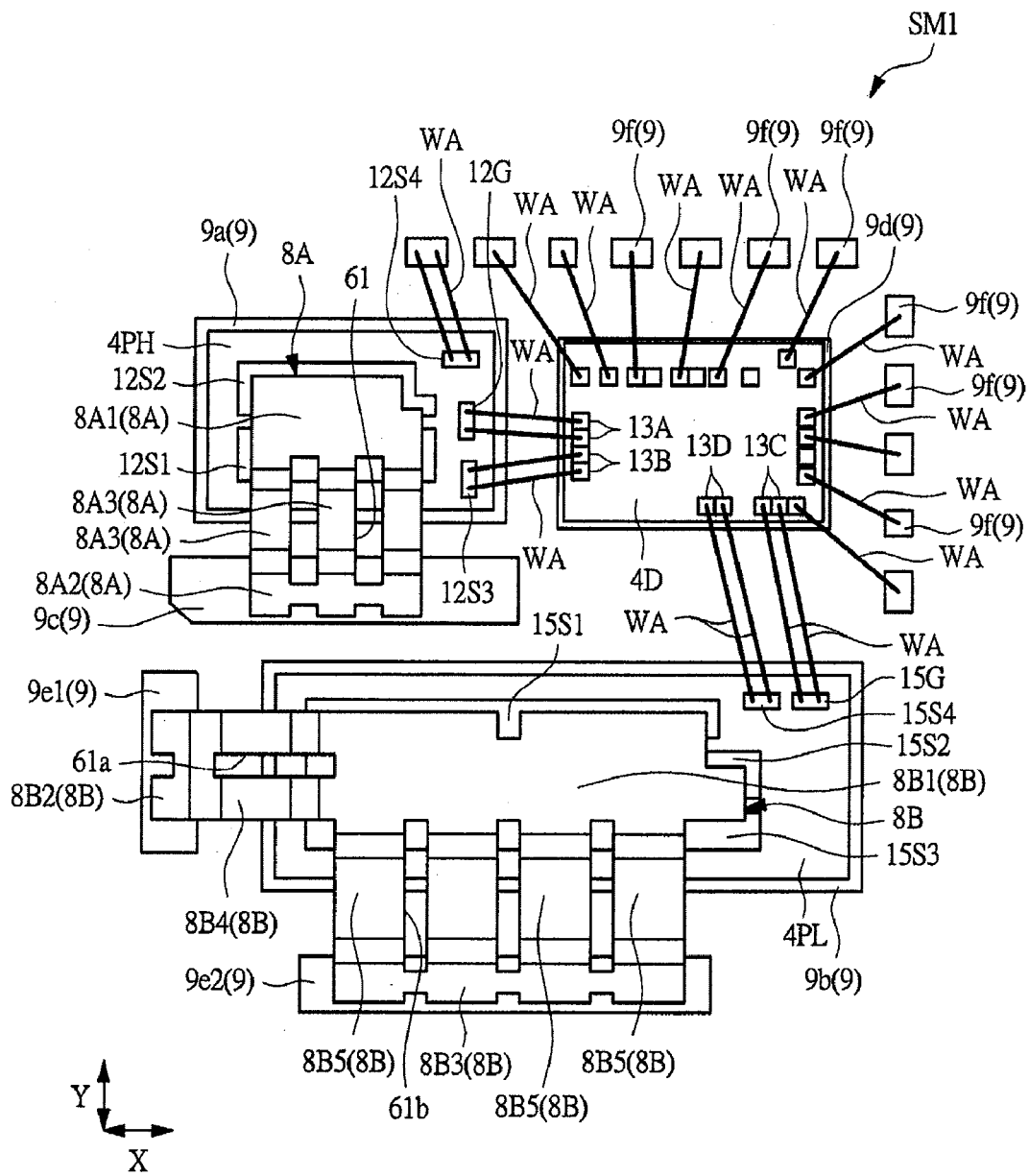
FIG. 13 is a plan perspective view of a semiconductor device according to an embodiment of the present invention.
Figure 14:
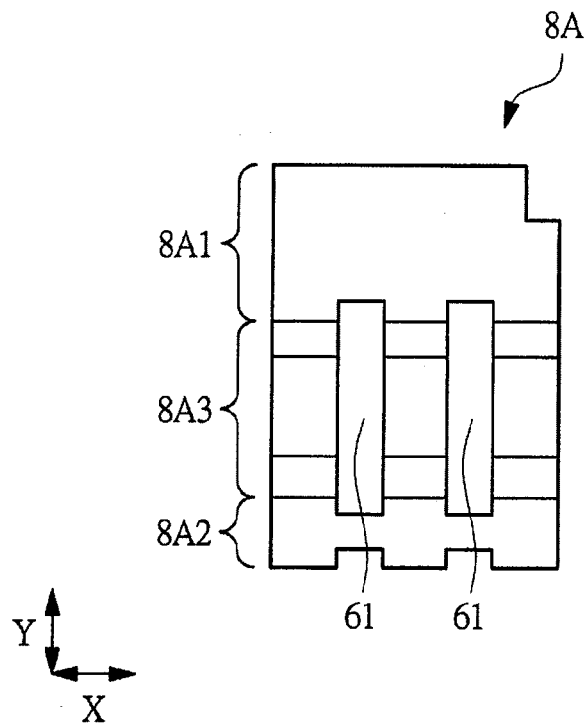
FIG. 14 is a plan view of a metal plate used in a semiconductor device according to an embodiment of the present invention.
Figure 15:
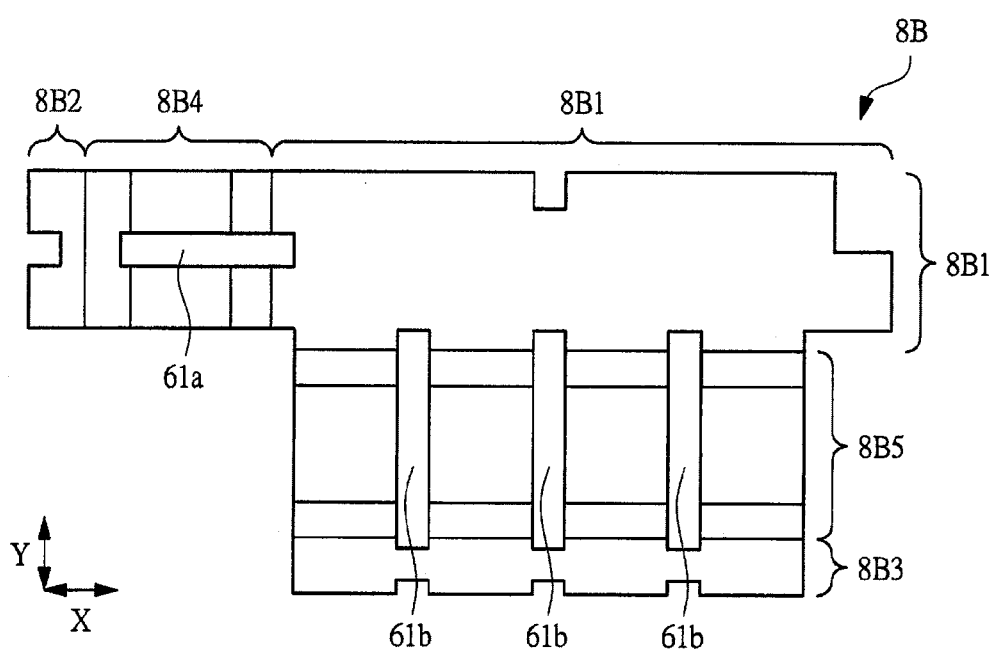
FIG. 15 is a plan view of a metal plate used in a semiconductor device according to an embodiment of the present invention.

Next, FIG. 6 is a plan perspective view of the semiconductor device SM1 in FIG. 1, showing an overall plan view representing the inside of the package PA in a perspective view. FIG. 7 to FIG. 9 are section views of the semiconductor device SM1 (side section views), wherein FIG. 7 corresponds to a section view along Y1-Y1 line in FIG. 6, FIG. 8 corresponds to a section view along X1-X1 line in FIG. 6, and FIG. 9 corresponds to a section view along X2-X2 line in FIG. 6. FIG. 10 is a plan perspective view of the semiconductor device SM1 in a state where metal plates 8A, 8B are further removed (perspective state) in FIG. 6. FIG. 11 is a plan perspective view of the semiconductor device SM1 in a state where the semiconductor chips 4D, 4PH, 4PL are further removed (perspective state) in FIG. 10. FIG. 12 is a plan perspective view of the semiconductor device SM1 in a state where a plated layer 9 is in a perspective view in FIG. 11. FIG. 11 and FIG. 12 are plan views, however, in order to make them easier-to-see, in FIG. 11, hatching is attached to the plated layer 9 and in FIG. 12, hatching is attached to the die pads 7D1, 7D2, 7D3, a lead wire 7LB and the lead 7L. FIG. 13 is a plan perspective view showing only the semiconductor chips 4PH, 4PL, 4D, the metal plates 8A, 8B, a bonding wire WA and the plated layer 9 in FIG. 6. FIG. 14 is a plan view (top view) of the metal plate 8A and FIG. 15 is a plan view (top view) of the metal plate 8B. In FIG. 13 to FIG. 15, lines representing steps on the top surfaces of the metal plates 8A, 8B are described, however, in FIG. 6 no lines representing steps on the top surfaces of the metal plates 8A, 8B are described in order to make the drawing easier-to-see.

Within the package PA, part of the three die pads (tabs, chip mounting parts) 7D1, 7D2, 7D3, the above-mentioned semiconductor chips 4PH, 4PL, 4D mounted on each main surface (top surface) of the die pads 7D1 to 7D3, the two metal plates (conductive plates) 8A, 8B, the bonding wire (hereinafter, referred to simply as a wire) WA, part of the above-mentioned leads 7L, and the lead wire (wire part) 7LB are sealed. That is, part of the die pad 7D1, part of the die pad 7D2, part of the die pad 7D3, the semiconductor chips 4PH, 4PL, 4D, the metal plates 8A, 8B, the wires WA, the lead wire 7LB, and part of the leads 7L are covered with and sealed by the sealing body PA.

The die pads 7D1 to 7D3, the above-mentioned lead 7L, and the above-mentioned lead wire 7LB are formed using metal (metal material), such as copper (Cu) and copper (Cu) alloy, as its main material.

The die pads 7D1 to 7D3 are arranged adjacently in a state where they are mutually separated by a predetermined distance. The die pads 7D1 to 7D3 are arranged such that their respective centers are shifted from the center of the package PA. Among these, the die pad 7D2 has the largest total area, the die pad 7D1 has the second largest total area, and the die pad 7D3 has the smallest total area. The die pads 7D1, 7D2 are arranged so that the respective long sides are along each other. The die pad 7D3 is arranged so that one of the sides is along the short side of the die pad 7D1 and another side intersecting the above-mentioned one side of the die pad 7D3 is along the long side of the die pad 7D2. The die pad 7D1 is a chip mounting part (high-side chip mounting part) that mounts the semiconductor chip 4PH, the die pad 7D2 is a chip mounting part (low-side chip mounting part) that mounts the semiconductor chip 4PL, and the die pad 7D3 is a chip mounting part (driver chip mounting part) that mounts the semiconductor chip 4D.

Part of the back surfaces (undersurfaces) of the die pads 7D1 to 7D3 are exposed from the back surface of the package PA as described above, and heat produced at the time of the operation of the semiconductor chips 4PH, 4PL, 4D is dissipated to the outside mainly from the back surfaces (undersurfaces) of the semiconductor chips 4PH, 4PL, 4D through the die pads 7D1 to 7D3. Because of this, each of the die pads 7D1 to 7D3 is formed so as to have a larger area than that of each of the semiconductor chips 4PH, 4PL, 4D to be mounted thereon. With this arrangement, heat dissipation property can be improved.

On the main surfaces (top surfaces) of the die pads 7D1 to 7D3, the lead 7L, and the lead wire 7LB, the plated layer 9 including silver (Ag) etc. is formed in the region where the semiconductor chips 4D, 4PH, 4PL come into contact, the region where the wire WA comes into contact, and the region where the metal plates 8A, 8B come into contact. In FIG. 11, the region where the plated layer 9 is formed is shown with hatching attached.

The plated layer 9 has a plated layer (high-side chip connecting plated layer) 9a formed in the region where the semiconductor chip 4PH is mounted on the main surface (top surface) of the die pad 7D1. The plated layer 9 further has a plated layer (low-side chip connecting plated layer) 9b formed in the region where the semiconductor chip 4PL is mounted on the main surface (top surface) of the die pad 7D2 and a plated layer (metal plate connecting plated layer) 9c formed in the region where the metal plate 8A is joined on the main surface (top surface) of the die pad 7D2. The plated layer 9 further has a plated layer (driver chip connecting plated layer) 9d formed in the region where the semiconductor chip 4D is mounted on the main surface (top surface) of the die pad 7D3. The plated layer 9 further has a plated layer (second plated layer) 9e1 formed in the region where a second part 8B2 of the metal plate 8B is joined on the main surface (top surface) of the lead wire 7LB and a plated layer (second plated layer) 9e2 formed in the region where a third part 8B3 of the metal plate 8B is joined on the main surface (top surface) of the lead wire 7LB. The plated layer 9 further has a plated layer 9f formed in the region where the wire WA is connected on the main surface (top surface) of the lead 7L. That is, the plated layer 9 includes the plated layers 9a, 9b, 9c, 9d, 9e1, 9e2 and 9f.

On the main surface (top surface) of the die pad 7D2, the plated layer (low-side chip connecting plated layer) 9b and the plated layer (metal plate connecting plated layer) 9c are separated from each other with a region where no plated layer 9 is formed interposed in between, as will be described in detail later. In addition, on the main surface (top surface) of the lead wire 7LB, the plated layer (first plated layer) 9e1 and the plated layer (second plated layer) 9e2 are separated from each other with a region where no plated layer 9 is formed interposed in between.

Although the die pads 7D1 to 7D3, the lead 7L, and the lead wire 7LB are formed by metal material, it is preferable for them to be formed by copper (Cu) or copper (Cu) alloy from the standpoint that processing is easy, thermal conductivity is high, and the cost is comparatively low. In addition, if the die pads 7D1 to 7D3, the lead 7L, and the lead wire 7LB are formed by the same metal material (preferably, copper or copper alloy), it is most preferable because the semiconductor device SM1 can be manufactured using the same lead frame (corresponding to a lead frame 51, to be described later). However, copper (Cu) or copper (Cu) alloy has poor solder wettability, and therefore, it is desirable to form the plated layer 9 in advance at the solder joint part before connecting it by soldering. The plated layer 9 formed on the die pads 7D1 to 7D3 and the lead wire 7LB has more excellent solder wettability than that of the region where the plated layer 9 is not formed on the die pads 7D1 to 7D3.

Here, connecting (joining) via solder is referred to as connecting by soldering. In the present embodiment, adhesion layers 11a, 11b, 11c, to be described later, are formed by solder, and therefore, the semiconductor chips 4PH, 4PL, 4D are connected by soldering to the die pads 7D1, 7D2, 7D3 (plated layers 9a, 9b, 9d), respectively. As will be described later, the metal plate 8A is connected by soldering to pads 12S1, 12S2 of the semiconductor chip 4PH and the die pad 7D2 (plated layer 9c) and the metal plate 8B is connected by soldering to pads 15S1 to 15S3 of the semiconductor chip 4PL and the lead wire 7LB (plated layers 9e1, 9e2).

As the plated layer 9, it is possible to use a silver (Ag) plated layer, nickel-palladium (Ni—Pd) plated layer, gold (Au) plated layer, or nickel (Ni) plated layer, however, from the standpoint of improvement of solder wettability, it is preferable to use a silver (Ag) plated layer or gold (Au) plated layer, and if the reduction in cost is also taken into consideration, it is most preferable to use a silver (Ag) plated layer. The thickness of the plated layer 9 is, for example, about 2 to 3 μm.

Since the plated layer 9 (9a, 9b, 9c, 9d, 9e1 and 9e2) is provided on the main surface of the die pads 7D1 to 7D3 and the lead wire 7LB, it is possible to suppress spreading due to wettability of the solder that connects the semiconductor chips 4D, 4PH, 4PL and the metal plates 8A, 8B to the die pads 7D1 to 7D3 and the lead wire 7LB for the die pads 7D1 to 7D3 and the lead wire 7LB. Due to this, it is possible to improve adhesion between the semiconductor chips 4D, 4PH, 4PL and metal plates 8A, 8B, and the die pads 7D1 to 7D3 and the lead wire 7LB.

In addition, since the plated layer 9 (9f) is provided in the region where the wire WA comes into contact on the main surface of the lead 7L, it is possible to improve the stability of adhesion under pressure between the wire WA and the lead 7L.

The total thickness of part of the back surface side of the die pads 7D1 to 7D3, the lead wire 7LB, and the lead 7L is relatively small (compared to other parts). Because of this, it is possible for the sealing material (sealing resin material) of the package PA to enter thin parts on the back surface side of the die pads 7D1 to 7D3, the lead wire 7LB, and the lead wire 7LB. Due to this, it is possible to improve adhesion between the die pads 7D1 to 7D3, the lead wire 7LB, and the lead 7L, and the sealing material (sealing resin material) of the package PA, and therefore, it is possible to reduce or prevent the peeling and defective deformation of the die pads 7D1 to 7D3, the lead wire 7LB, and the lead 7L. In particular, over the outer circumferential surface of the die pad 7D2 having the largest area, a dip and bump pattern is formed on the part in opposition to the lead wire 7LB and the part in opposition to the two die pads 7D1, 7D3. Because of this, it is possible to improve close adhesion between the die pad 7D2 and the sealing material of the package PA, and therefore, it is possible to reduce or prevent the peeling and defective deformation of the die pad 7D2 having the largest area.

Further, on the back surface (undersurface) of the package PA, the undersurface of the lead 7L and the undersurfaces of the die pads 7D1, 7D2, 7D3 are exposed, however, on the undersurface of the lead 7L exposed on the back surface of the package PA and on the undersurfaces of the die pads 7D1, 7D2, 7D3, a plated layer 10 is formed. The plated layer 10 is a plated layer formed after the package PA is formed and preferably is a solder plated layer. The plated layer 10 is provided in order to make it easy to connect by soldering the undersurface of the lead 7L and the undersurface of the die pads 7D1, 7D2, 7D3 exposed on the back surface of the package PA to wires 42a to 42d of a wiring substrate 41, to be described later, when mounting the semiconductor device SM1 onto the wiring substrate 41 etc. On the other hand, the above-mentioned plated layer 9 is a plated layer formed before the package PA is formed (before die bonding of the semiconductor chips 4D, 4PH, 4PL) and formed over the top surface of the die pads 7D1, 7D2, 7D3, the lead wire 7LB, and the lead 7L and covered with the package PA (that is, sealed in the package PA). The plated layer 9 will be described in more detail later.

The die pad (high-side chip mounting part) 7D1 is formed into the shape of a planar rectangle, in which the length in the first direction X is longer than that in the second direction Y. To the two sides intersecting each other of the die pad 7D1 (two sides along the circumference of the package PA), a plurality of leads 7L1 among the above-mentioned leads 7L is integrally connected along the two sides. That is, the die pad 7D1 and the leads 7L1 are integrally formed. To the leads 7L1, the above-mentioned terminal ET1 is electrically connected and thus the input power source VIN at the above-mentioned high potential is supplied.

On the main surface (top surface) of the die pad 7D1, the semiconductor chip 4PH for the above-mentioned power transistor is mounted with its main surface (surface, top surface) facing upward and its back surface (undersurface) facing the die pad 7D1.

The semiconductor chip 4PH is formed into the shape of a planar rectangle, more elongated than the above-mentioned semiconductor chip 4D, and arranged so that the long side of the semiconductor chip 4PH is along the longitudinal direction of the die pad 7D1. The planar area of the semiconductor chip 4PH is larger than that of the semiconductor chip 4D. In addition, the total length of the long sides and short sides of the semiconductor chip 4PH is longer than that of the long sides and short sides of the above-mentioned semiconductor chip 4D.

The electrode on the back surface of the semiconductor chip 4PH is joined and electrically connected to the die pad 7D1 via the conductive adhesion layer (solder) 11a. The electrode on the back surface of the semiconductor chip 4PH is electrically connected to the drain D of the above-mentioned high-side power MOS QH1 formed in the semiconductor chip 4PH. That is, the electrode on the back surface of the semiconductor chip 4PH corresponds to the drain electrode of the above-mentioned high-side power MOS QH1, and to which a back surface electrode BE, to be described later, corresponds. The above-mentioned adhesion layer 11a and the adhesion layers 11b, 11c, to be described later, are formed by solder, and for example, lead (Pb)-tin (Sn) based solder can be used.

On the main surface (surface, top surface) of the semiconductor chip 4PH, a gate electrode bonding pad (hereinafter, referred to simply as a pad) 12G, the source electrode pads 12S1, 12S2, 12S3 and 12S4 are arranged. Among these, the gate electrode pad 12G and the source electrode pads 12S3, 12S4 are electrodes (pad electrodes, electrode pads) for the wire WA connection and the source electrode pads 12S1, 12S2 are electrodes (pad electrodes, electrode pads) for the metal plate 8A connection.

The gate electrode pad 12G of the semiconductor chip 4PH is electrically connected to the gate electrode of the above-mentioned high-side power MOS QH1 formed in the semiconductor chip 4PH. That is, the gate electrode pad 12G of the semiconductor chip 4PH corresponds to the gate electrode pad (bonding pad) of the above-mentioned high-side power MOS QH1. This gate electrode pad 12G is arranged on one of the end sides in the longitudinal direction of the semiconductor chip 4PH (end part on the side in opposition to the semiconductor chip 4D). The semiconductor chip 4PH is arranged with the above-mentioned gate electrode pad 12G facing the above-mentioned semiconductor chip 4D side. The gate electrode pad 12G is electrically connected to a pad 13A on the main surface of the semiconductor chip 4D through the wire WA (one or more). The wire WA is formed by, for example, a thin metal wire, for example, such as gold (Au).

The source electrode pads 12S1, 12S2, 12S3 and 12S4 of the semiconductor chip 4PH are electrically connected to the source S of the above-mentioned high-side power MOS QH1 formed in the semiconductor chip 4PH. That is, the source electrode pads 12S1, 12S2, 12S3 and 12S4 of the semiconductor chip 4PH correspond to the source electrode pad (bonding pad) of the above-mentioned high-side power MOS QH1. The source electrode pads 12S1, 12S2 are larger than the above-mentioned gate electrode pad 12G and the source electrode pads 12S3, 12S4 and formed into the shape of a rectangle extending along the longitudinal direction (first direction X) of the semiconductor chip 4PH. On the other hand, the source electrode pads 12S3, 12S4 are arranged on one of the end sides in the longitudinal direction of the semiconductor chip 4PH in which the above-mentioned gate electrode pad 12G is arranged (end part on the side in opposition to the semiconductor chip 4D). The source electrode pads 12S1, 12S2, 12S3 and 12S4 are separated from one another by a protective film (insulating film, corresponding to a protective film 32, to be described later) in the uppermost layer of the semiconductor chip 4PH, however, in the lower layer of the protective film (protective film in the uppermost layer of the semiconductor chip 4PH), they are integrally formed and electrically connected to one another, as will be described later.

The source electrode pads 12S1, 12S2 of the semiconductor chip 4PH (that is, the source S of the above-mentioned high-side power MOS QH1) are electrically connected to the die pad 7D2 through the metal plate (high-side metal plate) 8A. Due to this, it is possible to reduce the ON resistance of the high-side power MOS QH1 compared to the case where the source electrode pads 12S1, 12S2 of the semiconductor chip 4PH and the die pad 7D2 are connected by a wire, and therefore, the package resistance can be reduced and the conduction loss can be reduced.

The metal plate 8A is joined to the pads 12S1, 12S2 among the source electrode pads 12S1, 12S2, 12S3 and 12S4 of the semiconductor chip 4PH via the conductive adhesion layer (solder) 11b but not joined (via adhesion layer 11b) to the pads 12S3, 12S4. However, as described above, the pads 12S1, 12S2, 12S3 and 12S4 are integrally formed and electrically connected to one another in the lower layer of the protective film (protective film in the uppermost layer of the semiconductor chip 4PH), and therefore, the pads 12S3, 12S4 are also in a state where they are electrically connected to the metal plate 8A via the pads 12S1, 12S2 and further electrically connected to the die pad 7D2 through the metal plate 8A.

The metal plate 8A is formed by metal (metal material) having high conductivity and thermal conductivity, such as, for example, copper (Cu), copper (Cu) alloy, aluminum (Al), and aluminum (Al) alloy. Most preferably, the metal plate 8A is formed by copper (Cu) or copper (Cu) alloy from the standpoint that processing is easy, thermal conductivity is high, and the cost is comparatively low. As described above, by using the metal plate 8A formed by a metal material less expensive than gold, instead of the wire formed by gold (Au), it is possible to reduce the cost of the semiconductor device SM1. The dimensions (widths) of the metal plate 8A in the first direction X and the second direction Y are larger than the diameter of the wire WA, respectively. The metal plate 8A has a first part 8A1, a second part 8A2, and a third part 8A3, as described below, in an integral manner.

The first part (chip contact portion, high-side chip contact portion) 8A1 is a part joined and electrically connected to the source electrode pads 12S1, 12S2 via the conductive adhesion layer 11b and has, for example, the shape of a rectangle. The first part 8A1 is formed into a flat shape so as to be along the main surface of the semiconductor chip 4PH in a section view as shown in FIG. 7 and FIG. 9.

The second part (mounting part contact portion, chip mounting part contact portion) 8A2 is a part joined and electrically connected to the die pad 7D2 (more specifically, the plated layer 9 provided on the top surface of the die pad 7D2) via the conductive adhesion layer (solder) 11c. The second part 8A2 overlaps in a planar manner part of the die pad 7D2 (region where the plated layer 9 is formed). As shown in FIG. 7, the second part 8A2 is formed into a flat shape so as to be along the main surface of the die pad 7D2 in a section view.

The third part (intermediate portion) 8A3 is a part that connects (couples) the first part 8A1 and the second part 8A2. The third part 8A3 extends from the long side of the first part 8A1 along the second direction Y intersecting the long side, crossing the long side of the semiconductor chip 4PH, and extending as far as the second part 8A2 on the die pad 7D2. That is, the third part 8A3 and the second part 8A2 are provided so as to extend from the long side of the first part 8A1 along the second direction Y, thereby, the first part 8A1 is connected to the die pad 7D2 (plated layer 9).

As shown in FIG. 7, the third part 8A3 becomes more distant from the main surface of the semiconductor chip 4PH between the semiconductor chip 4PH and the die pad 7D2 and, as a result of which, the third part 8A3 is higher than the first part 8A1 and the second part 8A2 in a section view. Due to this, it is possible to make the material of the adhesion layer 11b more unlikely to leak to the side of the side surface of the semiconductor chip 4PH, and therefore, it is possible to suppress the conduction failure between the main surface (source S) and the back surface (drain D) of the semiconductor chip 4PH caused by the material of the adhesion layer 11b.

The height referred to here is a distance between the back surface of the die pads 7D1 to 7D3, as a reference, and a position distant in the thickness direction of the package PA (direction intersecting perpendicularly to the main surface of the semiconductor chip 4PH). The above-mentioned adhesion layers 11b, 11c are formed by the same material (that is, solder) as that by which the above-mentioned adhesion layer 11a is formed.

The semiconductor chip 4PH and the semiconductor chip 4PL have the shape of a planar rectangle, and each has a pair of long sides and a pair of short sides intersecting the long sides, however, the long sides of the semiconductor chip 4PH are in opposition to the long sides of the semiconductor chip 4PL, and the metal plate 8A is arranged so as to intersect the long side of the semiconductor chip 4PH in opposition to the semiconductor chip 4PL.

The metal plate 8A is arranged so as to cover part of the main surface of the semiconductor chip 4PH, which will serve as a heat producing source. Due to this, the semiconductor chip 4PH is sandwiched by the metal plate 8A and the die pad 7D1. That is, heat produced in the semiconductor chip 4PH is dissipated from the back surface of the semiconductor chip 4PH through the die pad 7D1 and, at the same time, it is dissipated from the main surface of the semiconductor chip 4PH through the metal plate 8A. As a result, it is possible to improve the performance to dissipate heat produced in the semiconductor chip 4PH.

However, the area of the first part 8A1 of the metal plate 8A is smaller than that of the main surface of the semiconductor chip 4PH or the total area of the region in which the source electrode pads 12S1, 12S2 are arranged. Then, the metal plate 8A is arranged so that the first part 8A1 is housed in the main surface of the semiconductor chip 4PH, not protruding to the outside of the semiconductor chip 4PH. By reducing the area of the above-mentioned first part 8A1 of the metal plate 8A smaller than that of the main surface of the semiconductor chip 4PH or that of the region where the source electrode pads 12S1, 12S2 are arranged, the material of the adhesion layer 11b can be prevented from leaking to the side of the side surface of the semiconductor chip 4PH, and therefore, it is possible to suppress the conduction failure between the main surface (source S) and the back surface (drain D) of the semiconductor chip 4PH caused by the material of the adhesion layer 11b.

The four corners of the semiconductor chip 4PH are designed so as not to be covered with the metal plate 8A. That is, the metal plate 8A is not arranged immediately above the four corners of the semiconductor chip 4PH and the four corners of the semiconductor chip 4PH are exposed from the metal plate 8A. Due to this, it is possible to observe the state of the adhesion layer 11b that connects the metal plate 8A and the semiconductor chip 4PH at the four corners of the semiconductor chip 4PH in an external appearance inspection after the metal plate 8A is joined. As a result, it is possible to improve the reliability and yield of the semiconductor device SM1.

The source electrode pad 12S3 of the semiconductor chip 4PH (that is, the source S of the above-mentioned high-side power MOS QH1) is electrically connected to a pad 13B on the main surface of the semiconductor chip 4D through the wire WA (one or more). That is, one end of the wire WA is joined to the source electrode pad 12S3 of the semiconductor chip 4PH and the other end of the wire WA is joined to the pad 13B of the semiconductor chip 4D. The source electrode pad 12S4 of the semiconductor chip 4PH is electrically connected to one of leads 7L5 not linked to the die pads 7D1, 7D2, 7D3 among the leads 7L through the wire WA (one or more).

To the source electrode pads 12S1, 12S2 of the semiconductor chip 4PH, the metal plate 8A is joined but the wire WA is not connected. However, as described above, the source electrode pads 12S1, 12S2, 12S3 and 12S4 are integrally formed and electrically connected to one another in the lower layer of the protective film (protective film in the uppermost layer of the semiconductor chip 4PH), and therefore, the pads 12S1, 12S2 are also in a state where they are electrically connected to the wire WA connected to the pad 12S3 via the pad 12S3 and further electrically connected to the pad 13B of the semiconductor chip 4D through the wire WA.

The die pad (low-side chip mounting part) 7D2 is formed into the shape of a planar rectangle, in which the length in the first direction X is longer than that in the second direction Y. To the die pad 7D2, a plurality of leads 7L2 among the above-mentioned leads 7L is integrally connected. That is, the die pad 7D2 and the leads 7L2 are integrally formed. To the leads 7L2, the above-mentioned output node N is electrically connected.

On the main surface (top surface) of the die pad 7D2, the semiconductor chip 4PL for the above-mentioned power transistor is mounted with its main surface (surface, top surface) facing upward and its back surface (undersurface) facing the die pad 7D2.

The semiconductor chip 4PL is formed into the shape of a planar rectangle and arranged so that the long sides of the semiconductor chip 4PL be along the longitudinal direction of the die pad 7D2. The planar area of the semiconductor chip 4PL is larger than that of each of the above-mentioned semiconductor chip 4PH and the semiconductor chip 4D. In addition, each of the long sides and short sides of the semiconductor chip 4PL is longer than each of the long sides and short sides of the above-mentioned semiconductor chip 4PH.

The electrode on the back surface of the semiconductor chip 4PL is joined and electrically connected to the die pad 7D2 via the conductive adhesion layer 11a. The electrode on the back surface of the semiconductor chip 4PL is electrically connected to the drain D of the above-mentioned low-side power MOS QL1 formed in the semiconductor chip 4PL. That is, the electrode on the back surface of the semiconductor chip 4PL corresponds to the drain electrode of the above-mentioned low-side power MOS QL1, and to which the back surface electrode BE, to be described later, corresponds.

On the main surface (surface, top surface) of the semiconductor chip 4PL, a gate electrode bonding pad (hereinafter, referred to simply as a pad) 15G, and the source electrode pads 15S1, 15S2, 15S3 and 15S4 are arranged. Among these, the gate electrode pad 15G and the source electrode pad 15S4 are electrodes (pad electrodes, electrode pads) for the wire WA connection and the source electrode pads 15S1, 15S2, 15S3 are electrodes (pad electrodes, electrode pads) for the metal plate 8B connection.

The gate electrode pad 15G of the semiconductor chip 4PL is electrically connected to the gate electrode of the above-mentioned low-side power MOS QL1 formed in the semiconductor chip 4PL. That is, the gate electrode pad 15G of the semiconductor chip 4PL corresponds to the gate electrode pad (bonding pad) of the above-mentioned low-side power MOS QL1. This gate electrode pad 15G is arranged in the vicinity of the corner portion on one of the end sides in the longitudinal direction of the semiconductor chip 4PL. The semiconductor chip 4PL is arranged with the above-mentioned gate electrode pad 15G facing the above-mentioned semiconductor chip 4D side. The gate electrode pad 15G is electrically connected to a pad 13C on the main surface of the above-mentioned semiconductor chip 4D through the wire WA (one or more).

The source electrode pads 15S1, 15S2, 15S3 and 15S4 of the semiconductor chip 4PL are electrically connected to the source S of the above-mentioned low-side power MOS QL1 formed in the semiconductor chip 4PL. That is, the source electrode pads 15S1, 15S2, 15S3 and 15S4 correspond to the source electrode pad (bonding pad) of the above-mentioned low-side power MOS QL1. The source electrode pads 15S1, 15S2, 15S3 are larger than the above-mentioned gate electrode pad 15G and the source electrode pad 15S4 and formed into the shape of a rectangle extending along the longitudinal direction (first direction X) of the semiconductor chip 4PL. On the other hand, the source electrode pad 15S4 is arranged in the vicinity of the corner portion on one of the end sides in the longitudinal direction of the semiconductor chip 4PL in which the above-mentioned gate electrode pad 15G is arranged. The source electrode pads 15S1, 15S2, 15S and 15S4 are separated from one another by a protective film (insulating film, corresponding to the protective film 32, to be described later) in the uppermost layer of the semiconductor chip 4PL, however, in the lower layer of the protective film (protective film in the uppermost layer of the semiconductor chip 4PL), they are integrally formed and electrically connected, as will be described later.

The source electrode pads 15S1, 15S2, 15S3 (that is, the source S of the above-mentioned low-side power MOS QL1) are electrically connected to the lead wire 7LB through the metal plate (low-side metal plate) 8B. Due to this, it is possible to reduce the ON resistance of the low-side power MOS QL1 compared to the case where the source electrode pads 15S1, 15S2, 15S3 and the lead wire 7LB are connected by a wire, and therefore, the package resistance can be reduced and the conduction loss can be reduced.

The metal plate 8B is joined to the pads 15S1, 15S2, 15S3 among the source electrode pads 15S1, 15S2, 15S3 and 15S4 of the semiconductor chip 4PL via the conductive adhesion layer 11b but not joined (via adhesion layer 11b) to the pad 15S4. However, as described above, the pads 15S1, 15S2, 15S3 and 15S4 are integrally formed and electrically connected to one another in the lower layer of the protective film (protective film in the uppermost layer of the semiconductor chip 4PL), and therefore, the pad 15S4 is also in a state where it is electrically connected to the metal plate 8B via the pads 15S1, 15S2, 15S3 and further electrically connected to the lead wire 7LB through the metal plate 8B.

Preferably, the metal plate 8B is formed by the same material (metal material) as that by which the above-mentioned metal plate 8A is formed, for example, by metal having high conductivity and thermal conductivity, such as copper (Cu), copper (Cu) alloy, aluminum (Al), and aluminum (Al) alloy. Most preferably, like the above-mentioned metal plate 8A, the metal plate 8B is also formed by copper (Cu) or copper (Cu) alloy from the standpoint that processing is easy, thermal conductivity is high, and the cost is comparatively low. As described above, by using the metal plate 8B formed by a metal material less expensive than gold, instead of the wire formed by gold (Au), it is possible to reduce the cost of the semiconductor device SM1. The dimensions (widths) of the metal plate 8B in the first direction X and the second direction Y are larger than the diameter of the wire WA, respectively. Further, the planar area of the metal plate 8B is larger than that of the metal plate 8A. The metal plate 8B has a first part 8B1, the second part 8B2, the third part 8B3, a fourth part 8B4, and a fifth part 8B5, as described below, in an integral manner.

The first part (chip contact portion, low-side chip contact portion) 8B1 is a part joined and electrically connected to the source electrode pads 15S1, 15S2, 15S3 via the conductive adhesion layer 11b and has, for example, a rectangular shape. The first part 8B1 is formed into a flat shape so as to be along the main surface of the semiconductor chip 4PL in a section view as shown in FIG. 7 and FIG. 8.

The second part (first contact portion) 8B2 and the third part (second contact portion) 8B3 are a part joined and electrically connected to the lead wire 7LB (more specifically, the plated layers 9e1, 9e2 provided on the top surface of the die pad 7D2) via the conductive adhesion layer 11c. The second part 8B2 and the third part 8B3 overlap in a planar manner part of the lead wire 7LB (region where the plated layers 9e1, 9e2 are formed), respectively. As shown in FIG. 7 and FIG. 8, the second part 8B2 and the third part 8B3 are formed into a flat shape so as to be along the main surface of the lead wire 7LB in a section view.

The fourth part (first intermediate portion) 8B4 is a part that connects (couples) the first part (low-side chip contact portion) 8B1 and the second part (first contact portion) 8B2 and the fifth part (second intermediate portion) 8B5 is a part that connects (couples) the first part (low-side chip contact portion) 8B1 and the third part (second contact portion) 8B3. The fourth part 8B4 extends from the short side of the first part 8B1 along the first direction X intersecting the short side, crossing the short side of the semiconductor chip 4PL, and extending as far as the second part 8B2 on the lead wire 7LB. The fifth part 8B5 extends from the long side of the first part 8B1 along the second direction Y intersecting the long side, crossing the long side of the semiconductor chip 4PL, and extending as far as the third part 8B3 on the lead wire 7LB.

That is, the fourth part 8B4 and the second part 8B2 are provided so as to extend from the short side of the first part 8B1 along the first direction X, and thereby the first part 8B1 and the lead wire 7LB (plated layer 9e1) are connected. The fifth part 8B5 and the third part 8B3 are provided so as to extend from the long side of the first part 8B1 along the second direction Y, and thereby the first part 8B1 and the lead wire 7LB (plated layer 9e2) are connected.

As shown in FIG. 7 and FIG. 8, the fourth part 8B4 and the fifth part 8B5 become more distant from the main surface of the semiconductor chip 4PL between the semiconductor chip 4PL and the lead wire 7LB and, as a result of which, the fourth part 8B4 and the fifth part 8B5 are higher than the first part 8B1 in a section view. Due to this, it is possible to make the material of the adhesion layer 11b more unlikely to leak to the side of the side surface of the semiconductor chip 4PL, and therefore, it is possible to suppress the conduction failure between the main surface (source S) and the back surface (drain D) of the semiconductor chip 4PL caused by the material of the adhesion layer 11b.

The metal plate 8B is arranged so as to cover part of the main surface of the semiconductor chip 4PL, which will serve as a heat producing source. Due to this, the semiconductor chip 4PL is sandwiched by the metal plate 8B and the die pad 7D2. That is, heat produced in the semiconductor chip 4PL is dissipated from the back surface of the semiconductor chip 4PL through the die pad 7D2 and, at the same time, it is dissipated from the main surface of the semiconductor chip 4PL through the metal plate 8B. As a result, it is possible to improve the performance to dissipate heat produced in the semiconductor chip 4PL.

However, the area of the first part 8B1 of the metal plate 8B is smaller than that of the main surface of the semiconductor chip 4PL or the total area of the region in which the source electrode pads 15S1, 15S2, 15S3 are arranged. Then, the metal plate 8B is arranged so that the first part 8B1 is housed in the main surface of the semiconductor chip 4PL, not protruding to the outside of the semiconductor chip 4PL. Due to this, the material of the adhesion layer 11b can be prevented from leaking to the side of the side surface of the semiconductor chip 4PL, and therefore, it is possible to suppress the conduction failure between the main surface (source S) and the back surface (drain D) of the semiconductor chip 4PL caused by the material of the adhesion layer 11b.

The four corners of the semiconductor chip 4PL are designed so as not be covered with the metal plate 8B. That is, the metal plate 8B is not arranged immediately above the four corners of the semiconductor chip 4PL and the four corners of the semiconductor chip 4PL are exposed from the metal plate 8B. Due to this, it is possible to observe the state of the adhesion layer 11b that connects the metal plate 8B and the semiconductor chip 4PL at the four corners of the semiconductor chip 4PL in an external appearance inspection after the metal plate 8B is joined. As a result, it is possible to improve the reliability and yield of the semiconductor device SM1.

The source electrode pad 15S4 of the semiconductor chip 4PL (that is, the source S of the above-mentioned low-side power MOS QL1) is electrically connected to a pad 13D on the main surface of the semiconductor chip 4D through the wire WA (one or more). That is, one end of the wire WA is joined to the source electrode pad 15S4 of the semiconductor chip 4PL and the other end of the wire WA is joined to the pad 13D of the semiconductor chip 4D.

To the pad 15S4 among the source electrode pads 15S1, 15S2, 15S3 and 15S4 of the semiconductor chip 4PL, the wire WA is connected and to the pads 15S1, 15S2, 15S3, the metal plate 8B is connected but the wire WA is not connected. However, as described above, the source electrode pads 15S1, 15S2, 15S3 and 15S4 are integrally formed and electrically connected to one another in the lower layer of the protective film (protective film in the uppermost layer of the semiconductor chip 4PL), and therefore, the pads 15S1, 15S2, 15S3 are also in a state where they are electrically connected to the wire WA connected to the pad 15S4 via the pad 15S4 and further electrically connected to the pad 13D of the semiconductor chip 4D through the wire WA.

The above-mentioned lead wire 7LB is arranged in the vicinity of one corner portion of the die pad 7D2 in a state where it is distant from the die pad 7D2 but adjacent thereto. The planar shape of the lead wire 7LB is made into a planar L-shaped pattern that extends along the short side and long side intersecting each other with one corner portion of the die pad 7D2 being sandwiched in between. Due to this, the current path of the main circuit can be reduced, and therefore, it is possible to reduce inductance. Because of this, it is possible to improve the electrical characteristics of the semiconductor device SM1.

To the lead wire 7LB, a plurality of leads 7L3 among the above-mentioned leads 7L is integrally connected. That is, the lead wire 7LB and the leads 7L3 are formed integrally. To the leads 7L3, the above-mentioned terminal ET2 is electrically connected and the above-mentioned reference potential GND is supplied. Consequently, the lead wire 7LB and the leads 7L3 integrally connected thereto can be regarded as the ground terminal part for supplying ground potential.

Since the leads 7L3 are integrally connected to the lead wire 7LB as described above, the volume can be increased more than when the leads 7L3 are divided, and therefore, it is possible to reduce the wiring resistance and reinforce the reference potential GND. Such a configuration is one that has taken into consideration the fact that the increase in the ON resistance on the source side of the low-side power MOS QL1 considerably affects the increase in the switching loss. That is, with the above-mentioned configuration, the ON resistance on the source side of the power MOS QL1 can be reduced, and therefore, it is possible to reduce the conduction loss of the power MOS QL1. Because of this, it is possible to improve the voltage conversion efficiency of the non-insulating DC-DC converter 1. In addition, since the reference potential GND can be reinforced, it is possible to improve the stability of operation of the non-insulating DC-DC converter.

Further, the above-mentioned die pad (driver chip mounting part) 7D3 is formed into substantially the shape of a planar rectangle. To the die pad 7D3, a plurality of leads 7L4 among the above-mentioned leads 7L is integrally connected. That is, the die pad 7D3 and the leads 7L4 are integrally formed. On the main surface (top surface) of the die pad 7D3, the semiconductor chip 4D in which the above-mentioned driver circuits DR1, DR2 are formed is mounted with its main surface (surface, top surface) facing upward and its back surface (undersurface) facing the die pad 7D3.

This semiconductor chip 4D is also formed into substantially the shape of a planar rectangle. Each center of the three semiconductor chips 4PH, 4PL, 4D is arranged shifted from the center of the package PA. Among the pads formed on the main surface of the semiconductor chip 4D, the pads 13A, 13B connected to the semiconductor chip 4PH (power MOS QH1) with the wire WA are arranged along the side on the side neighboring the semiconductor chip 4PH in the main surface of the semiconductor chip 4D and the pads 13C, 13D connected to the semiconductor chip 4PL (power MOS QL1) with the wire WA are arranged along the side on the side neighboring the semiconductor chip 4PL in the main surface of the semiconductor chip 4D. Because of this, the length of the wire WA can be further reduced, and therefore, it is possible to further reduce the parasitic inductance produced in the wiring path.

In addition, the semiconductor chip 4D is arranged so that the distance between the semiconductor chip 4D and the semiconductor chip 4PH is shorter than that between the semiconductor chip 4D and the semiconductor chip 4PL. Then, the length of the wire WA that electrically connects the semiconductor chip 4D and the semiconductor chip 4PH (source, gate of power MOS QH1) is formed so as to be shorter than that of the wire WA that electrically connects the semiconductor chip 4D and the semiconductor chip 4PL (source, gate of power MOS QL1). Because of this, it is possible to reduce the switching loss of the semiconductor chip 4PH.

In addition, on the main surface of the semiconductor chip 4D, an electrode pad 13E for inputting or outputting each signal of the driver circuits DR1, DR2 and an electrode pad 13F for the reference potential GND are arranged besides the above-mentioned pads 13A to 13D. The pad 13E is electrically connected to the lead 7L5 that is not connected to the die pads 7D1, 7D2, 7D3 among the leads 7L through the wires WA. The pad 13F is electrically connected to the above-mentioned lead 7L4 (7L) through the wires WA.

The reason for the difference in the planar area among the semiconductor chips 4D, 4PH, 4PL described above is as follows. That is, the semiconductor chip 4D having the driver circuits DR1, DR2 is a control circuit that controls the gates of the power MOS's QH1, QL1, and therefore, it is desirable to make the external size as small as possible taking into consideration the total size of the package. In contrast to this, it is desirable to reduce the ON resistance produced in the transistor as much as possible for the power MOS's QH1, QL1. The reduction in the ON resistance can be realized by increasing the channel width per unit transistor cell area. Because of this, the external size of the semiconductor chips 4PH, 4PL is formed so as to be larger than that of the semiconductor chip 4D. Further, as shown in FIG. 2, the ON time of the low-side power MOS QL1 is longer than that of the high-side power MOS QH1, and therefore, it is necessary to further reduce the ON resistance of the power MOS QL1 than that of the power MOS QH1. Because of this, the external size of the semiconductor chip 4PL is formed so as to be larger than that of the semiconductor chip 4PH.

Next, the configuration of the semiconductor chip 4PH in which the above-mentioned power MOS QH1 is formed and the semiconductor chip 4PL in which the above-mentioned power MOS QL1 is formed will be described.

Figure 16:
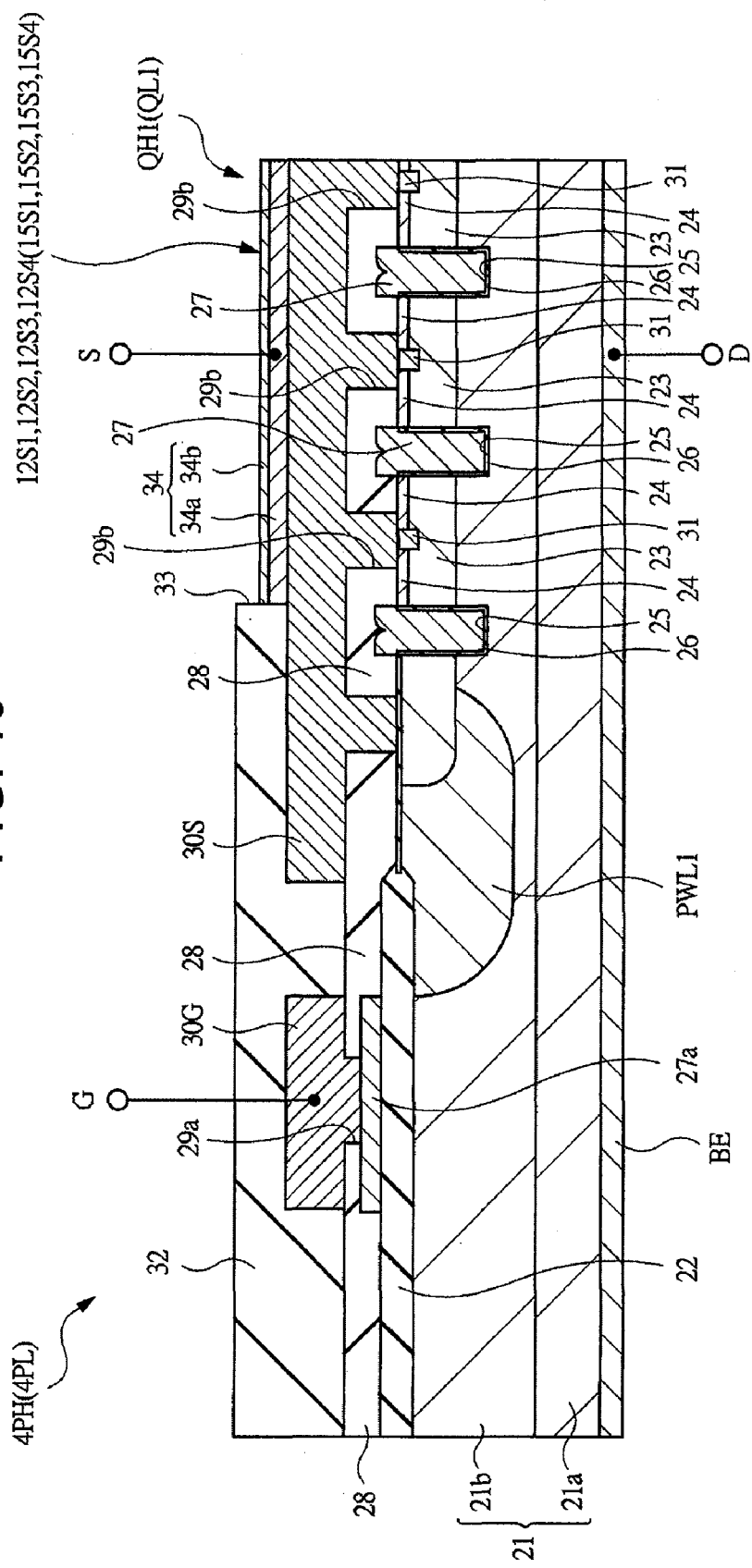
FIG. 16 is a section view of essential parts of a semiconductor chip used in a semiconductor device according to an embodiment of the present invention.
Figure 17:
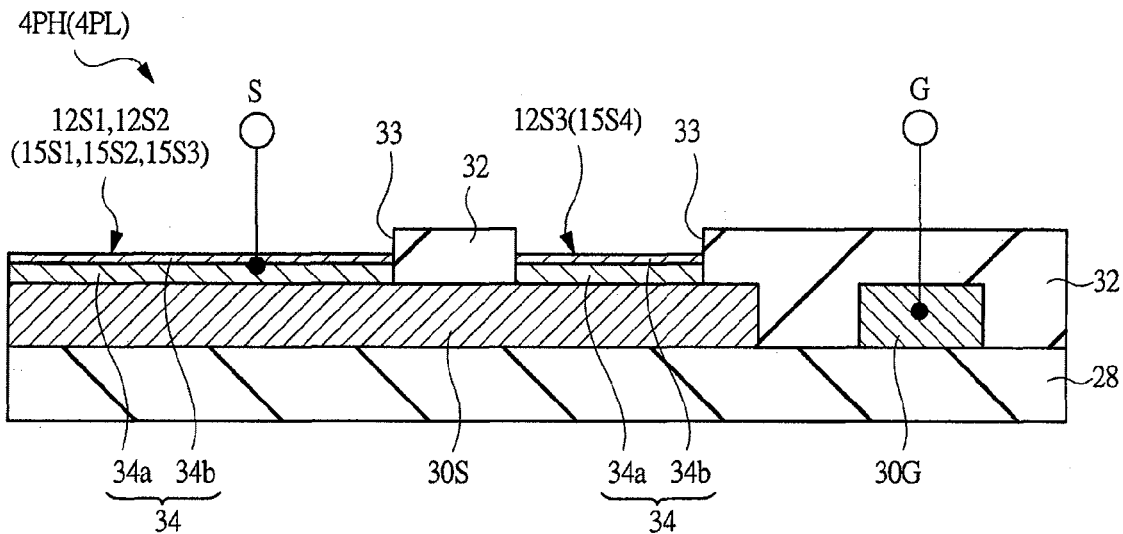
FIG. 17 is a section view of essential parts of a semiconductor chip used in a semiconductor device according to an embodiment of the present invention.
Figure 18:
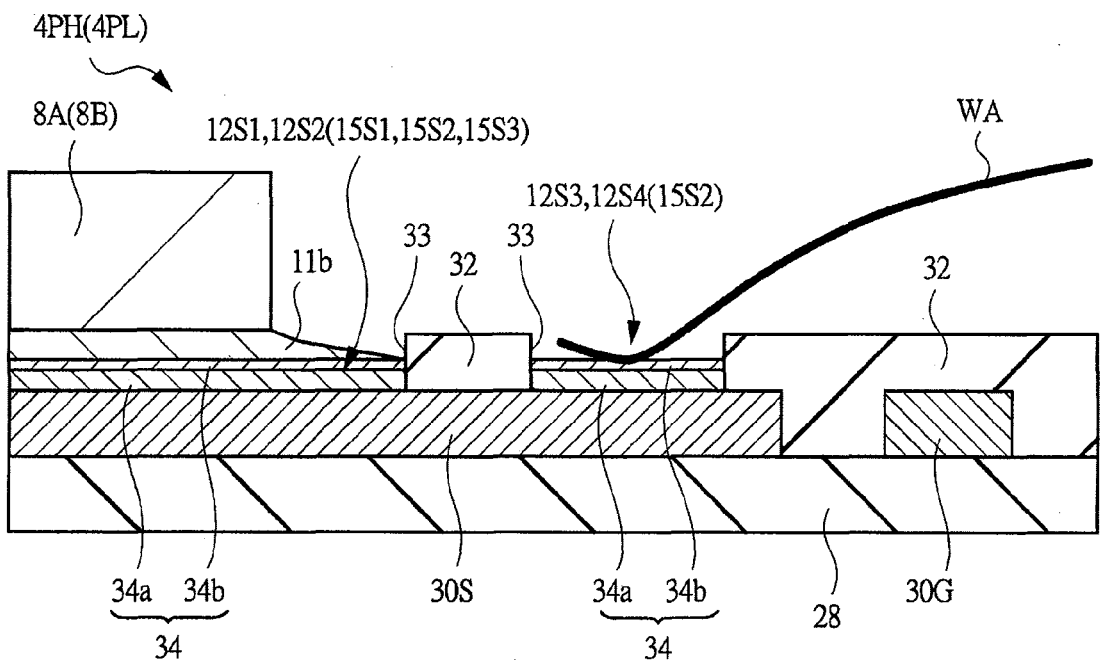
FIG. 18 is a section view of essential parts of a semiconductor chip used in a semiconductor device according to an embodiment of the present invention.

FIG. 16 is a section view of essential parts of the semiconductor chip 4PH or the semiconductor chip 4PL. FIG. 17 is another section view of essential parts of the semiconductor chip 4PH or the semiconductor chip 4PL, showing a structure of layers upper than an insulating film 28. FIG. 18 is a section view, in which the metal plate 8A (metal plate 8B in the case of the semiconductor chip 4PL) and the wire WA are attached in FIG. 17. In the following description, the configuration of the semiconductor chip 4PH will be described with reference to FIG. 16 to FIG. 18, however, the same description can be basically applied to the configuration of the semiconductor chip 4PL, and in such a case, it is only required to replace the semiconductor chip 4PH, the power MOS QH1, the pad 12G, and the pads 12S1 to 12S4 with the semiconductor chip 4PL, the power MOS QL1, the pad 15G, and the pads 15S1 to 15S4, respectively when reading.

The above-mentioned power MOS QH1 is formed on the main surface of a semiconductor substrate (hereinafter, referred to simply as a substrate) 21. As shown in FIG. 16, the substrate 21 has a substrate main body (semiconductor substrate, semiconductor wafer) 21a including $n^+$-type single crystal silicon into which, for example, arsenic (As) has been introduced, and an epitaxial layer (semiconductor layer) 21b including, for example, $n^-$-type silicon single crystal formed on the main surface of the substrate main body 21a. Because of this, the substrate 21 is a so-called epitaxial wafer. On the main surface of the epitaxial layer 21b, for example, a field insulating film (element isolation region) 22 including, for example, silicon oxide is formed. In an active region surrounded by the field insulating film 22 and a p-type well PWL1 in its lower layer, a plurality of unit transistor cells constituting the power MOS QH1 is formed and the power MOS QH1 is formed by connecting in parallel the unit transistor cells. Each unit transistor cell is formed by, for example, an n-channel type power MOS with a trench gate structure.

The above-mentioned substrate main body 21a and the epitaxial layer 21b have a function as the drain region of the above-mentioned unit transistor cell. On the back surface of the substrate 21 (semiconductor chip 4PH), the back surface electrode for drain electrode (back surface drain electrode, drain electrode) BE is formed. The back surface electrode BE is formed by laminating, for example, a titanium (Ti) layer, a nickel (Ni) layer, and a gold (Au) layer in order from the back surface of the substrate 21. In the above-mentioned semiconductor device SM1, the back surface electrode BE of the semiconductor chip 4PH is joined and electrically connected to the above-mentioned die pad 7D1 (plated layer 9a) via the above-mentioned adhesion layer 11a. On the other hand, in the case of the semiconductor chip 4PL, the back surface electrode BE of the semiconductor chip 4PL is joined and electrically connected to the above-mentioned die pad 7D2 (plated layer 9b) via the above-mentioned adhesion layer 11a.

A p-type semiconductor region 23 formed in the epitaxial layer 21b has a function as a channel formation region of the above-mentioned unit transistor cell. Further, an $n^+$-type semiconductor region 24 formed at the upper part of the p-type semiconductor region 23 has a function as a source region of the above-mentioned unit transistor cell. Consequently, the semiconductor region 24 is a semiconductor region for a source.

On the substrate 21, a groove 25 extending from its main surface in the thickness direction of the substrate 21 is formed. The groove 25 is formed so as to penetrate through the $n^+$-type semiconductor region 24 and the p-type semiconductor region 23 from the top surface of the $n^+$-type semiconductor region 24 and terminate in the epitaxial layer 21b in its lower layer. On the bottom surface and side surface of the groove 25, a gate insulating film 26 including, for example, silicon oxide is formed. In the groove 25, a gate electrode 27 is embedded via the above-mentioned gate insulating film 26. The gate electrode 27 includes, for example, a polycrystal silicon film to which n-type impurities (for example, phosphorus) have been added. The gate electrode 27 has a function as a gate electrode of the above-mentioned unit transistor cell. Over part of the field insulating film 22, a gate drawing wire part 27a including a conductive film in the same layer of the gate electrode 27 is formed and the gate electrode 27 and the gate drawing wire part 27a are integrally formed and connected with each other. Note that, the gate electrode 27 and the gate drawing wire part 27a are integrally connected in a region not shown in the section view in FIG. 16. The gate drawing wire part 27a is electrically connected to a gate wire 30G through a contact hole 29a formed in the insulating film 28 covering the gate drawing wire part 27a.

On the other hand, a source wire 30S is electrically connected to the $n^+$-type semiconductor region 24 for a source through a contact hole 29b formed in the insulating film 28. The above-mentioned source wire 30S is electrically connected to a $p^+$-type semiconductor region 31 formed on the upper part of the p-type semiconductor region 23 and between the adjacent $n^+$-type semiconductor regions 24, and is electrically connected to the p-type semiconductor region 23 for channel formation therethrough. It is possible to form the gate wire 30G and the source wire 30S by forming a metal film, for example, an aluminum film (or aluminum alloy film), on the insulating film 28 in which the contact holes 29a, 29b are formed so as to be embedded in the contact holes 29a, 29b, and by patterning the metal film (aluminum film or aluminum alloy film). Because of this, the gate wire 30G and the source wire 30S include an aluminum film or aluminum alloy film.

The gate wire 30G and the source wire 30S are covered with the protective film (insulating film) 32 including a polyimide resin etc. The protective film 32 is a film (insulating film) in the uppermost layer of the semiconductor chip 4PH.

In part of the protective film 32, an opening 33 is formed, through which part of the gate wire 30G or the source wire 30S in its lower layer is exposed, and the part of the gate wire 30G exposed through the opening 33 is the above-mentioned gate electrode pad 12G and the part of the source wire 30S exposed through the opening 33 is the above-mentioned source electrode pads 12S1, 12S2, 12S3 and 12S4. As described above, the source electrode pads 12S1, 12S2, 12S3 and 12S4 are separated by the protective film 32 in the uppermost layer, however, electrically connected to one another through the source wire 30S.

Over the surfaces of the pads 12G, 12S1, 12S2, 12S3 and 12S4 (that is, on the part of the gate wire 30G and the part of the source wire 30S exposed at the bottom of the opening 33), a metal layer 34 is formed by a plating method etc. The metal layer 34 is formed by a laminated film of a metal layer 34a formed over the gate wire 30G and the source wire 30S and a metal layer 34b formed thereover. The metal layer 34a in the lower layer includes, for example, nickel (Ni) and has a function to mainly suppress or prevent oxidation of aluminum of the gate wire 30G and the source wire 30S in the backing. The metal layer 34b in its upper layer includes, for example, gold (Au) and has a function to mainly suppress or prevent oxidation of nickel in the metal layer 34a in the backing.

In the semiconductor device SM1, as shown in FIG. 18, the metal plate 8A is joined to the pads 12S1, 12S2 of the semiconductor chip 4PH via the adhesion layer 11b and the wire WA is connected to the pads 12G, 12S4 of the semiconductor chip 4PH. On the other hand, in the case of the semiconductor chip 4PL, the metal plate 8B is joined to the pads 15S1, 15S2, 15S3 of the semiconductor chip 4PL via the adhesion layer 11b and the wire WA is connected to the pad 15G of the semiconductor chip 4PL.

Since the metal layer 34 is formed over the surfaces of the pads 12G, 12S1, 12S2, 12S3 and 12S4, it is possible to suppress or prevent oxidation of the surface of aluminum of the gate wire 30G and the source wire 30S. Because of this, the adhesion of the adhesion layer 11b for the pads 12S1, 12S2 can be improved, and therefore, it is possible to improve the adhesion force between the metal plate 8A and the pads 12S1, 12S2. It is also possible to avoid the increase in the resistance value at the connection part between the metal plate 8A and the pads 12S1, 12S2.

The operation current of the unit transistor of such a high-side power MOS QH1 is designed so as to flow between the drain epitaxial layer 21b and the source n$^+$-type semiconductor region 24 in the thickness direction of the substrate 21 along the side surface of the gate electrode 27 (that is, side surface of the groove 25). That is, a channel is formed along the thickness direction of the semiconductor chip 4PH.

As described above, the semiconductor chips 4PH, 4PL are a semiconductor chip in which a vertical MOSFET (power MOSFET) having a trench-type gate structure. Here, the vertical MOSFET corresponds to a MOSFET in which a current between source and drain flows in the thickness direction (direction substantially perpendicular to the main surface of the semiconductor substrate) of a semiconductor substrate (substrate 21).

Figure 19:
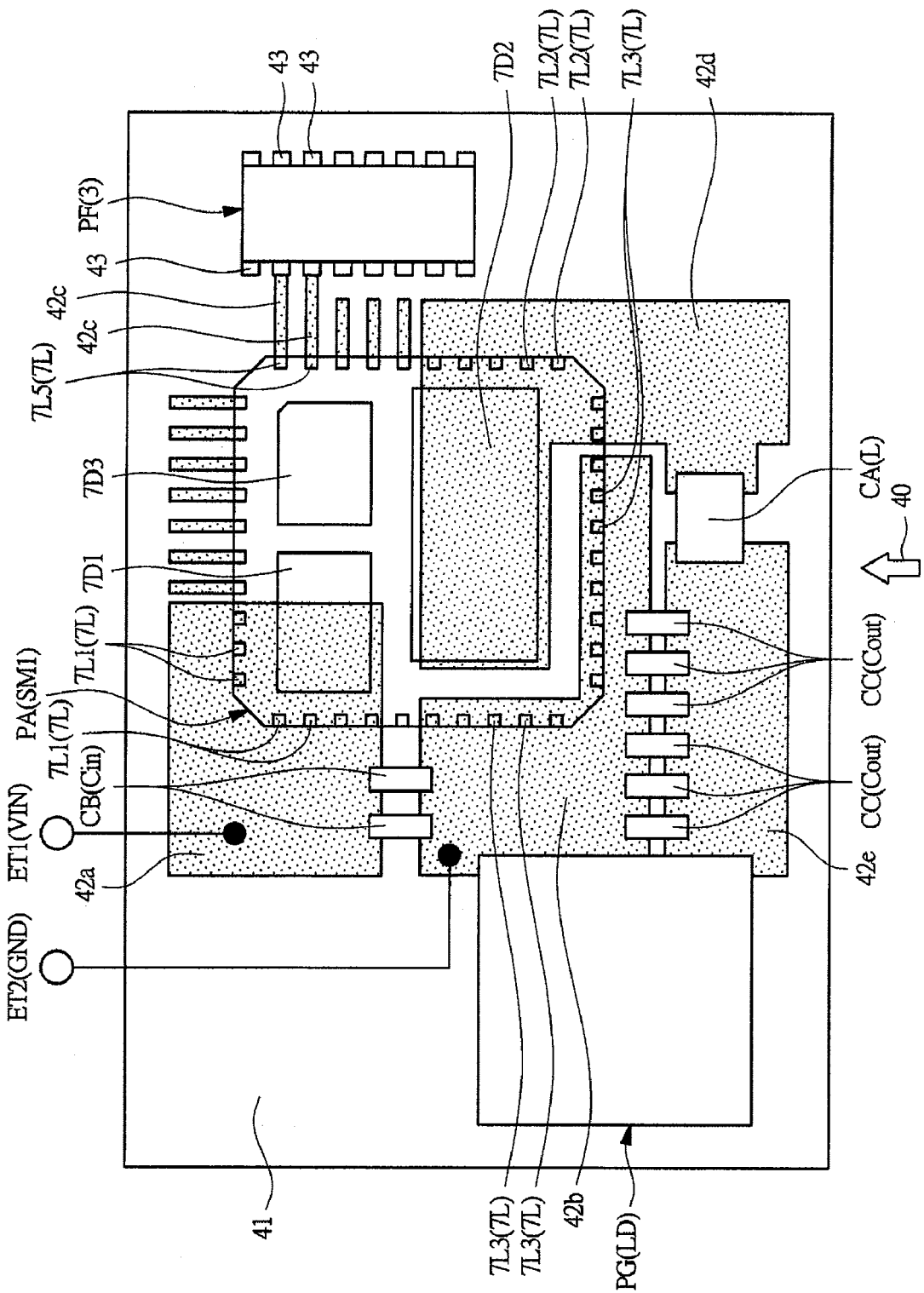
FIG. 19 is a plan view of essential parts of a mounting example of electronic parts constituting the DC-DC converter in FIG. 1.
Figure 20:
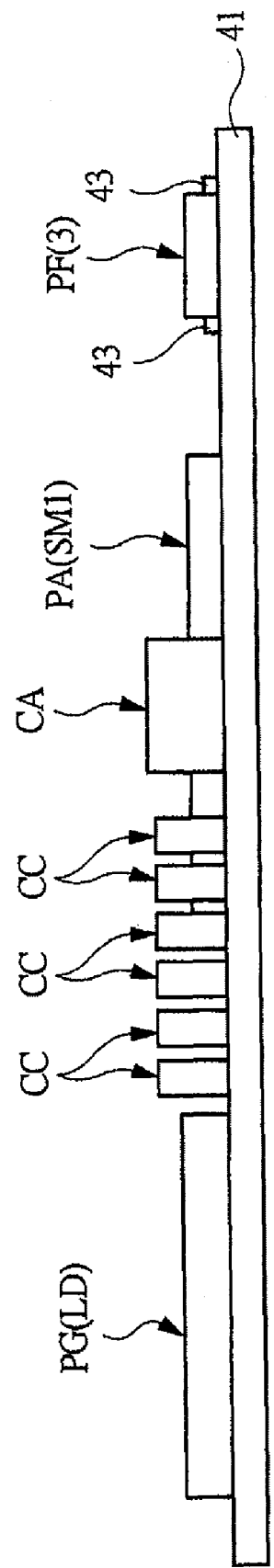
FIG. 20 is a side view of the mounting example in FIG. 19.

Next, FIG. 19 is a plan view of essential parts in an example of packaging of electronic parts constituting the above-mentioned non-insulating DC-DC converter 1 and FIG. 20 is a side view when the non-insulating DC-DC converter 1 in FIG. 19 is viewed in the direction shown by an arrow 40.

The wiring substrate 41 includes, for example, a printed wiring substrate and on its main surface, the packages PA, PF, PG and chip parts CA, CB, CC are mounted. In FIG. 19, the package PA is shown in a perspective view so that the state of the wires 42a to 42d of the wiring substrate 41 is seen. Although FIG. 19 is a plan view, hatching is attached to the wires 42a, 42b, 42c, 42d and 42e of the wiring substrate 41 in order to make the drawing easier-to-see.

In the package PF, the above-mentioned control circuit 3 is formed and in the package PG, the above-mentioned load LD is formed. In the chip part CA, the above-mentioned coil L is formed, in the chip part CB, the above-mentioned input capacitor Cin is formed, and in the chip part CC, the above-mentioned output capacitor Cout is formed.

The terminal ET1 for supplying the input power source VIN is electrically connected to the lead 7L1 and the die pad 7D1 of the package PA (semiconductor device SM1) through the wire 42a of the wiring substrate 41. The terminal ET2 for supplying the reference potential GND is electrically connected to the lead 7L3 of the package PA (semiconductor device SM1) through the wire 42b of the wiring substrate 41. Between the wires 42a, 42b, the chip part CB (input capacitor Cin) is electrically connected.

To the lead 7L5 of the package PA (semiconductor device SM1), a lead (terminal) 43 of the package PF (control circuit 3) is electrically connected through the wire 42c of the wiring substrate 41. The lead 7L2 and the die pad 7D2, which are output terminals of the package PA (semiconductor device SM1), are electrically connected to one end of the chip part CA (coil L) through the wire 42d of the wiring substrate 41. The other end of the chip part CA (coil L) is electrically connected to the wire 42e of the wiring substrate 41.

To the wire 42e, an input lead (terminal) of the package PG (load LD) is electrically connected. A reference potential lead (terminal) of the package PG (load LD) is electrically connected to the above-mentioned wire 42b. Between the wires 42b, 42e, the above-mentioned chip part CC (output capacitor Cout) is electrically connected.

Further, the semiconductor device SM1 is mounted by soldering on the wiring substrate 41, that is, the lead 7L and the die pads 7D1, 7D2 exposed on the back surface (undersurface) of the semiconductor device SM1 are joined and electrically connected to the wires 42a to 42d of the wiring substrate 41 via solder. It is preferable to set the melting point of solder constituting the adhesion layers 11a, 11b, 11c in the semiconductor device SM1 higher than the solder reflow temperature when mounting by soldering the semiconductor device SM1 on the wiring substrate 41 so that the solder constituting the adhesion layers 11a, 11b, 11c in the semiconductor device SM1 does not melt at the time of solder reflow when mounting by soldering the semiconductor device SM1 on the wiring substrate 41. For example, it is recommended to constitute the above-mentioned adhesion layers 11a, 11b, 11c by high melting point solder (for example, a melting point of about 320° C.) and set the solder reflow temperature when mounting by soldering the semiconductor device SM1 on the wiring substrate 41 to about 260° C. Due to this, it is possible to further improve the reliability of the semiconductor device SM1 after being mounted on the wiring substrate 41.

Next, an example of a method for manufacturing the semiconductor device SM1 in the present embodiment will be described.

Figure 21:
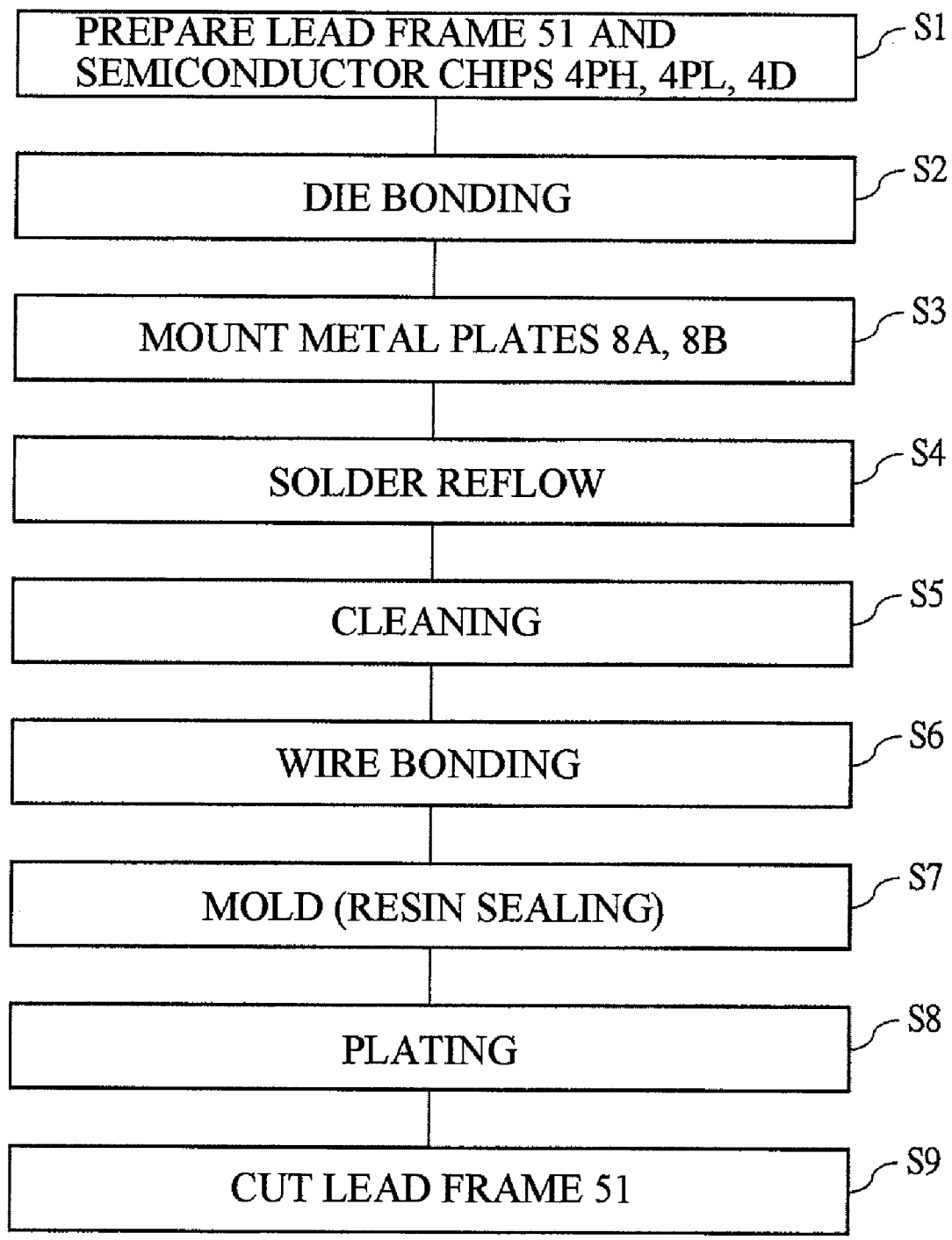
FIG. 21 is a manufacturing process flow chart showing an example of a manufacturing process of a semiconductor device according to an embodiment of the present invention.
Figure 22:
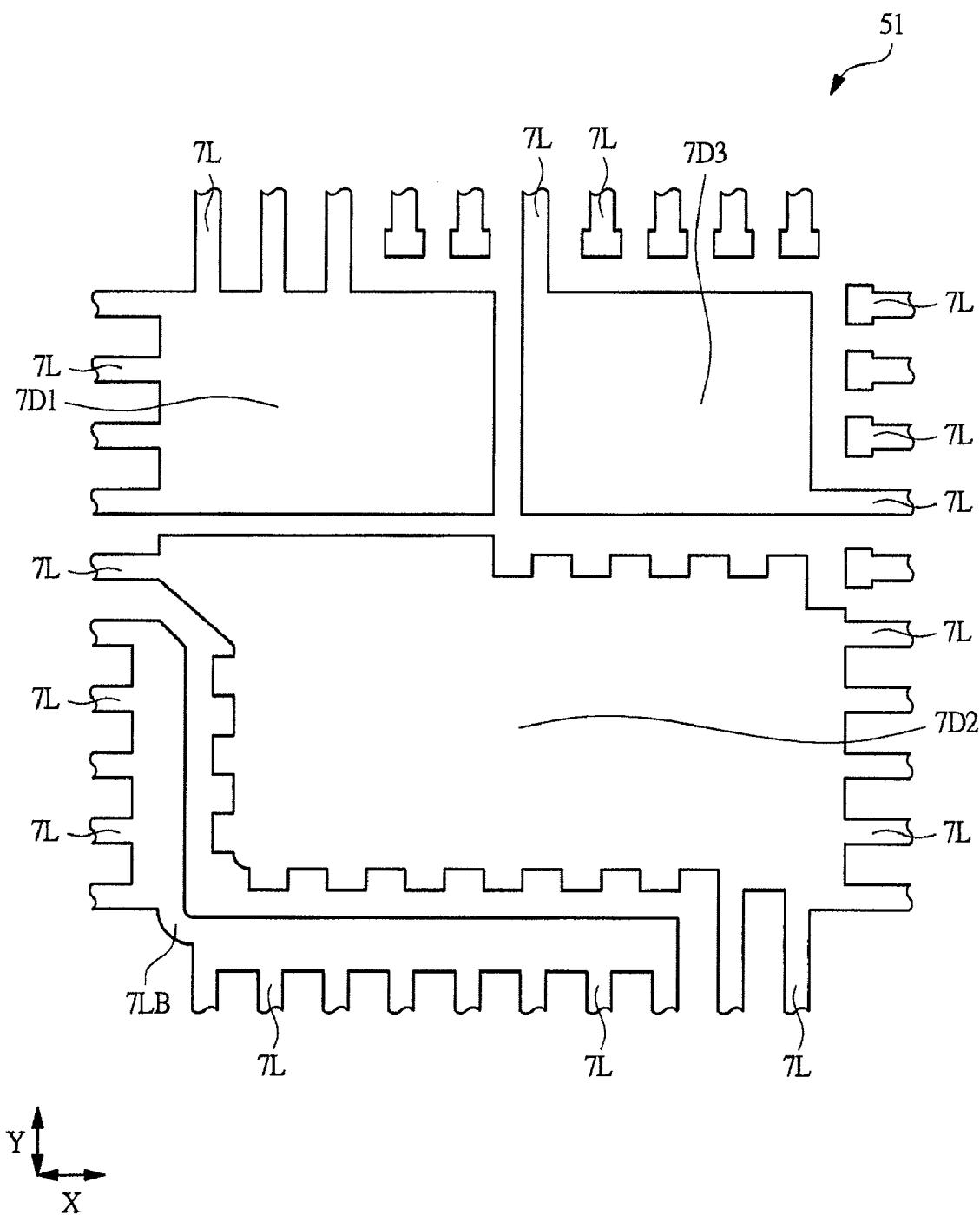
FIG. 22 is a plan view of a lead frame used in manufacturing a semiconductor device according to an embodiment of the present invention.
Figure 23:
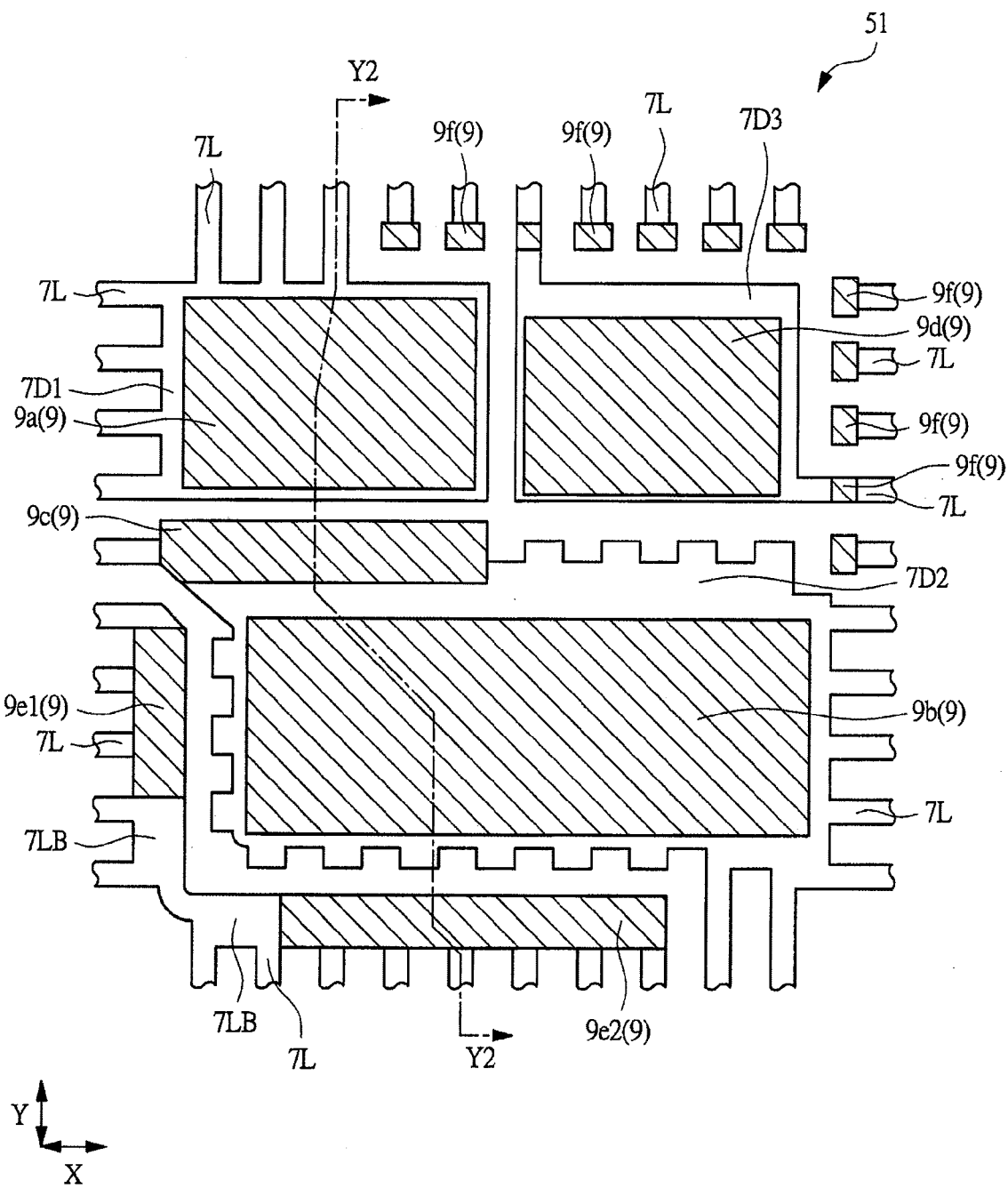
FIG. 23 is a plan view of a lead frame used in manufacturing a semiconductor device according to an embodiment of the present invention.
Figure 24:
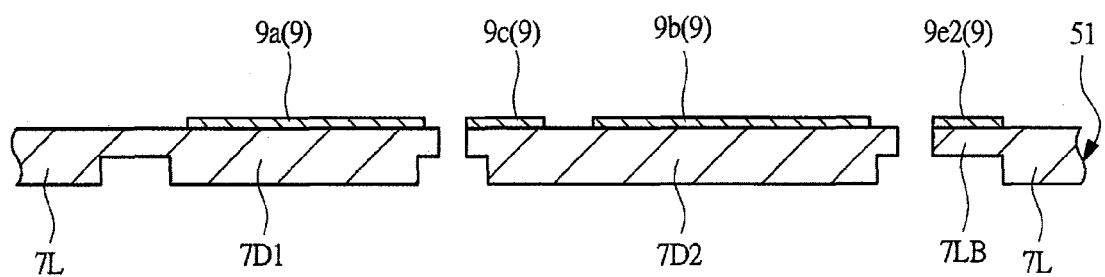
FIG. 24 is a section view of the lead frame in FIG. 23.

FIG. 21 is a manufacturing process flow chart (process flow chart) showing an example of a manufacturing process of the semiconductor device SM1 in the present embodiment. FIG. 22 and FIG. 23 are a plan view (top view) of the lead frame 51 used in the manufacture of the semiconductor device in the present embodiment. FIG. 24 is a section view along Y2-Y2 line in FIG. 23 and the position of Y2-Y2 line in FIG. 23 corresponds to the position of Y1-Y1 line in FIG. 6. Although FIG. 22 and FIG. 23 show the same region of the lead frame 51, FIG. 22 shows the lead frame 51 in the stage before the plated layer 9 is formed and FIG. 23 shows the lead frame 51 in the stage after the plated layer 9 is formed. Although FIG. 23 is a plan view, hatching is attached to the plated layer 9 in FIG. 23 in order to make the drawing easier-to-see. In addition, FIG. 22 and FIG. 23 show a region of the lead frame 51, which corresponds to one package PA (semiconductor device SM1) (region from which one semiconductor device SM1 is manufactured). Actually, the lead frame 51 is a multiply-connected lead frame, in which a plurality of unit structures, which is a structure shown in FIG. 22 and FIG. 23, is connected (repeated).

In order to manufacture the semiconductor device SM1 (package PA), first the lead frame 51 and the semiconductor chips 4PH, 4PL, 4D are prepared (step S1 in FIG. 21).

Although the lead frame 51 is formed by a metal material, it is preferable to form the lead frame 51 by copper or copper alloy from the standpoint that processing is easy, thermal conductivity is high, and the cost is comparatively low. The lead frame 51 can be prepared, for example, as follows.

That is, by processing a metal plate including copper or copper alloy using the photolithography technique, the etching technique, and so on, the lead frame 51 is manufactured first, which integrally has the die pads 7D1 to 7D3, the lead 7L, and the lead wire 7LB necessary to constitute the semiconductor device SM1. The die pads 7D1 to 7D3, the lead 7L, and the lead wire 7LB are held by being linked to a frame (not shown) etc. of the lead frame 51. Then, as shown in FIG. 23 and FIG. 24, on the top surface of the die pads 7D1 to 7D3, the lead 7L, and the lead wire 7LB of the lead frame 51, the above-mentioned plated layer 9 is formed. At this time, by applying a resist film onto a region in which the plated layer 9 is not formed in the lead frame 51 and subjecting it to plating processing (preferably, electrolytic plating processing), the above-mentioned plated layer 9, that is, the above-mentioned plated layers 9a, 9b, 9c, 9d, 9e1, 9e2 and 9f, are formed on the top surface of the die pads 7D1 to 7D3, the lead 7L, and the lead wire 7LB of the lead frame 51. It is also possible to form the plated layer 9 using a rubber mask etc. instead of a resist film. If a resist film is used in forming the plated layer 9, it is possible to further improve patterning precision of the plated layer 9. As to which region of the above-mentioned plated layers 9a, 9b, 9c, 9d, 9e1, 9e2 and 9f are formed on the top surface of the die pads 7D1 to 7D3, the lead 7L, and the lead wire 7LB, the description is already given as above, and therefore, its description is omitted here. In this manner, the lead frame 51 in which the plated layer 9 (9a, 9b, 9c, 9d, 9e1, 9e2 and 9f) is formed is prepared.

It is possible to prepare each of the semiconductor chips 4PH, 4PL, 4D by forming a semiconductor element etc. necessary for a semiconductor wafer (semiconductor substrate) and by separating the semiconductor wafer into individual semiconductor chips by dicing etc. The semiconductor chips 4PH, 4PL, 4D are formed, using respective semiconductor wafers.

In step S1, it may also be possible to prepare first the lead frame 51 and then the semiconductor chips 4PH, 4PL, 4D, or prepare first the semiconductor chips 4PH, 4PL, 4D, then the lead frame 51, or prepare the lead frame 51 and the semiconductor chips 4PH, 4PL, 4D simultaneously.

Figure 25:
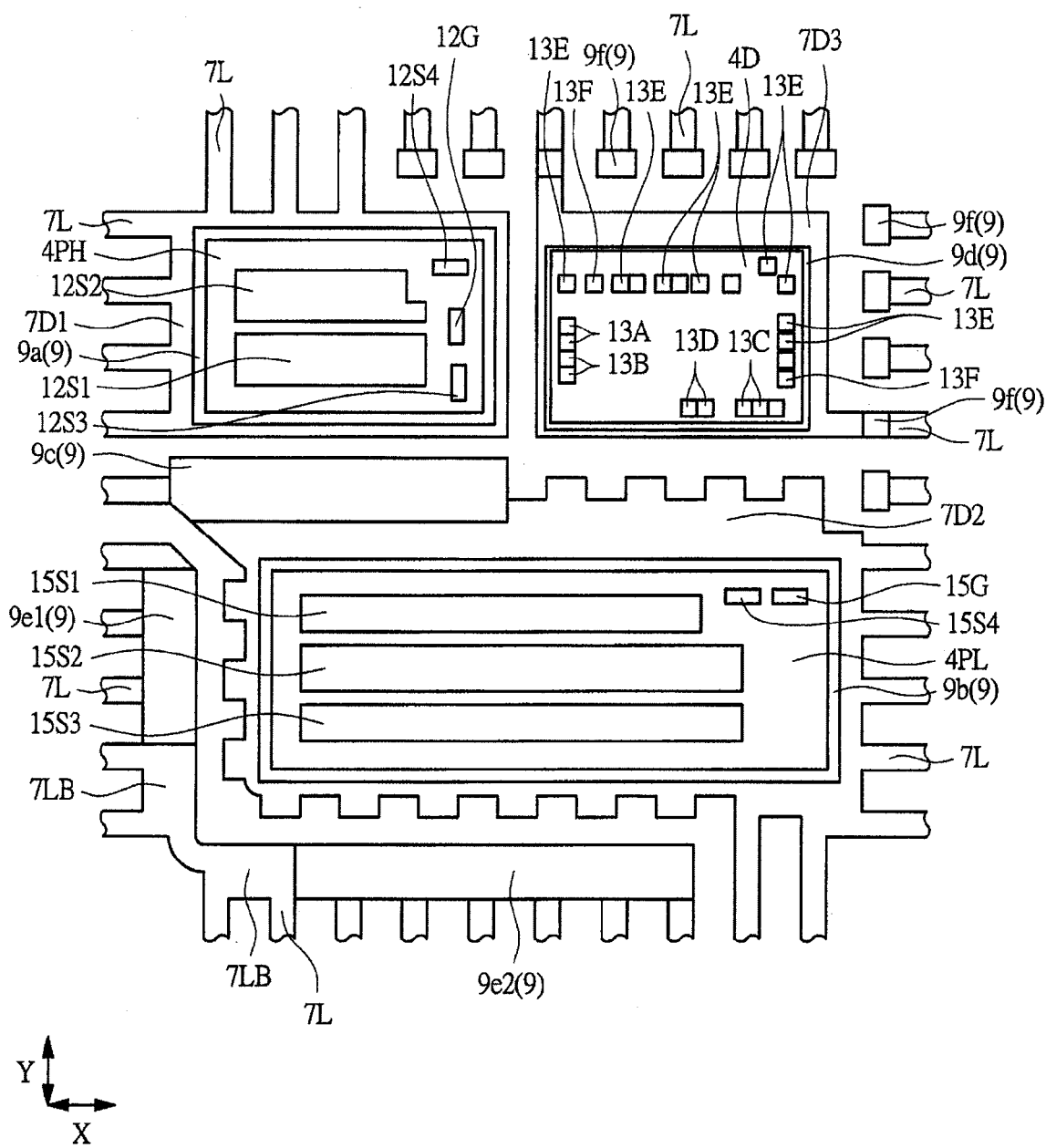
FIG. 25 is a plan view during the manufacturing process of a semiconductor device according to an embodiment of the present invention.
Figure 26:
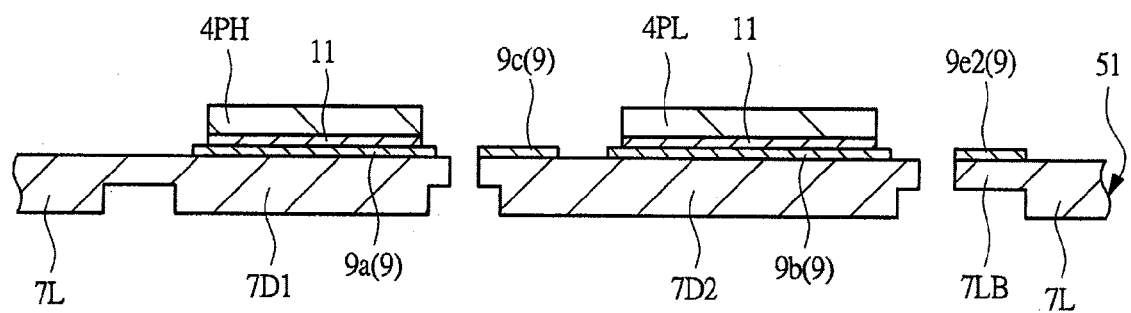
FIG. 26 is a section view during the manufacturing process of a semiconductor device, similar to FIG. 25.

In step S1, after the lead frame 51 and the semiconductor chips 4PH, 4PL, 4D are prepared, the semiconductor chips 4PH, 4PL, 4D are die-bonded onto the die pads 7D1, 7D2, 7D3 of the lead frame 51 (step S2 in FIG. 21). FIG. 25 and FIG. 26 are a plan view (FIG. 25) and a section view (FIG. 26), respectively, in the stage where the die-bonding process in step S2 has been performed, showing the plan view and the section view corresponding to FIG. 23 and FIG. 24, respectively.

In the die-bonding process in step S2, after the solder paste 11 is arranged (applied, supplied) on the plated layer 9a on the top surface of the die pad 7D1, on the plated layer 9b on the top surface of the die pad 7D2, and on the plated layer 9d on the top surface of the die pad 7D3, respectively, the semiconductor chips 4PH, 4PL, 4D are mounted (arranged) on the plated layers 9a, 9b, 9d on the top surfaces of the die pads 7D1, 7D2, 7D3 via the solder paste 11. That is, the semiconductor chips 4PH, 4PL, 4D are mounted on the plated layer 9a on the top surface of the die pad 7D1, on the plated layer 9b on the top surface of the die pad 7D2, and on the plated layer 9d on the top surface of the die pad 7D3, respectively, via the solder paste 11. The semiconductor chips 4PH, 4PL, 4D are mounted on the plated layers 9a, 9b, 9d on the top surfaces of the die pads 7D1, 7D2, 7D3 via the solder paste 11 in a state where their main surfaces (main surfaces on the side of the formation of the bonding pad) face upward and their back surfaces are in opposition to the die pads 7D1, 7D2, 7D3. Due to the adhesion of the solder paste 11, the semiconductor chips 4PH, 4PL, 4D are temporarily adhered to (temporarily fixed on) the die pads 7D1, 7D2, 7D3 (plated layers 9a, 9b, 9d). The solder paste 11 is formed using, for example, lead (Pb)-titanium (Sn) based solder (for example, solder including, for example, lead-titanium-silver-copper alloy) as its main material.

Figure 27:
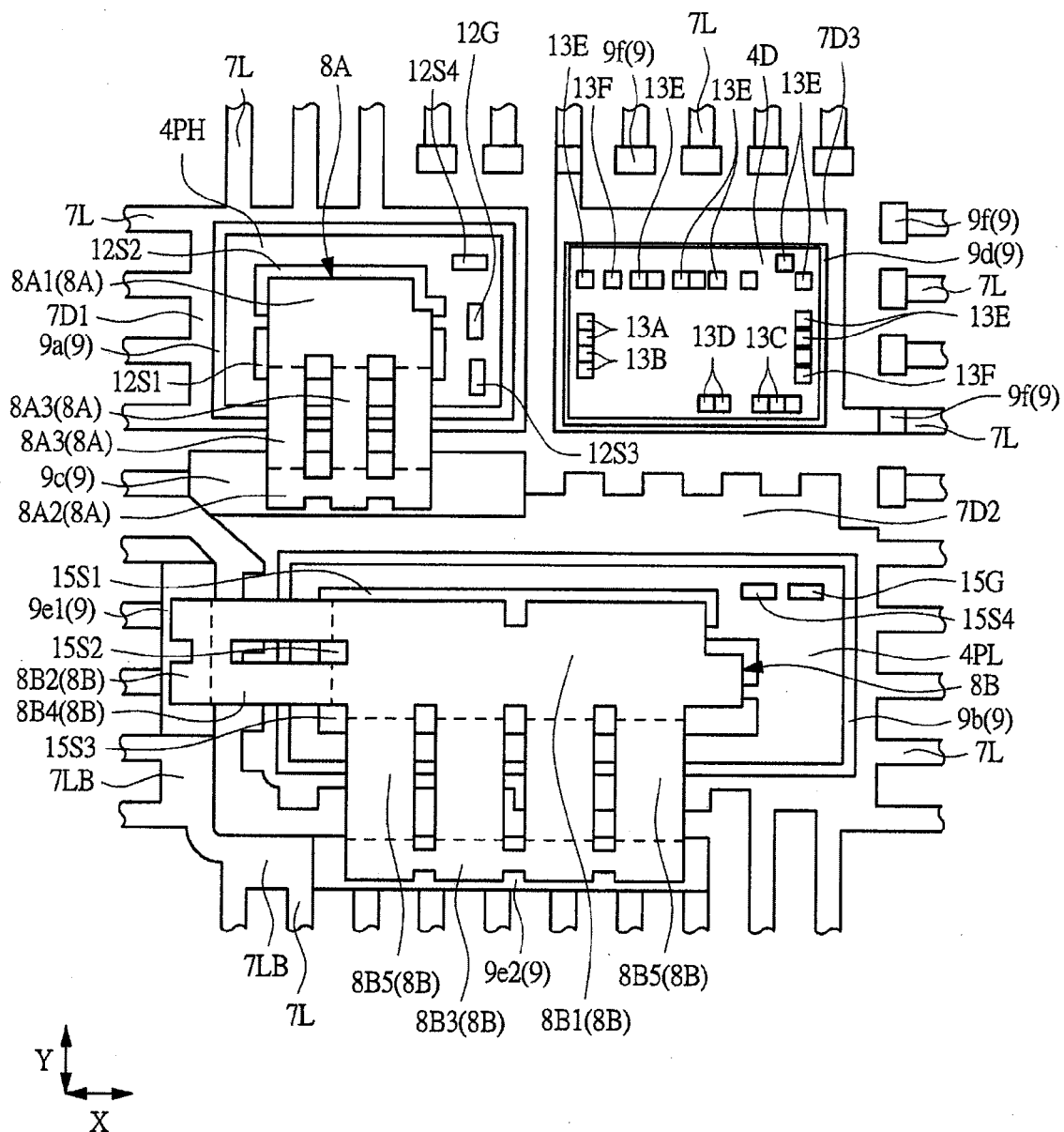
FIG. 27 is a plan view during the manufacturing process of a semiconductor device, following FIG. 25.
Figure 28:
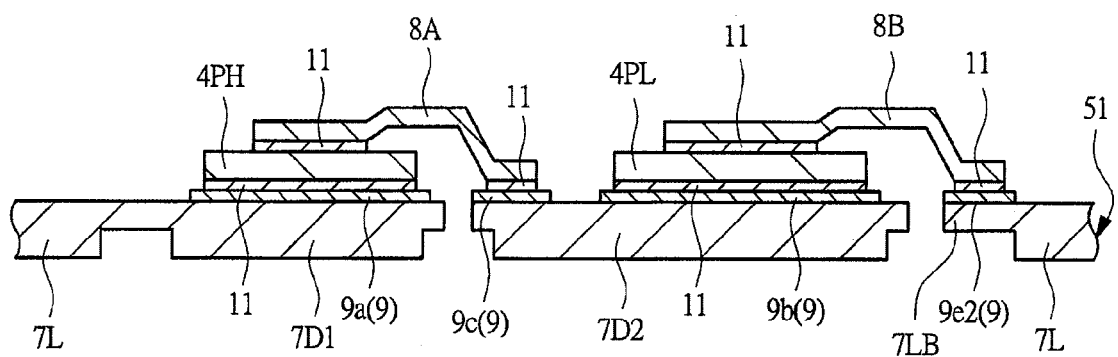
FIG. 28 is a section view during the manufacturing process of a semiconductor device, similar to FIG. 27.

After the die-bonding process in step S2, the metal plates 8A, 8B are mounted (arranged) on the semiconductor chips 4PH, 4PL via the solder paste 11 (step S3 in FIG. 21). FIG. 27 and FIG. 28 are a plan view (FIG. 27) and a section view (FIG. 28) in the stage where the mounting process of the metal plates 8A, 8B in step S3 has been performed, respectively, showing the plan view and the section view and the section view corresponding to the above-mentioned FIG. 23 and FIG. 24.

In the mounting process of the metal plates 8A, 8B in step S3, first, the solder paste 11 is arranged (applied, supplied) on the source electrode pads 12S1, 12S2 of the semiconductor chip 4PH, on the source electrode pads 15S1, 15S2, 15S3 of the semiconductor chip 4PL, on plated layer 9c on the top surface of the die pad 7D2, and the plated layers 9e1, 9e2 on the top surface of the lead wire 7LB, respectively. Then, the plane position of the metal plates 8A, 8B is aligned with that of the semiconductor chips 4PH, 4PL and the metal plates 8A, 8B are mounted (arranged) on the semiconductor chips 4PH, 4PL via the solder paste 11. Due to the adhesion of the solder paste 11, the metal plate 8A is temporarily adhered to (temporarily fixed on) the semiconductor chip 4PH and the die pad 7D2 (plated layer 9c) and the metal plate 8B is temporarily adhered to (temporarily fixed on) the semiconductor chip 4PL and the lead wire 7LB (plated layers 9e1, 9e2).

Figure 29:
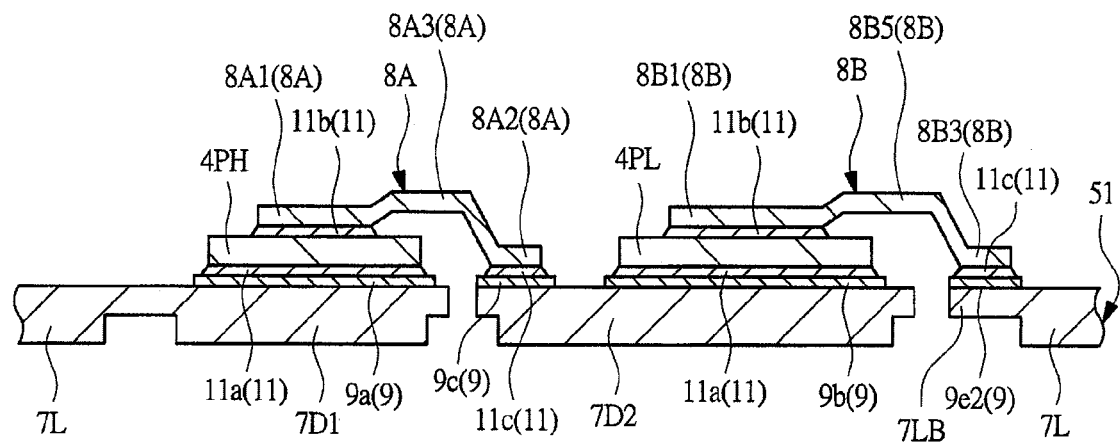
FIG. 29 is a section view during the manufacturing process of a semiconductor device, following FIG. 28.

After the mounting process of the metal plates 8A, 8B in step S3, the solder reflow processing (thermal processing) is performed (step S4 in FIG. 21). FIG. 29 is a section view in the stage where the solder reflow processing in step S4 has been performed, showing the section view corresponding to the above-mentioned FIG. 24.

By the solder reflow processing in step S4, the solder paste 11 melts and solidifies (re-solidifies), forming the above-mentioned adhesion layers 11a, 11b, 11c. That is, in the die-bonding process in step S2, the solder paste 11 interposed between the back surfaces of the semiconductor chips 4PH, 4PL, 4D and the plated layers 9a, 9b, 9d on the top surfaces of the die pads 7D1, 7D2, 7D3 melts and solidifies (re-solidifies) in the solder reflow processing in step S4 and forms the above-mentioned adhesion 11a. In the mounting process of the metal plates 8A, 8B in step S3, the solder paste 11 interposed between the metal plate 8A and the source electrode pads 12S1, 12S2 of the semiconductor chip 4PH and between the metal plate 8B and the source electrode pads 15S1, 15S2, 15S3 of the semiconductor chip 4PL melts and solidifies (re-solidifies) in the solder reflow processing in step S4 and forms the above-mentioned adhesion 11b. In the mounting process of the metal plates 8A, 8B in step S3, the solder paste 11 interposed between the metal plate 8A and the plated layer 9c on the top surface of the die pad 7D2 and between the metal plate 8B and the plated layers 9e1, 9e2 on the top surface of the lead wire 7LB melts and solidifies (re-solidifies) in the solder reflow processing in step S4 and forms the above-mentioned adhesion 11c. It is possible to set the temperature of the solder reflow in step S4 to, for example, about 340 to 350° C. In addition, it is possible to set the melting point of the solder constituting the solder paste 11 to, for example, about 320° C.

Due to the solder reflow processing in step S4, the semiconductor chips 4PH, 4PL, 4D are fixed on (joined to) the die pads 7D1 to 7D3 and, at the same time, the metal plates 8A, 8B are fixed on (joined to) the semiconductor chips 4PH, 4PL, the die pad 7D2, and the lead wire 7LB. Here, the back surface (undersurface) of the first part 8A1 of the metal plate 8A is joined (adhered) to the source electrode pads 12S1, 12S2 on the main surface of the semiconductor chip 4PH via the adhesion layer 11b and the back surface (undersurface) of the second part 8A2 of the metal plate 8A is joined (adhered) to the die pad 7D2 (plated layer 9c) via the adhesion layer 11c. Further, the back surface (undersurface) of the first part 8B1 of the metal plate 8B is joined (adhered) to the source electrode pads 15S1, 15S2, 15S3 on the main surface of the semiconductor chip 4PL via the adhesion layer 11b and the back surfaces (undersurfaces) of the second part 8B2 and the third part 8B3 of the metal plate 8B are joined (adhered) to the lead wire 7LB (plated layers 9e1, 9e2) via the adhesion layer 11c.

After the solder reflow processing in step S4, cleaning processing is performed (step S5 in FIG. 21). In the cleaning processing in step S5, for example, the metal surface of the plated layer 9f in the bonding pad of the semiconductor chip 4D or the lead 7L of the lead frame 51 is exposed by performing plasma cleaning processing after removing flux produced in the solder reflow processing in step S4 by immersing it in a alcohol solution etc.

Figure 30:
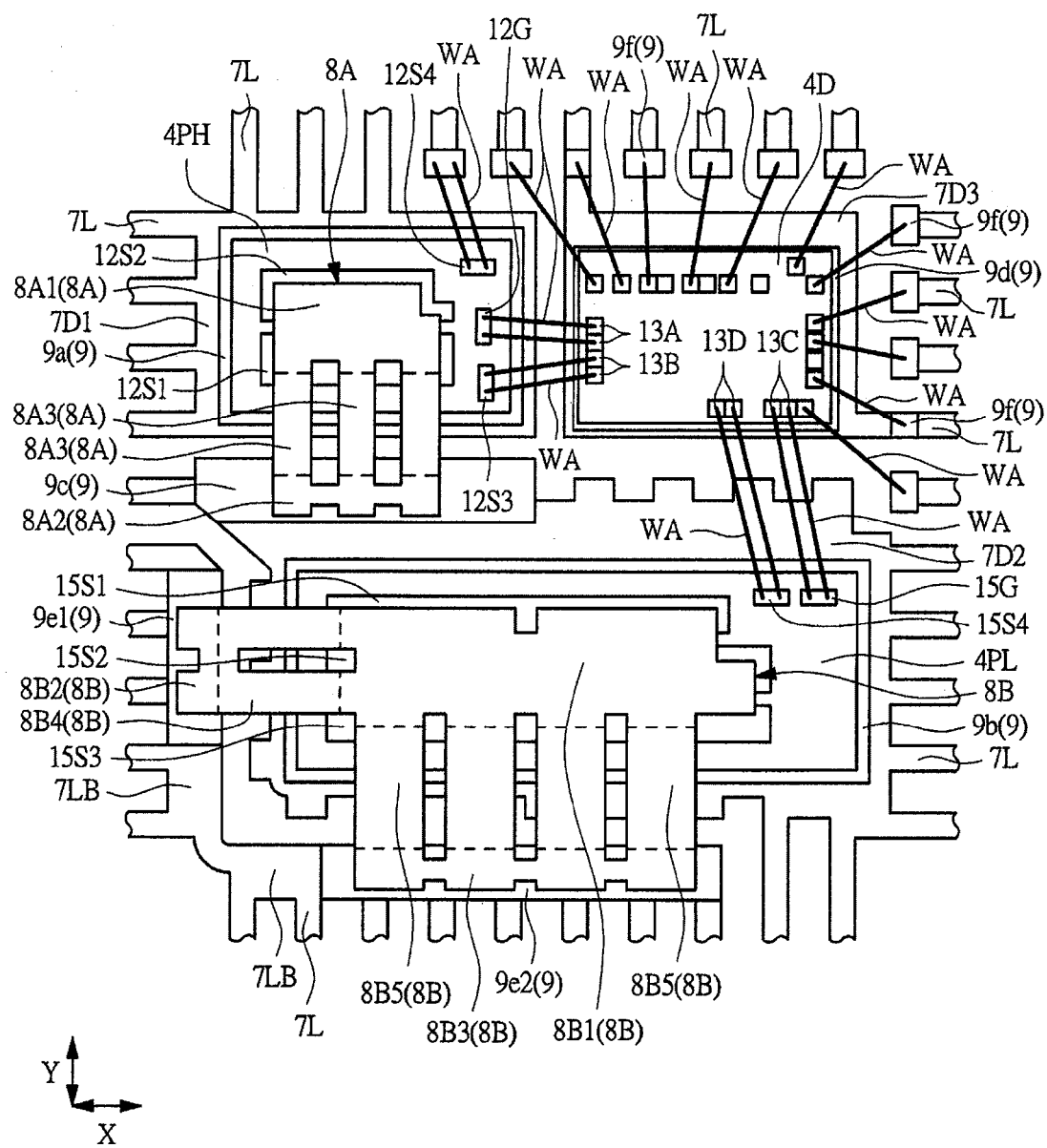
FIG. 30 is a plan view during the manufacturing process of a semiconductor device, following FIG. 29.

After the cleaning process in step S5, the wire bonding process is performed (step S6 in FIG. 21). FIG. 30 is a plan view in the stage where the wire bonding process in step S6 has been performed, showing the plan view corresponding to the above-mentioned FIG. 23.

In the wire bonding process in step S6, the pads of the semiconductor chips 4PH, 4PL, 4D are electrically connected with one another by the wire WA, and the pads of the semiconductor chips 4PH, 4D and the plated layer 9f are also electrically connected by the wire WA. At this time, as described above, the pad 12G of the semiconductor chip 4PH and the pad 13A of the semiconductor chip 4D are connected by the wire WA and the pad 12S3 of the semiconductor chip 4PH and the pad 13B of the semiconductor chip 4D are connected by the wire WA. Further, the pad 15G of the semiconductor chip 4PL and the pad 13C of the semiconductor chip 4D are connected by the wire WA and the pad 15S4 of the semiconductor chip 4PL and the pad 13D of the semiconductor chip 4D are connected by the wire WA. Furthermore, the above-mentioned pads 13E, 13F of the semiconductor chip 4D and the plated layer 9f on the lead frame 7L are connected by the wire WA, and the pad 12S4 of the semiconductor chip 4PH and the plated layer 9f on the lead 7L are connected by the wire WA.

Figure 31:
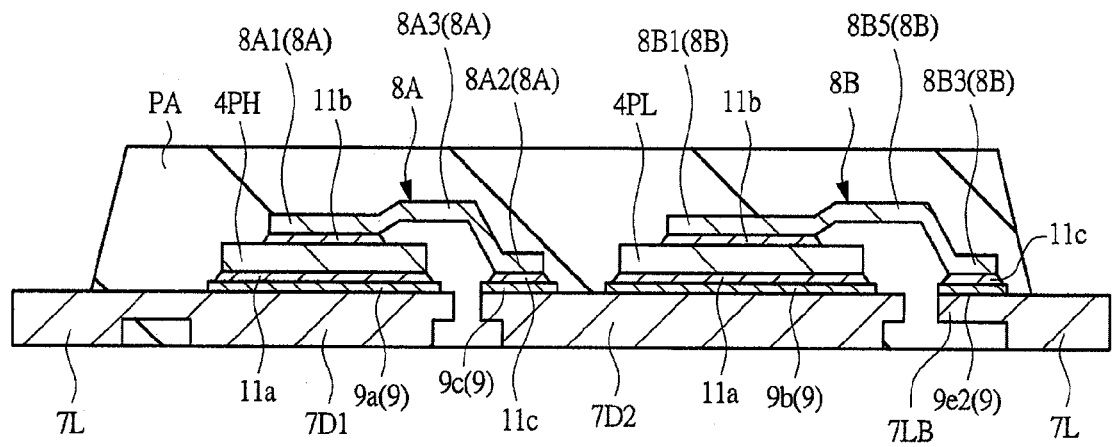
FIG. 31 is a section view during the manufacturing process of a semiconductor device, following FIG. 30.

After the wire bonding process in step S6, a mold process (resin sealing process, for example, transfer mold process) is performed, and thereby, the semiconductor chips 4D, 4PH, 4PL and the metal plates 8A, 8B are sealed with a resin constituting the package PA (step S7 in FIG. 21). FIG. 31 is a section view in the stage where the mold process in step S7 has been performed, showing the section view corresponding to the above-mentioned FIG. 24.

After the mold process in step S7, the plated layer (solder plated layer) 10 is formed on the surface of the lead frame 51 (lead 7L and die pads 7D1 to 7D3) that exposes from the package PA (step S8 in FIG. 21).

Figure 32:
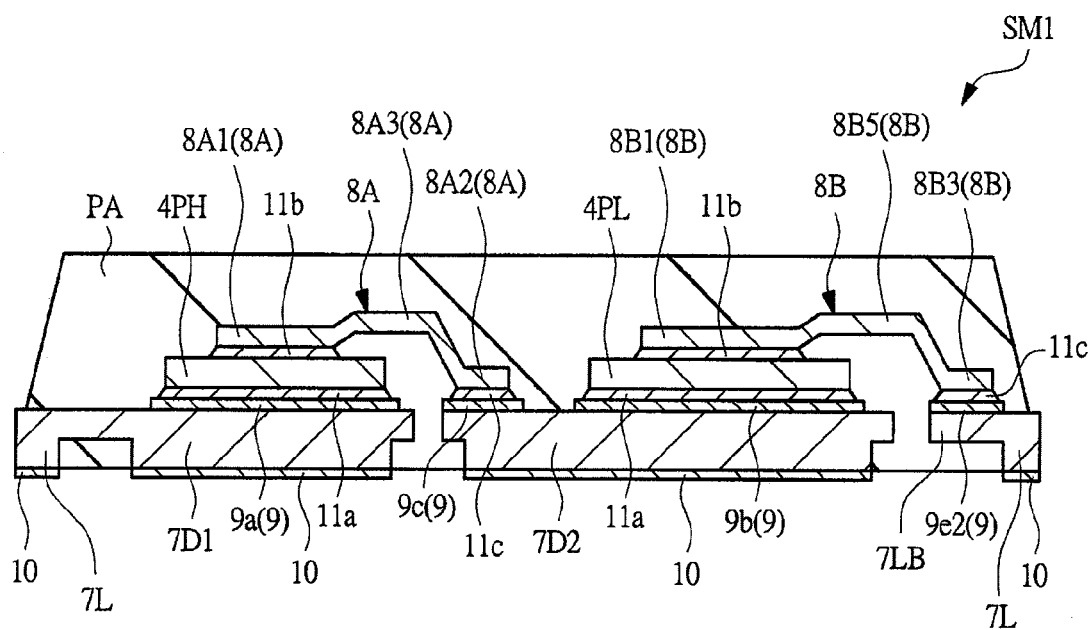
FIG. 32 is a section view during the manufacturing process of a semiconductor device, following FIG. 31.

After the plating processing in step S8, the lead frame 51 (lead 7L) that projects from the package PA is cut and removed (step S9 in FIG. 21). FIG. 32 is a section view in the stage where the cutting process in step S9 has been performed, showing the section view corresponding to above-mentioned FIG. 24. FIG. 32 corresponds to the above-mentioned FIG. 7.

In this manner, the semiconductor device SM1 is manufactured.

Next, the plated layer 9 formed on the main surfaces (top surfaces) of the die pads 7D1 to 7D3, the lead 7L, and the lead wire 7LB in the semiconductor device SM1 in the present embodiment will be described in more detail.

In the semiconductor device SM1 in the present embodiment, the plated layer 9 is formed partially on the surfaces (top surfaces) of the die pads 7D1 to 7D3, the lead 7L, and the lead wire 7LB as shown in the above-mentioned FIG. 11 etc.

The plated layer 9 formed on the top surface of the lead 7L (that is, plated layer 9f) is provided for the purpose of improving the stability of the connection (adhesion under pressure) between the wire WA and the lead 7L. Because of this, the plated layer 9f is formed on the top surface of the lead 7L with which the wire WA is connected (region where the wire WA is connected) among the leads 7L owned by the semiconductor device SM1 but the plated layer 9 is not formed on the top surface of the lead 7L with which the wire WA is not connected.

The plated layer 9 formed on the top surface of the die pad 7D1 (that is, the plated layer 9a) is provided for the purpose of improving the stability of the joint between the semiconductor chip 4PH and the die pad 7D1 to be mounted thereon with the adhesion layer (solder) 11a and suppressing the spreading due to wettability of the adhesion layer (solder) 11a that joins the semiconductor chip 4PH and the die pad 7D1 within the plated layer 9a. Because of this, the plated layer 9a is formed in the region where the semiconductor chip 4PH is mounted of the top surface of the die pad 7D1, the planar dimensions of the plated layer 9a on the top surface of the die pad 7D1 are somewhat larger than the planar dimensions of the semiconductor chip 4PH, and the plated layer 9a on the top surface of the die pad 7D1 involves the semiconductor chip 4PH mounted thereon in a planar manner. For example, on the top surface of the die pad 7D1, the plated layer 9a is formed in a region extending outwardly about 100 μm from the respective four sides of the back surface of the semiconductor chip 4PH. Because of this, it is possible to further improve the reliability of joint of the semiconductor chip 4PH onto the die pad 7D1.

The plated layer 9 formed on the top surface of the lead wire 7LB (that is, the plated layers 9e1, 9e2) is provided for the purpose of improving the stability of the joint between (the second part 8B2 and the third part 8B3 of) the metal plate 8B and the lead wire 7LB with the adhesion layer (solder) 11c and suppressing spreading due to wettability of the adhesion layer (solder) 11c that joins (the second part 8B2 and the third part 8B3 of) the metal plate 8B and the lead wire 7LB within the metal layers 9e1, 9e2. Because of this, the plated layers 9e1, 9e2 are formed respectively in the region where the second part 8B2 of the metal plate 8B is joined via the adhesion layer (solder) 11c and the region where the third part 8B3 of the metal plate 8B is joined via the adhesion layer (solder) 11c of the top surface of the lead wire 7LB, but the plated layer 9 is not formed in other regions of the top surface of the lead wire 7LB.

Here, the plated layer 9 formed on the top surface of the lead wire 7LB includes the plated layer 9e1 formed in the region where the second part 8B2 of the metal plate 8B is joined via the adhesion layer (solder) 11c and the plated layer 9e2 formed in the region where the third part 8B3 of the metal plate 8B is joined via the adhesion layer (solder) 11c. The plated layer 9e1 on the top surface of the lead wire 7LB to which the second part 8B2 of the metal plate 8B is joined and the plated layer 9e2 on the top surface of the lead wire 7LB to which the third part 8B3 of the metal plate 8B is joined are separated from each other with the region where the plated layer 9 is not formed on the top surface of the lead wire 7LB in between. The planar dimensions of the plated layer 9e1 on the top surface of the lead wire 7LB are somewhat larger than those of the second part 8B2 of the metal plate 8B and the plated layer 9e1 on the top surface of the lead wire 7LB involves the second part 8B2 of the metal plate 8B joined thereto in a planar manner. In addition, the planar dimensions of the plated layer 9e2 on the top surface of the lead wire 7LB are somewhat larger than those of the third part 8B3 of the metal plate 8B and the plate layer 9e2 on the top surface of the lead wire 7LB involves the third part 8B3 of the metal plate 8B joined thereto in a planar manner.

On the top surface of the die pad 7D2, the plated layer (that is, the plated layers 9b, 9c) is formed respectively in the region where the semiconductor chip 4PL is mounted and the region where the second part 8A2 of the metal plate 8A is joined via the adhesion layer (solder) 11c but the plated layer 9 is not formed in other regions on the top surface of the die pad 7D2. Here, the plated layer 9 formed on the top surface of the die pad 7D2 includes the plated layer 9b formed in the region where the semiconductor chip 4PL is joined (mounted) via the adhesion layer (solder) 11a and the plated layer 9c formed in the region where the second part 8A2 of the metal plate 8A is joined via the adhesion layer (solder) 11c. The plated layer 9c on the top surface of the die pad 7D2 to which the second part 8A2 of the metal plate 8A is joined and the plated layer 9b on the top surface of the die pad 7D2 on (to) which the semiconductor chip 4PL is mounted (joined) are separated from each other with the region where the plated layer 9 is not formed on the top surface of the die pad 7D2 in between.

The plated layer 9b formed on the top surface of the die pad 7D2 is provided for the purpose of improving the stability of the joint between the semiconductor chip 4PL and the die pad 7D2 to be mounted thereon with the adhesion layer (solder) 11a and suppressing the spreading due to wettability of the adhesion layer (solder) 11a that joins the semiconductor chip 4PL and the die pad 7D2 within the plated layer 9b. Because of this, the plated layer 9b is formed in the region where the semiconductor chip 4PL is mounted of the top surface of the die pad 7D2, the planar dimensions of the plated layer 9b on the top surface of the die pad 7D2 are somewhat larger than those of the semiconductor chip 4PL, and the plated layer 9b on the top surface of the die pad 7D2 involves the semiconductor chip 4PL mounted thereon in a planar manner. For example, on the top surface of the die pad 7D2, the plated layer 9b is formed in a region extending outwardly about 100 μm from the respective four sides of the back surface of the semiconductor chip 4PL. Because of this, it is possible to further improve the reliability of joint of the semiconductor chip 4PL onto the die pad 7D2.

The plated layer 9c formed on the top surface of the die pad 7D2 is provided for the purpose of improving the stability of the joint between (the second part 8A2 of) the metal plate 8A and the die pad 7D2 with the adhesion layer (solder) 11c and suppressing the spreading due to wettability of the adhesion layer (solder) 11c that joins (the second part 8A2 of) the metal plate 8A and the die pad 7D2 within the plated layer 9c. The planar dimensions of the plated layer 9c on the top surface of the die pad 7D2 are somewhat larger than those of the second part 8A2 of the metal plate 8A, and the plated layer 9c on the top surface of the die pad 7D2 involves the second part 8A2 of the metal plate 8A joined thereto in a planar manner.

In the present embodiment, over the top surface (main surface) of the die pad 7D2, the plated layer 9b on which the semiconductor chip 4PL is mounted and the plated layer 9c to which (the second part of) the metal plate 8A is joined are provided independently of each other and separated from each other.

The plated layer 9 formed on the top surface of the die pad 7D3 (that is, the plated layer 9d) is provided for the purpose of improving the stability of the joint between the semiconductor chip 4D and the die pad 7D3 to be mounted thereon with the adhesion layer (solder) 11a and suppressing the spreading due to wettability of the adhesion layer (solder) 11a that joins the semiconductor chip 4D and the die pad 7D3 within the plated layer 9d. Because of this, the plated layer 9d is formed in the region where the semiconductor chip 4D is mounted of the top surface of the die pad 7D3, the planar dimensions of the plated layer 9d on the top surface of the die pad 7D3 are somewhat larger than those of the semiconductor chip 4D, and the plated layer 9d on the top surface of the die pad 7D3 involves the semiconductor chip 4D mounted thereon in a planar manner. For example, on the top surface of the die pad 7D3, the plated layer 9a is formed in a region extending outwardly about 100 μm from the respective four sides of the back surface of the semiconductor chip 4D. Because of this, it is possible to further improve the reliability of joint of the semiconductor chip 4D onto the die pad 7D3.

Figure 33:
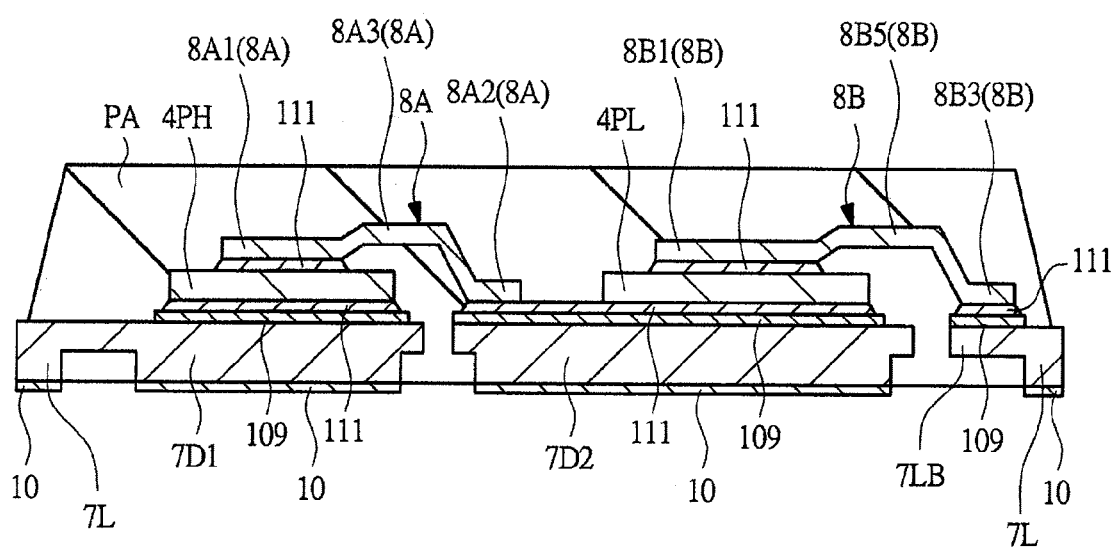
FIG. 33 is a section view of a semiconductor device in a comparative example that the present inventors have studied.
Figure 34:
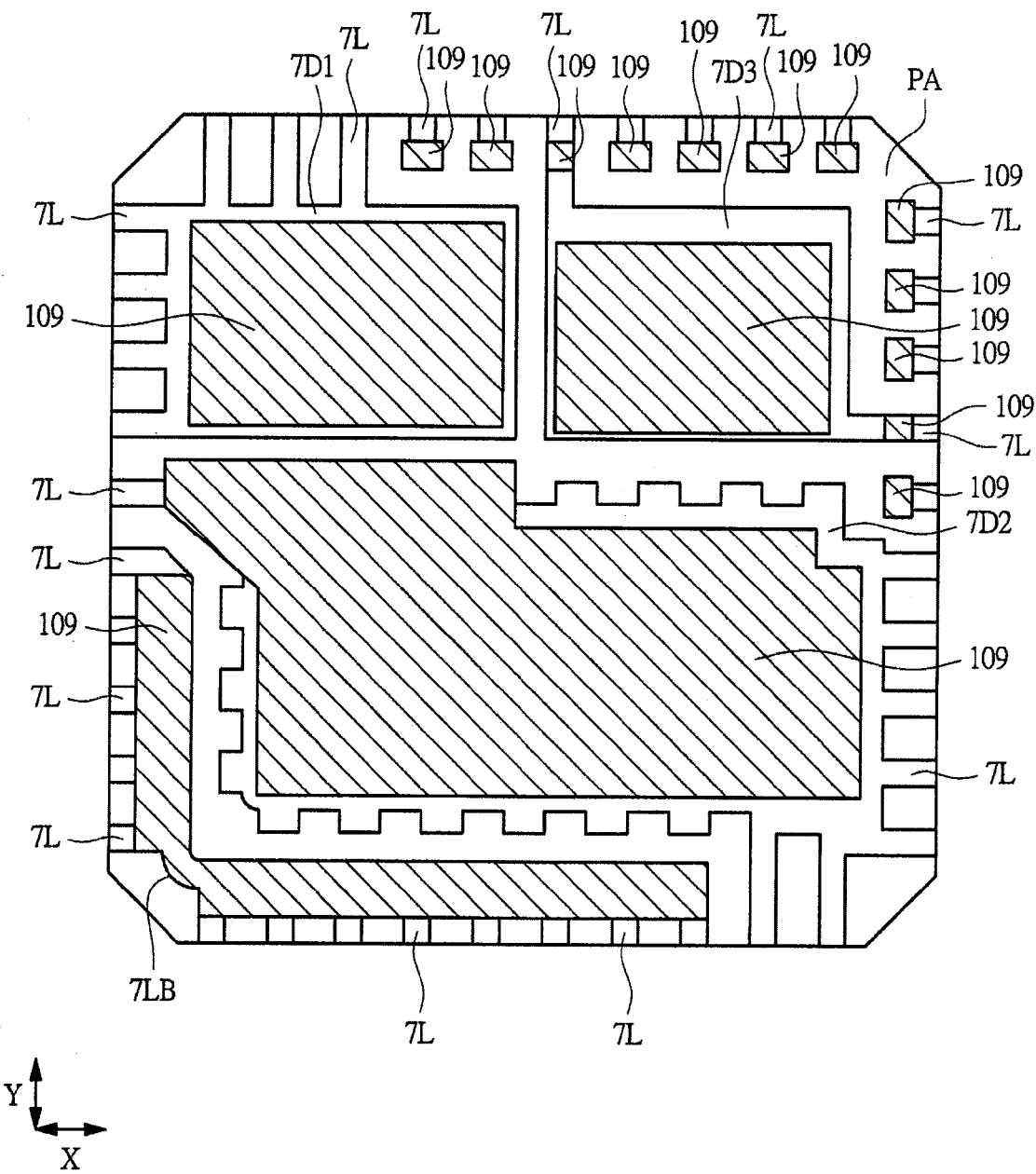
FIG. 34 is a plan perspective view of a semiconductor device in a comparative example that the present inventors have studied.

FIG. 33 and FIG. 34 are a section view (FIG. 33) and a plan perspective view (FIG. 34) of the semiconductor device in the comparative example that the inventors of the present invention have studied, corresponding to the above-mentioned FIG. 7 and FIG. 11 in the present embodiment, respectively. Although FIG. 34 is a plan view, hatching is attached to a plated layer 109 also in FIG. 34 as in FIG. 11 in order to make the drawing easier-to-see.

In the semiconductor device in the comparative example in FIG. 33 and FIG. 34, the plated layer 109 corresponding to the plated layer 9 in the present embodiment is formed, however, different from the present embodiment, the plated layer 109 is formed into a pattern with a large area by connecting the plated layer 109 in the region where the semiconductor chip 4PL is mounted and the plated layer 109 in the region where the metal plate 8A is joined on the top surface of the die pad 7D2. Further, also different from the present embodiment, the plated layer 109 is formed into a pattern by connecting the plated layer 109 in the region where the second part 8B2 of the metal plate 8B is joined and the plated layer 109 in the region where the third part 8B3 of the metal plate 8B is joined on the top surface of the lead wire 7LB. In this case, as shown in FIG. 33 and FIG. 34, in the same plated layer 109 on the top surface of the die pad 7D2, the semiconductor chip 4PL is joined with solder 111 and the metal plate 8A is joined with the solder 111 as a result. In the case of this comparative example, the inventors of the present invention have found the following problem.

That is, when joining the semiconductor chip 4PL and the metal plate 8A, respectively, to the same plated layer 109 on the top surface of the die pad 7D2 with the solder 111, there is a possibility that the solder 111 that joins the semiconductor chip 4PL to the die pad 7D2 and the solder 111 that joins the metal plate 8A to the die pad 7D2 spread due to wettability on the same plated layer 109 on the die pad 7D2 and come into contact and communicate with each other in the solder reflow process (process corresponding to the above-mentioned step S4). Because of this, there is a possibility that the thickness of the solder 111 that joins the semiconductor chip 4PL to the die pad 7D2 is reduced, or conversely that the thickness of the solder 111 that joins the metal plate 8A to the die pad 7D2 is reduced, or that the metal plate 8A moves accompanying the movement of the solder 111 that joins the metal plate 8A to the die pad 7D2.

If the thickness of the solder 111 that joins the semiconductor chip 4PL to the die pad 7D2 is reduced, there is a possibility that the joint strength of the semiconductor chip 4PL is reduced or that the semiconductor chip 4PL inclines. If the thickness of the solder 111 that joins the metal plate 8A to the die pad 7D2 is reduced, there is a possibility that the joint strength of the metal plate 8A is reduced. In addition, if the thickness of the solder 111 is insufficient, it becomes vulnerable to the distortion due to thermal stress. Further, if the metal plate 8A moves, the metal plate 8A comes into contact with unnecessary parts in the semiconductor chip 4PL and there is a possibility that a short circuit failure etc. is caused. Because of the above, the reliability of the semiconductor device is reduced.

In particular, the joint part of the metal plate 8A at the die pad 7D2 and the semiconductor chip 4PL mounting part are very close to each other, and therefore, as shown in the comparative examples shown in FIG. 33 and FIG. 34, when the metal plate 8A and the semiconductor chip 4PL are connected by soldering to the common plated layer 109, it is likely that the solder 111 that joins the semiconductor chip 4PL and the solder 111 that joins the metal plate 8A come into contact and communicate with each other in the solder reflow process (process corresponding to the solder reflow in the above-mentioned step S4). If an attempt is made to increase the distance between the joint part of the metal plate 8A and the semiconductor chip 4PL mounting part on the top surface of the die pad 7D2 without changing the point at which the metal plate 8A and the semiconductor chip 4PL are connected by soldering to the common plated layer 109 on the die pad 7D2 in order to suppress the solders 111 from coming into contact and communicating with each other, an increase in size of the semiconductor device (increase in planar dimensions) is caused.

In contrast to this, in the present embodiment, on the top surface of the die pad 7D2, the plated layer 9b and the plated layer 9c are provided independently of each other without being connected with each other. That is, the plated layer 9c to which (the second part 8A2 of) the metal plate 8A is joined and the plated layer 9b on (to) which the semiconductor chip 4PL is mounted (joined) are separated on the top surface of the die pad 7D2 via a region in which the plated layer 9 is not formed in between.

Because of this, it is possible for the adhesion layer (solder) 11a that joins the semiconductor chip 4PL to the die pad 7D2 to spread due to wettability on the plated layer 9b, however, spreading due to wettability is limited to within the region of the plated layer 9b, and it is not possible to spread due to wettability to the outside of the region on the plated layer 9b. Consequently, it is not possible for the adhesion layer (solder) 11a that joins the semiconductor chip 4PL to the die pad 7D2 to move onto the plated layer 9c at which (the second part 8A2 of) the metal plate 8A is joined. Similarly, it is possible for the adhesion layer (solder) 11c that joins (the second part 8A2 of) the metal plate 8A to the die pad 7D2 to spread due to wettability on the plated layer 9c, however, spreading due to wettability is limited to within the region of the plated layer 9c, and it is not possible to spread due to wettability to the outside of the region on the plated layer 9c. Consequently, it is not possible for the adhesion layer (solder) 11c that joins (the second part 8A2 of) the metal plate 8A to the die pad 7D2 to move onto the plated layer 9b at which the semiconductor chip 4PL is joined.

Because of this, the thickness of the adhesion layer (solder) 11a that joins the semiconductor chip 4PL to the die pad 7D2 (plated layer 9b) is regulated by the amount of solder (the amount of supply of the above-mentioned solder paste 11 onto the plated layer 9b) imparted onto the plated layer 9b of the die pad 7D2 before the die bonding of the semiconductor chip 4PL and thereby it is possible to suppress or prevent the variations in the thickness of the adhesion layer (solder) 11a that joins the semiconductor chip 4PL to the die pad 7D2 (plated layer 9b). Consequently, it is possible to prevent the thickness of the adhesion layer (solder) 11a that joins the semiconductor chip 4PL to the die pad 7D2 (plated layer 9b) from reducing. Similarly, the thickness of the adhesion layer (solder) 11c that joins (the second part 8A2 of) the metal plate 8A to the die pad 7D2 (plated layer 9c) is regulated by the amount of solder (the amount of supply of the above-mentioned solder paste 11 onto the plated layer 9c) imparted onto the plated layer 9c of the die pad 7D2 before the joining of the metal plate 8A and thereby it is possible to suppress or prevent the variations in the thickness of the adhesion layer (solder) 11c that joins (the second part 8A2 of) the metal plate 8A to the die pad 7D2 (plated layer 9c). Consequently, it is possible to prevent the thickness of the adhesion layer (solder) 11c that joins (the second part 8A2 of) the metal plate 8A to the die pad 7D2 (plated layer 9c) from reducing. Due to this, it is possible to increase the joint strength of the semiconductor chip 4PL, prevent the semiconductor chip 4PL from inclining, and increase the joint strength of (the second part 8A2 of) the metal plate 8A. In addition, since the thickness of the adhesion layers 11a, 11c can be prevented from reducing, and therefore, it is possible to improve the durability against the distortion due to thermal stress. Further, it is possible to suppress or prevent the metal plate 8A from moving and a short circuit failure can be prevented. Consequently, it is possible to improve the reliability of the semiconductor device SM1 and a DC-DC converter (here, the non-insulating type DC-DC converter 1) using the same.

As described above, spreading due to wettability of solder is limited by the plated layer 9b and the plated layer 9c, and therefore, in the semiconductor device SM1, on the region in which the plated layer 9 between the plated layer 9b and the plated layer 9c is not formed, a state is brought about where the adhesion layer (solder) 11c is not arranged on the top surface of the die pad 7D2.

Preferably, a separation (distance) W1 between the plated layer 9b and the plated layer 9c shown in FIG. 11 is not less than 100 μm (that is, W=100 μm). Because of this, it is made possible to accurately prevent the adhesion layer (solder) 11a that joins the semiconductor chip 4PL to the die pad 7D2 (plated layer 9b) and the adhesion layer (solder) 11c that joins the metal plate 8A to the die pad 7D2 (plated layer 9c) from coming into contact and communicating with each other in the solder reflow process in the above-mentioned step S4.

Preferably, the separation (distance) W1 between the plated layer 9b and the plated layer 9c shown in FIG. 11 is not more than 1 mm (that is, W1=1 mm). Due to this, it is possible to suppress an increase in resistance as well as suppressing an increase in size (increase in area) of the semiconductor device SM1.

In the present embodiment, on the top surface of the lead wire 7LB, the plated layer 9e1 and the plated layer 9e2 are provided independently of each other without being connected with each other. That is, on the top surface of the lead wire 7LB, the plated layer 9e1 to which the second part 8B2 of the metal plate 8B is joined and the plated layer 9e2 to which the third part 8B3 of the metal plate 8B is joined are separated on the top surface of the lead wire 7LB via a region in which the plated layer 9 is not formed in between.

Because of this, it is possible for the adhesion layer (solder) 11c that joins the second part 8B2 of the metal plate 8B to the lead wire 7LB to spread due to wettability on the plated layer 9e1, however, spreading due to wettability is limited to within the region of the plated layer 9e1, and it is not possible to spread due to wettability to the outside of the region on the plated layer 9e1. Consequently, it is not possible for the adhesion layer (solder) 11c that joins the second part 8B2 of the metal plate 8B to the lead wire 7LB to move onto the plated layer 9e2 at which the third part 8B3 of the metal plate 8B is joined. Similarly, it is possible for the adhesion layer (solder) 11c that joins the third part 8B3 of the metal plate 8B to the lead wire 7LB to spread due to wettability on the plated layer 9e2, however, spreading due to wettability is limited to within the region of the plated layer 9e2, and it is not possible to spread due to wettability to the outside of the region on the plated layer 9e2. Consequently, it is not possible for the adhesion layer (solder) 11c that joins the third part 8B3 of the metal plate 8B to the lead wire 7LB to move onto the plated layer 9e1 at which the second part 8B2 of the metal plate 8B is joined.

Because of this, the thickness of the adhesion layer (solder) 11c that joins the second part 8B2 of the metal plate 8B to the lead wire 7LB (plated layer 9e1) is regulated by the amount of solder (the amount of supply of the above-mentioned solder paste 11 onto the plated layer 9e1) imparted onto the plated layer 9e1 of the lead wire 7LB before the joining of the metal plate 8B and thereby it is possible to suppress or prevent the variations in the thickness of the adhesion layer (solder) 11c that joins the second part 8B2 of the metal plate 8B to the lead wire 7LB (plated layer 9e1). Consequently, it is possible to prevent the thickness of the adhesion layer (solder) 11c that joins the second part 8B2 of the metal plate 8B to the lead wire 7LB (plated layer 9e1) from reducing. Similarly, the thickness of the adhesion layer (solder) 11c that joins the third part 8B3 of the metal plate 8B to the lead wire 7LB (plated layer 9e2) is regulated by the amount of solder (the amount of supply of the above-mentioned solder paste 11 onto the plated layer 9e2) imparted onto the plated layer 9e2 of the lead wire 7LB before the joining of the metal plate 8B and thereby it is possible to suppress or prevent the variations in the thickness of the adhesion layer (solder) 11c that joins the third part 8B3 of the metal plate 8B to the lead wire 7LB (plated layer 9e2). Consequently, it is possible to prevent the thickness of the adhesion layer (solder) 11c that joins the third part 8B3 of the metal plate 8B to the lead wire 7LB (plated layer 9e2) from reducing. Due to this, it is possible to increase the joint strength of (the second part 8B2 and the third part 8B3 of) the metal plate 8B and prevent the thickness of the adhesion layer 11c from reducing, and therefore, it is possible to improve the durability against the distortion due to thermal stress. Further, it is possible to suppress or prevent the metal plate 8B from moving and a short circuit failure can be prevented. Consequently, it is possible to improve the reliability of the semiconductor device SM1 and a DC-DC converter (here, the non-insulating type DC-DC converter 1) using the same.

Next, the shapes of the metal plates 8A, 8B used in the present embodiment will be further described in detail.

Figure 35:
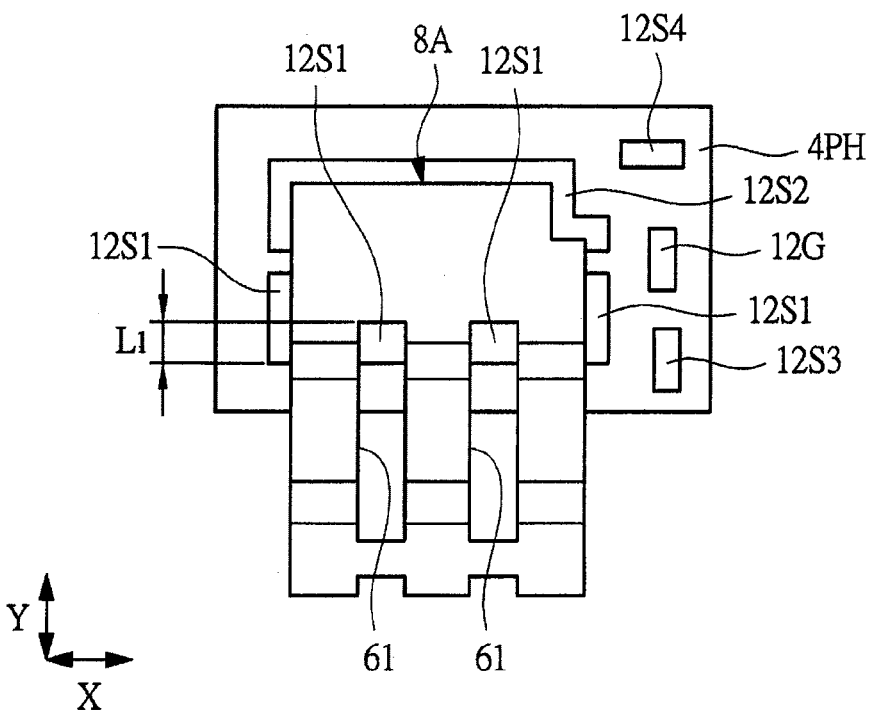
FIG. 35 is a plan view showing a state where a metal plate is joined to a semiconductor chip in a semiconductor device according to an embodiment of the present invention.
Figure 36:
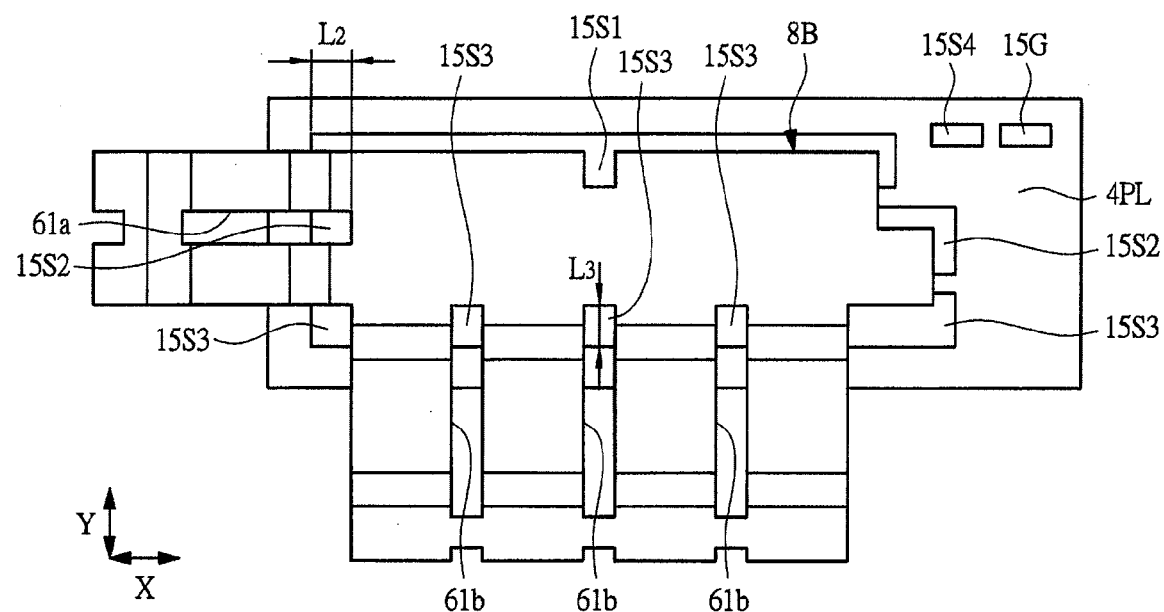
FIG. 36 is a plan view showing a state where a metal plate is joined to a semiconductor chip in a semiconductor device according to an embodiment of the present invention.

FIG. 35 is a plan view (top view) showing a state where the metal plate 8A is joined to the semiconductor chip 4PH in the semiconductor device SM1. FIG. 35 is a diagram in which only the semiconductor chip 4PH and the metal plate 8A are extracted and shown enlarged and other members are not shown schematically in the above-mentioned FIG. 6. FIG. 36 is a plan view (top view) showing a state where the metal plate 8B is joined to the semiconductor chip 4PL in the semiconductor device SM1. FIG. 36 is a diagram in which only the semiconductor chip 4PL and the metal plate 8B are extracted and shown enlarged and other members are not shown schematically in the above-mentioned FIG. 6.

As described above, the metal plate 8A includes the first part (high-side chip contact portion) 8A1 connected (by soldering) with the source electrode pads 12S1, 12S2 provided on the surface (top surface) of the semiconductor chip 4PH, the second part (mounting part contact portion) 8A2 connected (by soldering) with the plated layer 9c provided on the die pad 7D2, and the third part (intermediate portion) 8A3 that connects both. The third part (intermediate portion) 8A3 has a shape so as to be separated and distant from the semiconductor chip 4PH to prevent the contact with the peripheral edge portion of the semiconductor chip 4PH.

Preferably, a plated layer (not shown) is formed on the undersurface of the first part 8A1 of the metal plate 8A (region where the source electrode pads 12S1, 12S2 of the semiconductor chip 4PH are joined) and on the undersurface of the second part 8A2 of the metal plate 8A (region where it is joined to the plated layer 9c on the die pad 7D2), and a preferable material (metal material) as the plated layer is the same as that which is illustrated as a preferable material (metal material) with respect to the plated layer 9. By providing a plated layer (preferably a silver plated layer) on the undersurface of the first part 8A1 of the metal plate 8A and on the undersurface of the second part 8A2, it is possible to increase the joint strength between the metal plate 8A and the pads 12S1, 12S2 and the die pad 7D2 (plated layer 9c) of the semiconductor chip 4PH.

In the third part (intermediate portion) 8A3 of the metal plate 8A, an opening (first opening) 61 is formed. In the third part (intermediate portion) 8A3 of the metal plate 8A, the opening 61 is formed so as to extend from the side of the first part 8A1 to the side of the second part 8A2 (that is, along the second direction Y) and preferably, having the shape of a planar rectangle in which the dimension in the first direction X is greater than that in the second direction Y. In the metal plate 8A, at least one opening 61 is formed, however, preferably, two or more (here, two) are formed.

By providing the opening 61, the metal plate 8A becomes easier to deform by thermal stress, and therefore, it is possible to reduce the burden on the joint part (adhesion layer 11b) between the metal plate 8A and the semiconductor chip 4PH, and on the joint part (adhesion layer 11c) between the metal plate 8A and the die pad 7D2. That is, the stress/distortion can be reduced, and therefore, it is possible to further improve the reliability of the semiconductor device SM1.

In the present embodiment, as shown in FIG. 35, in the state where the metal plate 8A is joined to the semiconductor chip 4PH (after the solder reflow process in the above-mentioned step S4), the opening 61 provided in the metal plate 8A overlaps part of the source electrode pads 12S1, 12S2 provided on the surface (top surface) of the semiconductor chip 4PH in a planar manner. That is, the state is such that part of the source electrode pads 12S1, 12S2 of the semiconductor chip 4PH is exposed from the opening 61 of the metal plate 8A when viewed from above the semiconductor chip 4PH. In the case of FIG. 35, the opening 61 of the metal plate 8A overlaps part of the source electrode pad 12S1 of the semiconductor chip 4PH in a planar manner, and the state is such that part of the source electrode pad 12S1 of the semiconductor chip 4PH is exposed from the opening 61 of the metal plate 8A when viewed from above the semiconductor chip 4PH. In other words, in a planar view, the opening 61 of the metal plate 8A crosses the long side of the semiconductor chip 4PH (long side on the side in opposition to the semiconductor chip 4PL) and extends until it reaches the source electrode pad (here, pad 12S1) of the semiconductor chip 4PH.

In order for this to be done, it is only required to form the opening 61 in the third part (intermediate portion) 8A3 of the metal plate 8A so as also to be included in (extended to) part of the first part 8A1 of the metal plate 8A. That is, it is only required to form the opening 61 from the third part 8A3 of the metal plate 8A to part of the first part 8A1 so that the opening 61 also extends to (is formed in) part of the first part 8A1 of the metal plate 8A and so that one of end parts of the opening 61 is located in the first part 8A1. Due to this, the first part 8A1 of the metal plate 8A is joined to the source electrode pads 12S1, 12S2 of the semiconductor chip 4PH and, at the same time, part of the source electrode pads 12S1, 12S2 (here, part of the pad 12S1) of the semiconductor chip 4PH can be exposed from the opening 61 of the metal plate 8A.

In the present embodiment, the state is such that part of the source electrode pads 12S1, 12S2 of the semiconductor chip 4PH is exposed from the opening 61 of the metal plate 8A when viewed from above the semiconductor chip 4PH in the state where the metal plate 8A is joined to the semiconductor chip 4PH. Because of this, it is possible to observe the state and amount of the adhesion layer 11b that joins the first part 8A1 of the metal plate 8A and the source electrode pads 12S1, 12S2 of the semiconductor chip 4PH by an external appearance inspection through the opening 61 of the metal plate 8A before the mold (resin sealing) process in the above-mentioned step S7 is performed (preferably, after the solder reflow process in the above-mentioned step S4 and before the wire boding process in the above-mentioned step S6). That is, it is possible to observe (confirm) through the opening 61 of the metal plate 8A whether the adhesion layer 11b is excessive (whether the adhesion layer 11b overflows to the outside beyond the region on the pads 12S1, 12S2). When it is determined that the adhesion layer 11b is excessive as a result of the observation through the opening 61 of the metal plate 8A, there is a possibility that the source electrode pads 12S1, 12S2 on the top surface of the semiconductor chip 4PH and the side surface (this side surface is at the drain potential) of the semiconductor chip 4PH short-circuit via the conductive adhesion layer 11b, and therefore, it is sorted out and removed, and thus it is possible to send only those which are judged that the state and amount of the adhesion layer 11b are normal to the subsequent processes. Due to this, the reliability of the semiconductor device SM1 can be improved and the occurrence of defect, such as short circuit, can be found without the need to manufacture the semiconductor device SM1 through the final process of assembly, and therefore, it is possible to reduce the manufacturing cost of the semiconductor device SM1 and increase the production yield of the semiconductor device SM1.

Preferably, a length $L_1$ in the second direction Y of the region in which the opening 61 of the metal plate 8A and the source electrode pads 12S1, 12S2 (here, the pad 12S1) of the semiconductor chip 4PH overlap (that is, the length $L_1$ in the second direction Y of the source electrode pads 12S1, 12S2 exposed from the opening 61 of the metal plate 8A when viewed from above the semiconductor chip 4PH) is about 100 to 200 μm (refer to FIG. 35). Due to this, it is made possible to easily observe (confirm) whether the adhesion layer 11b is excessive through the opening 61 of the metal plate 8A.

In addition, as described above, the metal plate 8B has the first part (low-side chip contact portion) 8B1 connected (by soldering) with the source electrode pads 15S1, 15S2, 15S3 provided on the top surface of the semiconductor chip 4PL, the second part (first contact portion) 8B2 connected (by soldering) with the plated layer (first plated layer) 9e1 provided on the lead wire (ground terminal part) 7LB, and the fourth part (first intermediate portion) 8B4 that connects both. The fourth part (first intermediate portion) 8B4 has a shape so as to be separated and distant from the semiconductor chip 4PL to prevent the contact with the peripheral edge portion of the semiconductor chip 4PL. The metal plate 8B further has the third part (second contact portion) 8B3 connected (by soldering) with the plated layer (second plated layer) 9e2 provided on the lead wire (ground terminal part) 7LB and the fifth part (second intermediate portion) 8B5 that connects the first part 8B1 and the third part 8B3. The fifth part (second intermediate portion) 8B5 has a shape so as to be separated and distant from the semiconductor chip 4PL to prevent the contact with the peripheral edge portion of the semiconductor chip 4PL. The metal plate 8B includes these first to fifth parts 8B1 to 8B5.

As in the case of the metal plate 8A, preferably, a plated layer (not shown) is formed on the undersurface of the first part 8B1 of the metal plate 8B (region where it is joined to the source electrode pads 15S1 to 15S3 of the semiconductor chip 4PL) and on the undersurfaces of the second part 8B2 and the third part 8B3 (region where they are joined to the plated layers 9e1, 9e2 on the lead wire 7LB). A preferable material (metal material) as the plated layer 9 is the same as that which is illustrated as a preferable material (metal material) with respect to the plated layer 9. Due to this, it is possible to increase the joint strength between the metal plate 8B and the pads 15S1 to 15S3 and the lead wire 7LB (plated layers 9e1, 9e2) of the semiconductor chip 4PL.

In the fourth part (intermediate portion) 8B4 of the metal plate 8B, an opening (second opening) 61a is formed and in the fifth part (intermediate portion) 8B5 of the metal plate 8B, an opening (second opening) 61b is formed. In the fourth part (intermediate portion) 8B4 of the metal plate 8B, the opening 61a is formed so as to extend from the side of the first part 8B1 to the side of the second part 8B2 (that is, along the first direction X) and preferably, having the shape of a planar rectangle in which the dimension in the first direction X is greater than that in the second direction Y. In addition, in the fifth part (intermediate portion) 8B5 of the metal plate 8B, the opening 61b is formed so as to extend from the side of the first part 8B1 to the side of the third part 8B3 (that is, along the second direction Y) and preferably, having the shape of a planar rectangle in which the dimension in the second direction Y is greater than that in the first direction X. In the metal plate 8B, at least one opening 61a and one opening 61b are formed, however, preferably, two or more (here, one opening 61a and three openings 61b) are formed.

As in the case of the above-mentioned metal plate 8A, by providing the openings 61a, 61b, the metal plate 8B becomes easier to deform by thermal stress, and therefore, it is possible to reduce the burden on the joint part (adhesion layer 11b) between the metal plate 8B and the semiconductor chip 4PL, and on the joint part (adhesion layer 11c) between the metal plate 8B and the lead wire 7LB. That is, the stress/distortion can be reduced, and therefore, it is possible to further improve the reliability of the semiconductor device SM1.

In the present embodiment, as shown in FIG. 36, in the state where the metal plate 8B is joined to the semiconductor chip 4PL (after the solder reflow process in the above-mentioned step S4), the openings 61a, 61b provided in the metal plate 8B overlap part of the source electrode pads 15S1, 15S2, 15S3 provided on the top surface of the semiconductor chip 4PL in a planar manner. That is, the state is such that part of the source electrode pads 15S1, 15S2, 15S3 of the semiconductor chip 4PL is exposed from the openings 61a, 61b of the metal plate 8B when viewed from above the semiconductor chip 4PL. In the case of FIG. 36, the opening 61a of the metal plate 8B overlaps part of the source electrode pad 15S2 of the semiconductor chip 4PL in a planar manner, and the state is such that part of the source electrode pad 15S2 of the semiconductor chip 4PL is exposed from the opening 61a of the metal plate 8B when viewed from above the semiconductor chip 4PL. In addition, in the case of FIG. 36, the opening 61b of the metal plate 8B overlaps part of the source electrode pad 15S3 of the semiconductor chip 4PL in a planar manner, and the state is such that part of the source electrode pad 15S3 of the semiconductor chip 4PL is exposed from the opening 61b of the metal plate 8B when viewed from above the semiconductor chip 4PL. In other words, in a planar view, the opening 61a of the metal plate 8B crosses the short side of the semiconductor chip 4PL (short side on the side in opposition to the lead wire 7LB) and extends until it reaches the source electrode pad (here, pad 15S2) of the semiconductor chip 4PL. In addition, the opening 61b of the metal plate 8B crosses the long side of the semiconductor chip 4PL (long side on the side in opposition to the lead wire 7LB) and extends until it reaches the source electrode pad (here, pad 15S3) of the semiconductor chip 4PL.

In order for this to be done, it is only required to form the opening 61a in the fourth part (first intermediate portion) 8B4 of the metal plate 8B so as also to be included in (extended to) part of the first part 8B1 of the metal plate 8B. That is, it is only required to form the opening 61a from the fourth part 8B4 of the metal plate 8B to part of the first part 8B1 so that the opening 61a also extends to (is formed in) part of the first part 8B1 of the metal plate 8B and so that one of end parts of the opening 61a is located in the first part 8B1. Similarly, it is only required to form the opening 61b in the fifth part (second intermediate portion) 8B5 of the metal plate 8B so as also to be included in (extended to) part of the first part 8B1 of the metal plate 8B. That is, it is only required to form the opening 61b from the fifth part 8B5 of the metal plate 8B to part of the first part 8B1 so that the opening 61b also extends to (is formed in) part of the first part 8B1 of the metal plate 8B and so that one of end parts of the opening 61b is located in the first part 8B1. Due to this, the first part 8B1 of the metal plate 8B is joined to the source electrode pads 15S1, 15S2, 15S3 of the semiconductor chip 4PL and, at the same time, part of the source electrode pads 15S1, 15S2, 15S3 (here, part of the pad 15S2 and part of the pad 15S3) of the semiconductor chip 4PL can be exposed from the openings 61a, 61b of the metal plate 8B.

In the present embodiment, the state is such that part of the source electrode pads 15S1, 15S2, 15S3 of the semiconductor chip 4PL is exposed from the openings 61a, 61b of the metal plate 8B when viewed from above the semiconductor chip 4PL in the state where the metal plate 8B is joined to the semiconductor chip 4PL. Because of this, it is possible to observe the state and amount of the adhesion layer 11b that joins the first part 8B1 of the metal plate 8B and the source electrode pads 15S1, 15S2, 15S3 of the semiconductor chip 4PL by an external appearance inspection through the openings 61a, 61b of the metal plate 8B before the mold (resin sealing) process in the above-mentioned step S7 is performed (preferably, after the solder reflow process in the above-mentioned step S4 and before the wire boding process in the above-mentioned step S6). That is, it is possible to observe (confirm) through the openings 61a, 61b of the metal plate 8B whether the adhesion layer 11b is excessive (whether the adhesion layer 11b overflows to the outside beyond the region on the pads 15S1, 15S2, 15S3). This external appearance inspection can be made at the same time as the external appearance inspection for observing the adhesion layer 11b through the opening 61 of the above-mentioned metal plate 8A. When it is determined that the adhesion layer 11b is excessive as a result of the observation through the openings 61a, 61b of the metal plate 8B, there is a possibility that the source electrode pads 15S1 to 15S3 on the top surface of the semiconductor chip 4PL and the side surface (this side surface is at the drain potential) of the semiconductor chip 4PL short-circuit via the conductive adhesion layer 11b, and therefore, it is sorted out and removed, and thus it is possible to send only those which are judged that the state and amount of the adhesion layer 11b are normal to the subsequent processes. Due to this, the reliability of the semiconductor device SM1 can be improved and the occurrence of defect, such as short circuit, can be found without the need to manufacture the semiconductor device SM1 through the final process of assembly, and therefore, it is possible to reduce the manufacturing cost of the semiconductor device SM1 and increase the production yield of the semiconductor device SM1.

Preferably, a length $L_2$ in the first direction X of the region in which the opening 61a of the metal plate 8B and the source electrode pads 15S1 to 15S3 of the semiconductor chip 4PL overlap, and a length $L_3$ in the second direction Y of the region in which the opening 61b of the metal plate 8B and the source electrode pads 15S1 to 15S3 of the semiconductor chip 4PL overlap are about 100 to 200 µm, respectively (refer to FIG. 36). Due to this, it is made possible to easily observe (confirm) whether the adhesion layer 11b is excessive through the openings 61a, 61b of the metal plate 8B.

Figure 37:
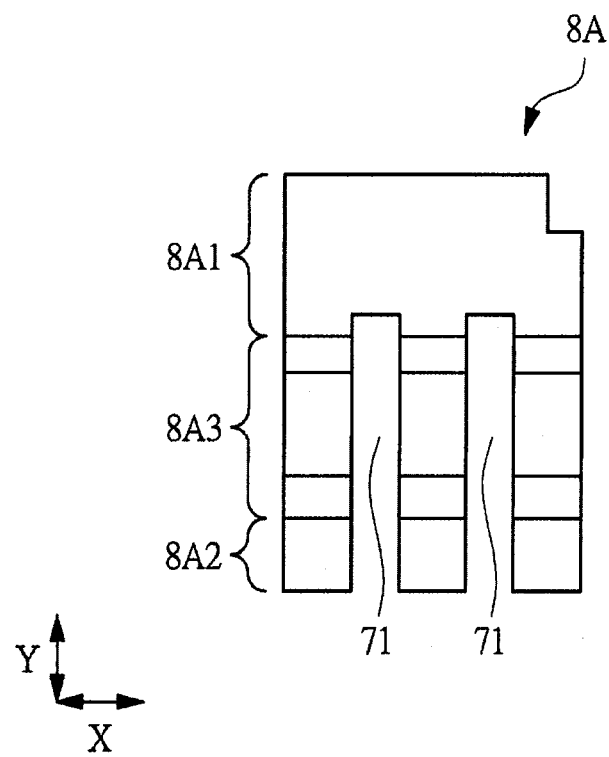
FIG. 37 is a plan view showing a modification of a metal plate used in a semiconductor device according to an embodiment of the present invention.
Figure 38:
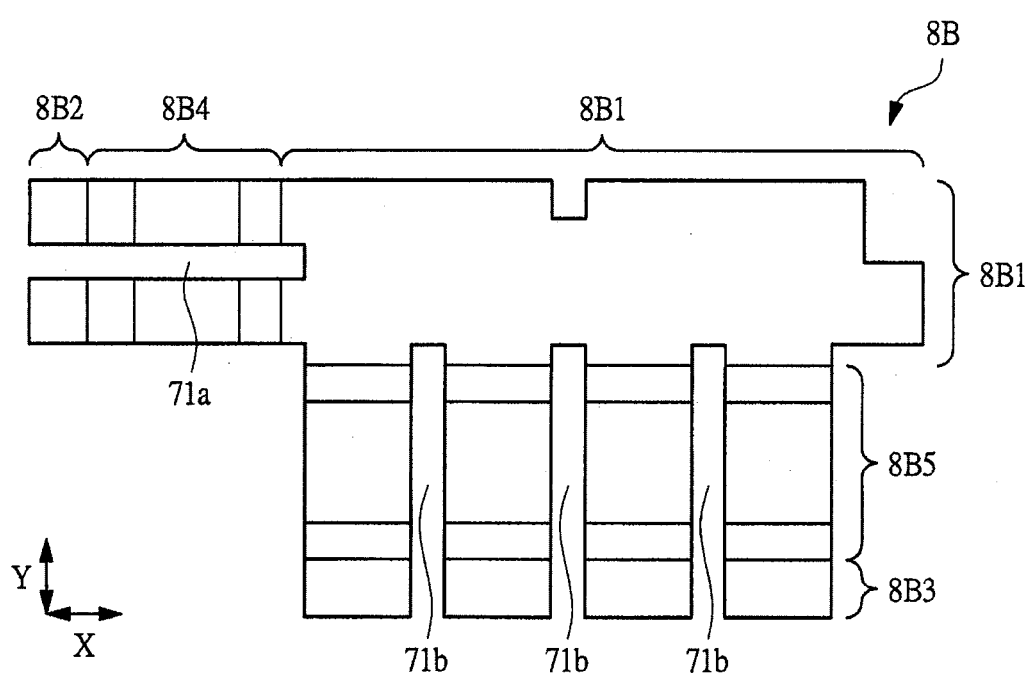
FIG. 38 is a plan view showing a modification of a metal plate used in a semiconductor device according to an embodiment of the present invention.
Figure 39:
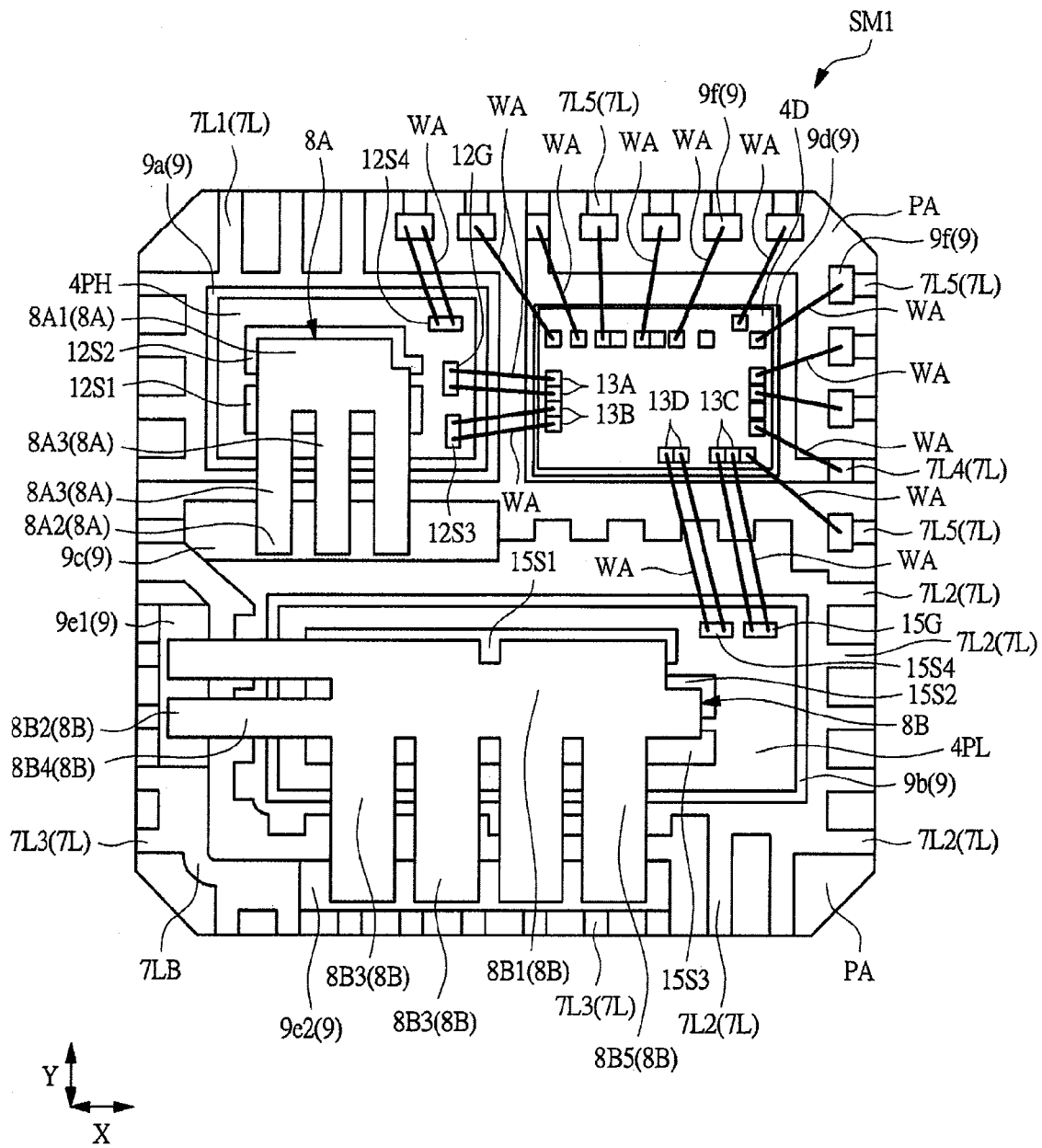
FIG. 39 is a plan perspective view of a semiconductor device when the metal plate in FIG. 37
Figure 40:
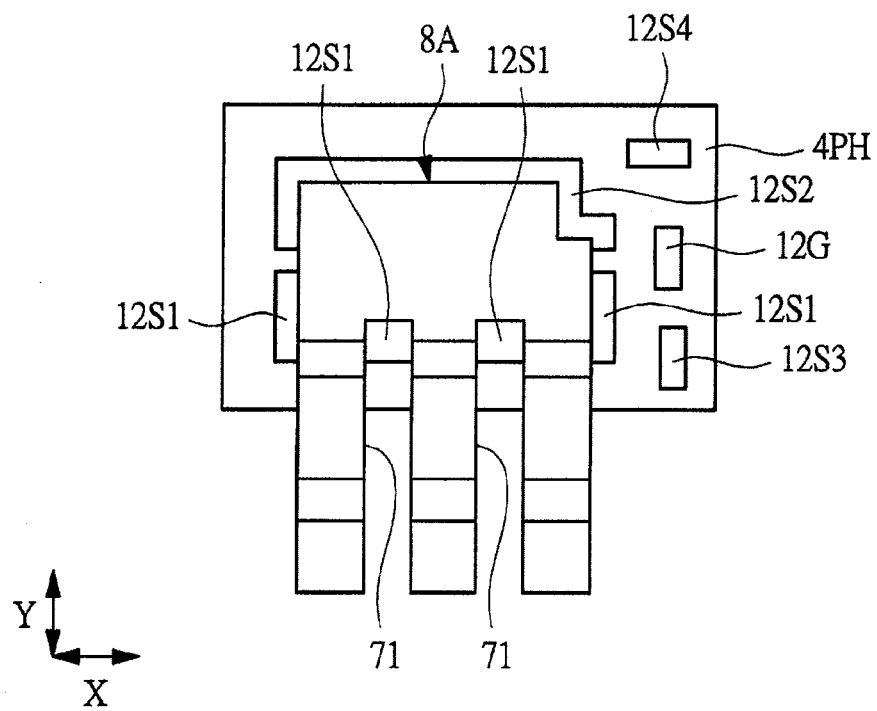
FIG. 40 is a plan view showing a state where the metal plate in FIG. 37 is joined to a semiconductor chip in a semiconductor device according to an embodiment of the present invention.
Figure 41:
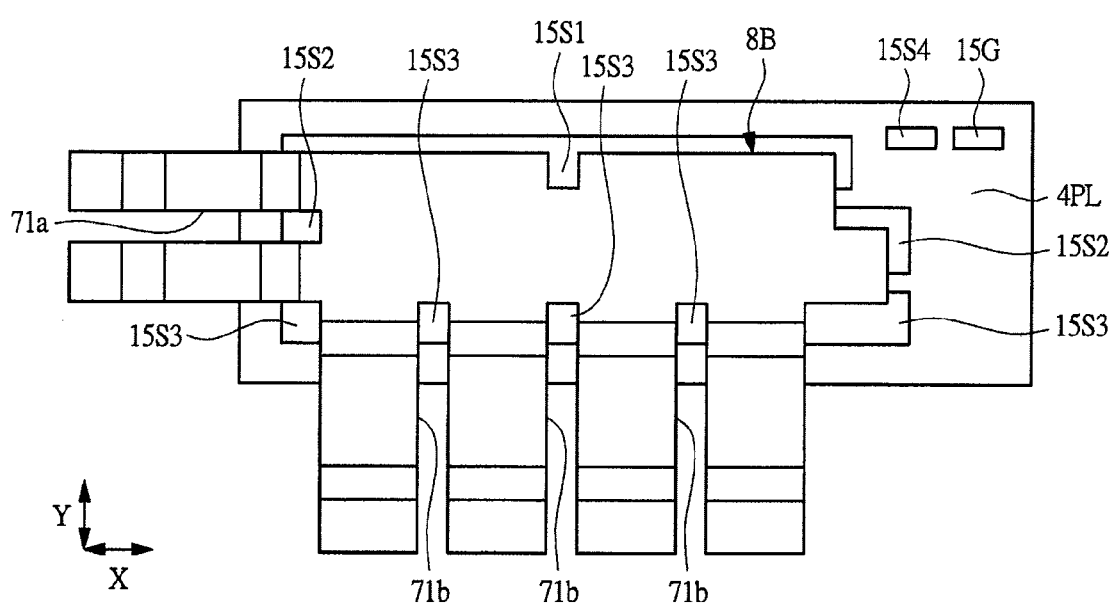
FIG. 41 is a plan view showing a state where the metal plate in FIG. 38 is joined to a semiconductor chip in a semiconductor device according to an embodiment of the present invention.

FIG. 37 is a plan view of a modification of the metal plate 8A and FIG. 38 is a plan view of a modification of the metal plate 8B, corresponding to the above-mentioned FIG. 14 and FIG. 15, respectively. FIG. 39 is a plan perspective view of the semiconductor device SM1 when the metal plates 8A, 8B in the modifications in FIG. 37 and FIG. 38 are used, corresponding to the above-mentioned FIG. 6. FIG. 40 is a plan view (top view) showing a state where the metal plate 8A in FIG. 37 is joined to the semiconductor chip 4PH in the semiconductor device SM1, corresponding to the above-mentioned FIG. 35. FIG. 41 is a plan view (top view) showing a state where the metal plate 8B in FIG. 38 is joined to the semiconductor chip 4PL in the semiconductor device SM1, corresponding to the above-mentioned FIG. 36.

The metal plate 8A in the modification shown in FIG. 37 is provided with a slit (notch, division groove) 71 in the second part 8A2 and the third part 8A3 instead of the above-mentioned opening 61. That is, instead of the opening 61, the slit 71 is formed by extending the above-mentioned opening 61 until it completely crosses the second part 8A2 of the metal plate 8A on the metal plate 8A. Due to this, the second part 8A2 and the third part 8A3 of the metal plate 8A are divided into a plurality of parts by the slit 71, and thus the shape of a planar comb tooth is obtained.

Similarly, the metal plate 8B in the modification shown in FIG. 38 is provided with a slit (notch, division groove) 71a in the second part 8B2 and the fourth part 8B4 instead of the above-mentioned opening 61a and a slit (notch, division groove) 71b in the third part 8B3 and the fifth part 8B5 instead of the above-mentioned opening 61b. That is, instead of the opening 61a, the slit 71a is formed by extending the above-mentioned opening 61a until it completely crosses the second part 8B2 of the metal plate 8B and instead of the opening 61b, the slit 71b is formed by extending the above-mentioned opening 61b until it completely crosses the third part 8B3 of the metal plate 8B on the metal plate 8B. Due to this, the second part 8B2 and the fourth part 8B4 of the metal plate 8B are divided into a plurality of parts by the slit 71a, and thus the shape of a planar comb tooth is obtained and the third part 8B3 and the fifth part 8B5 of the metal plate 8B are divided into a plurality of parts by the slit 71b, and thus the shape of a planar comb tooth is obtained.

Here, the openings 61, 61a, 61b are surrounded by metal plates constituting the metal plates 8A, 8B as shown in FIG. 14 and FIG. 15, however, one of the end parts of the slits 71, 71a, 71b is not surrounded by the metal plates constituting the metal plates 8A, 8B but opened as shown in FIG. 37 and FIG. 38.

Since the metal plates 8A, 8B are provided with the slits 71, 71a, 71b, the metal plates 8A, 8B become easier to deform by thermal stress, and therefore, it is possible to reduce the burden on the joint part (adhesion layer 11b) between the metal plates 8A, 8B and the semiconductor chips 4PH, 4PL and the joint part (adhesion layer 11c) between the metal plates 8A, 8B and the die pad 7D2 or the lead wire 7LB. That is, stress/distortion can be reduced, and therefore, it is possible to further improve the reliability of the semiconductor device SM1.

Further, as shown in FIG. 40, in the state where the metal plate 8A is joined to the semiconductor chip 4PH, the slit 71 provided on the metal plate 8A overlaps part of the source electrode pads 12S1, 12S2 provided on the surface (top surface) of the semiconductor chip 4PH in a planar manner. That is, the state is such that part of the source electrode pads 12S1, 12S2 (here, part of the pad 12S1) of the semiconductor chip 4PH is exposed from the slit 71 of the metal plate 8A when viewed from above the semiconductor chip 4PH. In other words, when viewed in a planar manner, the slit 71 of the metal plate 8A crosses the long side of the semiconductor chip 4PH (long side on the side in opposition to the semiconductor chip 4PL) and extends until it reaches the source electrode pad (here, the pad 12S1) of the semiconductor chip 4PH.

In order for this to be done, it is only required to form the slit 71 on the metal plate 8A so as also to be included in (extends to) part of the first part 8A1 of the metal plate 8A. That is, it is only required to form the slit 71 from the second part 8A2 and the third part 8A3 of the metal plate 8A to part of the first part 8A1 so that the slit 71 extends to (is formed in) part of the first part 8A1 of the metal plate 8A, and thereby, the end part of the slit 71 is located at the first part 8A1.

This is also the same with the metal plate 8B, and as shown in FIG. 41, in the state where the metal plate 8B is joined to the semiconductor chip 4PL, the slits 71a, 71b provided on the metal plate 8B overlap part of the source electrode pads 15S1 to 15S3 provided on the surface (top surface) of the semiconductor chip 4PL in a planar manner. That is, the state is such that part of the source electrode pads 15S1 to 15S3 of the semiconductor chip 4PL is exposed from the slits 71a, 71b of the metal plate 8B when viewed from above the semiconductor chip 4PL. In other words, when viewed in a planar manner, the slit 71a of the metal plate 8B crosses the short side of the semiconductor chip 4PL (short side on the side in opposition to the lead wire 7LB) and extends until it reaches the source electrode pad (here, the pad 15S2) of the semiconductor chip 4PL. In addition, the slit 71b of the metal plate 8B crosses the long side of the semiconductor chip 4PL (long side on the side in opposition to the lead wire 7LB) and extends until it reaches the source electrode pad (here, the pad 15S3) of the semiconductor chip 4PL.

In order for this to be done, it is only required to form the slits 71a, 71b on the metal plate 8B so as also to be included in (extend to) part of the first part 8B1 of the metal plate 8B. That is, it is only required to form the slit 71a from the second part 8B2 and the fourth part 8B4 of the metal plate 8B to part of the first part 8B1 so that the slit 71a extends to (is formed in) part of the first part 8B1 of the metal plate 8B, and thereby, the end part of the slit 71a is located at the first part 8B1. In addition, it is only required to form the slit 71b from the third part 8B3 and the fifth part 8B5 of the metal plate 8B to part of the first part 8B1 so that the slit 71b extends to (is formed in) part of the first part 8B1 of the metal plate 8B, and thereby, the end part of the slit 71b is located at the first part 8B1.

Due to this, as described in the case of the above-mentioned openings 61, 61a, 61b, in the case of the slit also, it is possible to observe the state and amount of the adhesion layer 11b that joins the first parts 8A1, 8B1 of the metal plates 8A, 8B and the source electrode pads 12S1, 12S2, 15S1 to 15S3 of the semiconductor chips 4PH, 4PL by an external appearance inspection through the slits 71, 71a, 71b of the metal plates 8A, 8B before the mold process in the above-mentioned step S7 is performed. Preferably, the external appearance inspection is made after the solder reflow process in the above-mentioned step S4 and before the wire boding process in the above-mentioned step S6. When it is determined that the adhesion layer 11b is excessive by the external appearance inspection, there is a possibility of a short circuit as described above, and therefore, it is sorted out and removed, and thus it is possible to send only those which are judged that the state and amount of the adhesion layer 11b are normal to the subsequent processes. Due to this, the reliability of the semiconductor device SM1 can be improved and the occurrence of defect, such as short circuit, can be found without the need to manufacture the semiconductor device SM1 through the final process of assembly, and therefore, it is possible to reduce the manufacturing cost of the semiconductor device SM1 and increase the production yield of the semiconductor device SM1.

Further, according to the study by the inventors of the present invention, it has been found that when connecting the source electrode pads of the semiconductor chips 4PH, 4PL and the die pad 7D2 and the lead wire 7LB via the metal plates 8A, 8B, there is a possibility that the solder (solder constituting the adhesion layer 11c) that joins the die pad 7D2 and the lead wire 7LB to the metal plates 8A, 8B moves as far as the semiconductor chips 4PH, 4PL along the undersurfaces (back surfaces) of the metal plates 8A, 8B in the solder reflow in step S4. If the solder (solder constituting the adhesion layer 11c) moves as far as the semiconductor chips 4PH, 4PL along the undersurfaces of the metal plates 8A, 8B and adheres to the side surfaces of the semiconductor chips 4PH, 4PL (this side surface is at the drain potential), there is a possibility that a short circuit is caused between source and drain of the power MOS's QH1, QL1 formed in the semiconductor chips 4PH, 4PL. Such a phenomenon may occur when the amount of solder that joins the die pad 7D2 and the metal plate 8A and solder that joins the lead wire 7LB and the metal plate 8B (that is, solder that constitutes the adhesion layer 11c) is excessive.

In the present embodiment, since the plated layer 9b and the plated layer 9c are separated and the plated layer 9e1 and the plated layer 9e2 are separated as described above, it is possible to prevent solder from moving back and forth between the plated layer 9b and the plated layer 9c and between the plated layer 9e1 and the plated layer 9e2, and therefore, it is possible to prevent the amount of solder that joins the die pad 7D2 and the metal plate 8A and solder that joins the lead wire 7LB and the metal plate 8B (that is, solder that constitutes the adhesion layer 11c) from becoming excessive. Because of this, it is possible to suppress or prevent the solder constituting the adhesion layer 11c from moving to the semiconductor chip 4PH along the undersurface of the metal plate 8A. Consequently, it is possible to suppress the solder constituting the adhesion layer 11c from moving as far as the semiconductor chips 4PH, 4PL along the undersurfaces of the metal plates 8A, 8B.

However, in order to further improve the reliability of the semiconductor device SM1, it is preferable to make it possible to confirm by means of external appearance inspection whether the solder constituting the adhesion layer 11c has moved as far as the semiconductor chips 4PH, 4PL along the undersurfaces of the metal plates 8A, 8B. To this end, by providing the metal plates 8A, 8B with the openings 61, 61a, 61b or the slits 71, 71a, 71b, it is possible to confirm (observe) whether the solder constituting the adhesion layer 11c has moved as far as the semiconductor chips 4PH, 4PL along the undersurfaces of the metal plates 8A, 8B through the openings 61, 61a, 61b or the slits 71, 71a, 71b of the metal plates 8A, 8B at the time of the above-mentioned external appearance inspection. Due to this, the reliability of the semiconductor device SM1 can be further improved and the occurrence of defect, such as a short circuit, can be detected accurately without the need to manufacture the semiconductor device SM1 through the final process of assembly, and therefore, it is possible to further reduce the manufacturing cost of the semiconductor device SM1 and further increase the production yield of the semiconductor device SM1.

In the above, the case will be described, where the metal plates 8A, 8B are provided with the openings 61, 61a, 61b and the case where the metal plates 8A, 8B are provided with the slits 71, 71a, 71b, however, the case where the metal plates 8A, 8B are provided with the openings 61, 61a, 61b has the following advantage compared to the case where the metal plates 8A, 8B are provided with the slits 71, 71a, 71b.

That is, when the metal plate 8A is provided with the slit 71 as shown in FIG. 37 to FIG. 41, the second part 8A2 of the metal plate 8A to be joined to the die pad 7D2 (plated layer 9c) is divided into a plurality of parts by the slit 71. Because of this, depending on the application state of the solder paste 11 onto the plated layer 9c of the die pad 7D2, there is a possibility that the amount of solder (adhesion layer 11c) differs among the divided parts of the second part 8A2 of the metal plate 8A, that is, some part has a large amount of solder but another part has a small amount of solder, and this adversely affects the improvement of joint strength between the metal plate 8A and the die pad 7D2. If there exit mixedly parts of the divided parts of the second part 8A2 of the metal plate 8A having a small amount of solder (adhesion layer 11c) and parts having a large amount of solder, it is likely that distortion due to thermal stress gathers and there is a possibility that the reliability of the semiconductor device is degraded. This also applies to the case where the metal plate 8B is provided with the slits 71a, 71b.

In contrast to this, when the metal plate 8A is provided with the opening 61 instead of the slit 71 as shown in FIG. 6, FIG. 13, FIG. 14, and FIG. 35, the second part 8A2 of the metal plate 8A to be joined to the die pad 7D2 (plated layer 9c) is not divided into a plurality of parts but configured into a single integrated part. Because of this, even if there are variations in the application state of the solder paste 11 onto the plated layer 9c of the die pad 7D2, the entire undersurface of the second part 8A2 of the metal plate 8A gets wet with solder and the entire undersurface of the second part 8A2 of the metal plate 8A is stably joined to the die pad 7D2 (plated layer 9c) via the adhesion layer 11c (solder) in the solder reflow process in step S4. Due to this, it is possible to improve the joint strength between the metal plate 8A and the die pad 7D2 and improve the resistance against distortion due to thermal stress. Consequently, it is possible to further improve the reliability of the semiconductor device SM1. This also applies to the case of the metal plate 8B. That is, when the metal plate 8B is provided with the opening 61a instead of the slit 71a as shown in FIG. 6, FIG. 13, FIG. 15, and FIG. 36, the second part 8B2 of the metal plate 8B to be joined to the lead wire 7LB (plated layer 9e1) is not divided into a plurality of parts but configured into a single integrated part. Similarly, when the metal plate 8B is provided with the opening 61b instead of the slit 71b, the third part 8B3 of the metal plate 8B to be joined to the lead wire 7LB (plated layer 9e2) is not divided into a plurality of parts but configured into a single integrated part. Because of this, even if there are variations in the application state of the solder paste 11 onto the plated layers 9e1, 9e2 of the lead wire 7LB, the entire undersurface of the second part 8B2 and the entire undersurface of the third part 8B3 of the metal plate 8B get wet with solder and stably joined to the lead wire 7LB (plated layers 9e1, 9e2) via the adhesion layer 11c (solder) in the solder reflow process in step S4. Due to this, it is possible to improve the joint strength between the metal plate 8B and the lead wire 7LB and improve the resistance against distortion due to thermal stress, and therefore, it is possible to further improve the reliability of the semiconductor device SM1.

Figure 42:
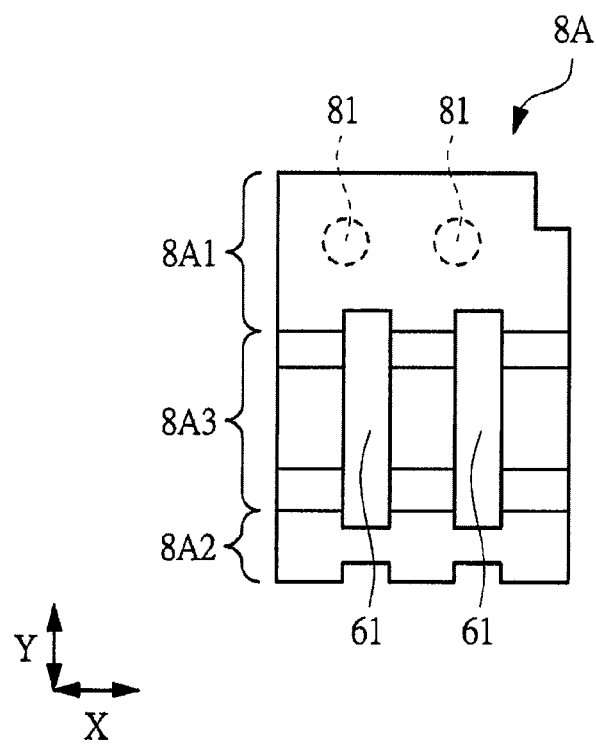
FIG. 42 is a plan view showing another modification of a metal plate used in a semiconductor device according to an embodiment of the present invention.
Figure 43:
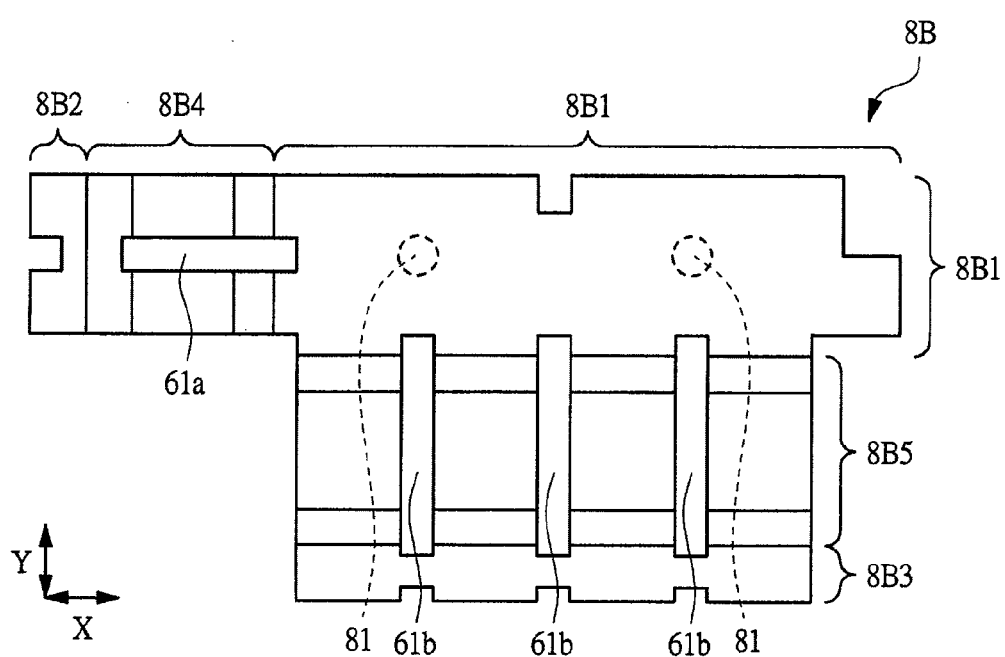
FIG. 43 is a plan view showing another modification of a metal plate used in a semiconductor device according to an embodiment of the present invention.
Figure 44:
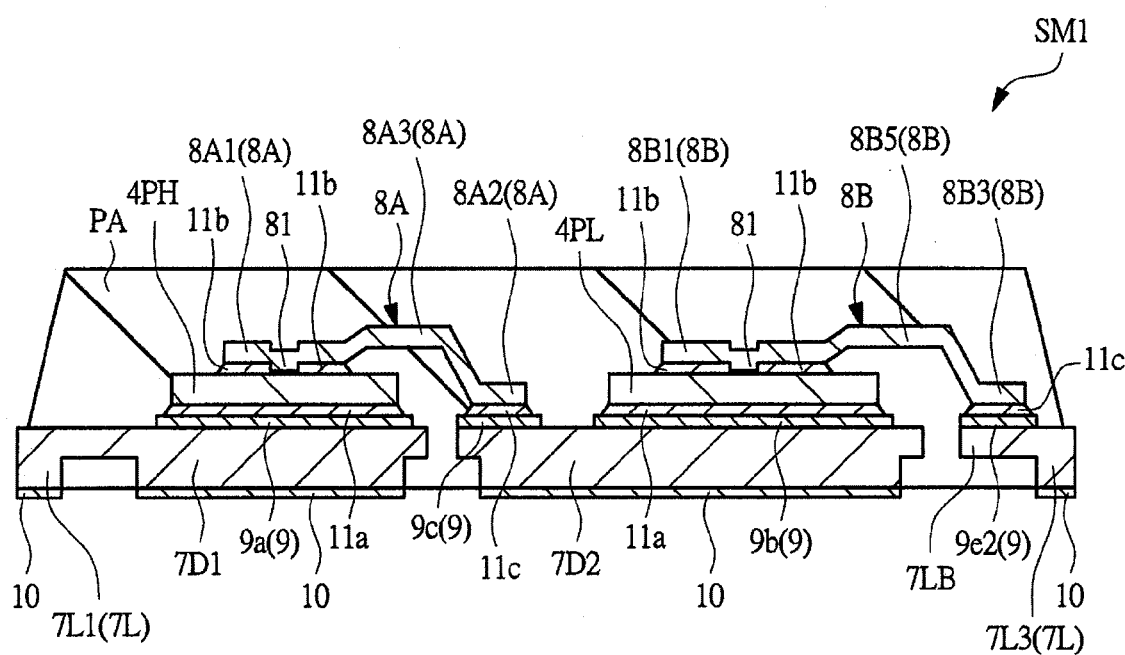
FIG. 44 is a section view of a semiconductor device when the metal plate in FIG. 42

FIG. 42 is a plan view of another modification of the metal plate 8A and FIG. 43 is a plan view of another modification of the metal plate 8B, corresponding to the above-mentioned FIG. 14 and FIG. 15, respectively. FIG. 44 is a section view of the semiconductor device SM1 when the metal plates 8A, 8B in the modifications in FIG. 42 and FIG. 43 are used, corresponding to the above-mentioned FIG. 7. FIG. 44 shows a section through a projection 81 of the metal plates 8A, 8B.

In the metal plates 8A, 8B in the modifications in FIG. 42 and FIG. 43, the projections (projected part, protruding part, convex part) 81 are formed on the undersurface of the first part 8A1 of the metal plate 8A (surface in opposition to the semiconductor chip 4PH) and on the undersurface of the first part 8B1 of the metal plate 8B (surface in opposition to the semiconductor chip 4PL), respectively. By providing the projections 81 on the undersurface of the first part 8A1 of the metal plate 8A and on the undersurface of the first part 8B1 of the metal plate 8B, it is possible to forcedly ensure the thickness of the adhesion layer 11b. Due to this, it is possible to increase the thickness of the adhesion layer 11b between the opposing surfaces of the metal plates 8A, 8B (first parts 8A1, 8B1) and the semiconductor chips 4PH, 4PL, and further, to make uniform the thickness of the adhesion layer 11b between the opposing surfaces of the metal plates 8A, 8B (first parts 8A1, 8B1) and the semiconductor chips 4PH, 4PL. Because of this, it is possible to suppress or prevent the metal plates 8A, 8B from inclining with respect to the main surface of the semiconductor chips 4PH, 4PL and to further improve the joint force between the metal plates 8A, 8B and the semiconductor chips 4PH, 4PL.

It is preferable to arrange two or more projections 81 on the undersurface of the first part 8A1 of the metal plate 8A and on the undersurface of the first part 8B1 of the metal plate 8B, respectively, and it is preferable for the height of the projection 81 to be the same on the metal plates 8A, 8B, respectively. Due to this, it is possible to prevent the metal plates 8A, 8B from inclining with respect to the main surface of the semiconductor chips 4PH, 4PL.

In addition, it is also possible to provide the projections 81 on the metal plates 8A, 8B in the above-mentioned FIG. 37 to FIG. 41, and to provide the projections 81 on the metal plates 8A, 8B in a second embodiment, to be described later.

Figure 45:
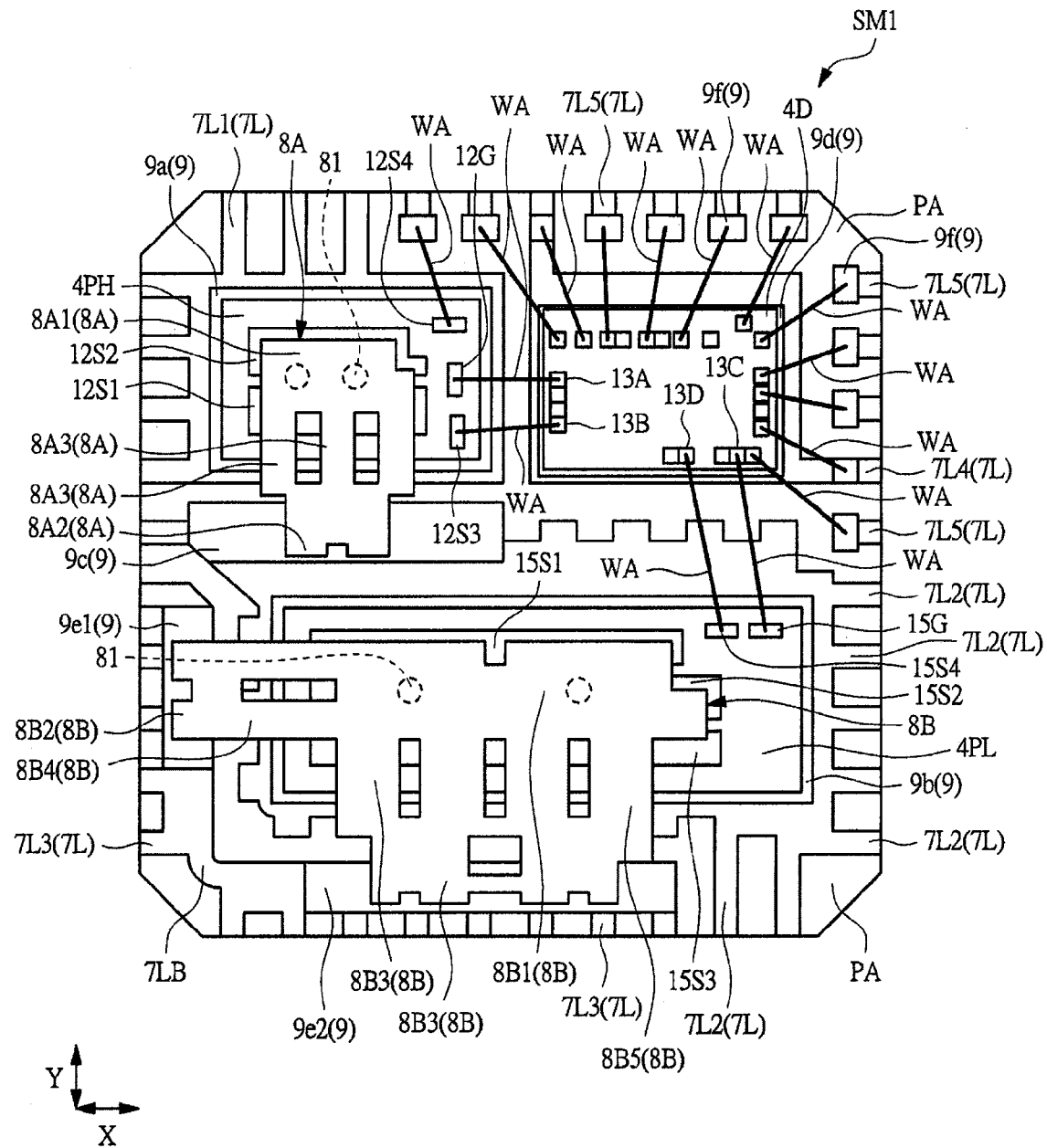
FIG. 45 is a plan perspective view of a semiconductor device according to another embodiment of the present invention.
Figure 46:
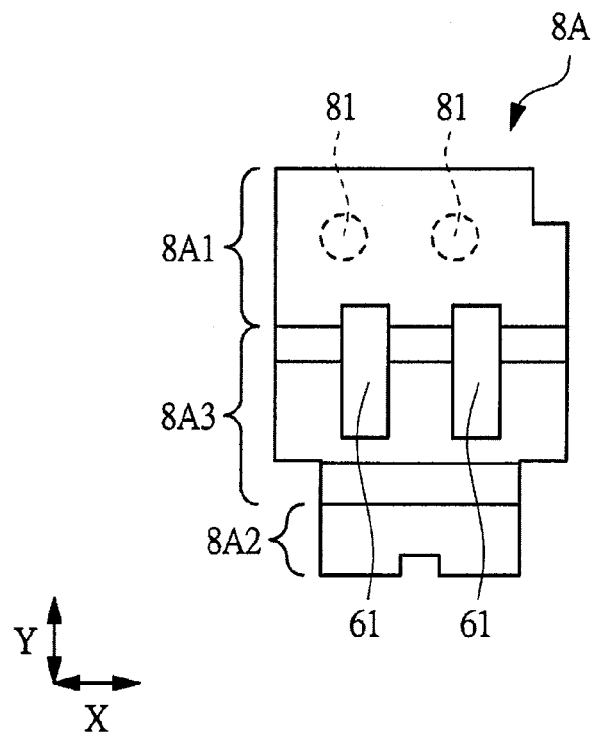
FIG. 46 is a plan view of a metal plate used in the semiconductor device in FIG. 45.
Figure 47:
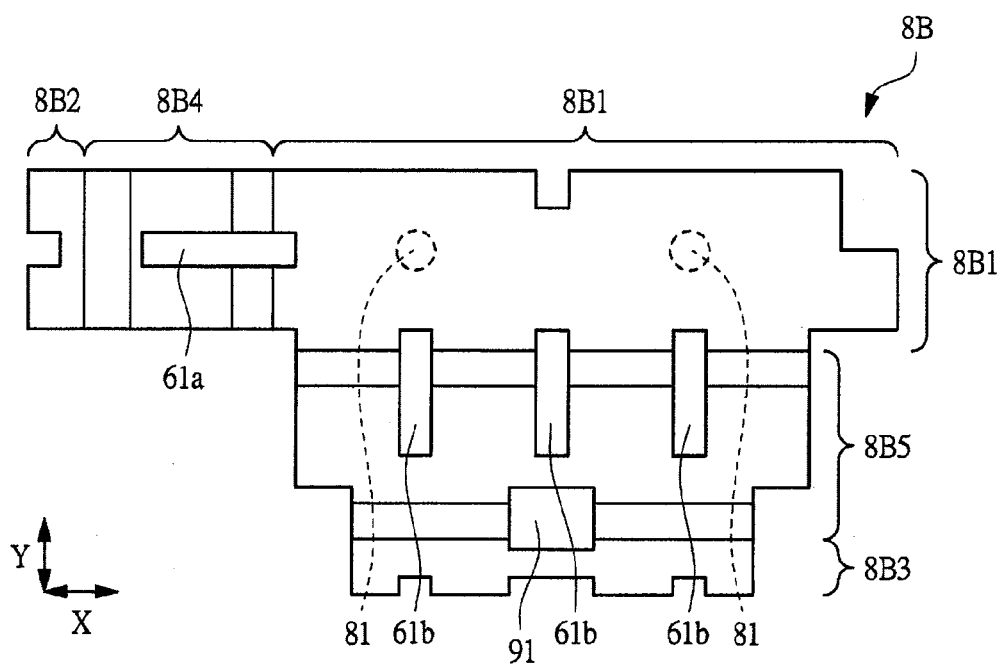
FIG. 47 is a plan view of a metal plate used in the semiconductor device in FIG. 45.
Figure 48:
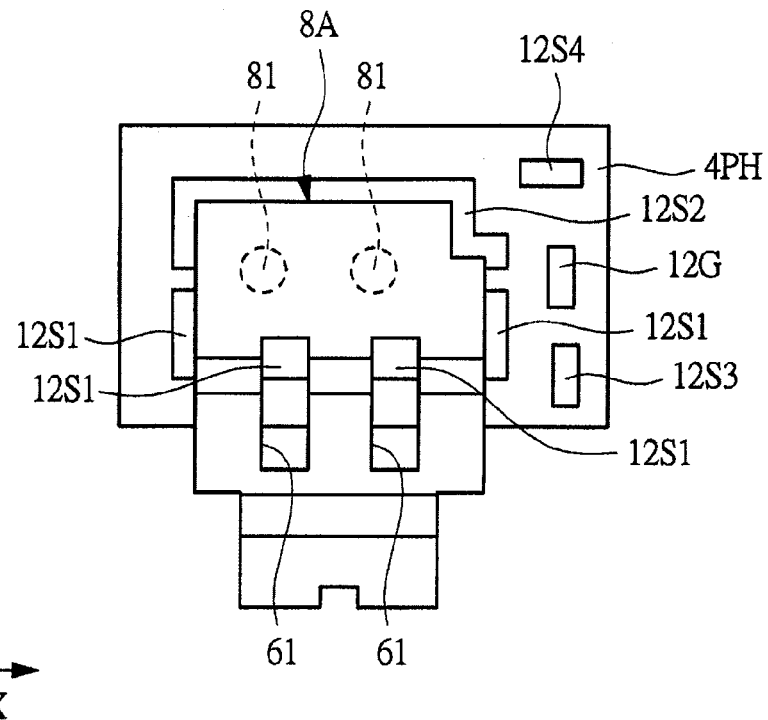
FIG. 48 is a plan view showing a state where the metal plate in FIG. 46 is joined to a semiconductor chip in the semiconductor device in FIG. 45.
Figure 49:
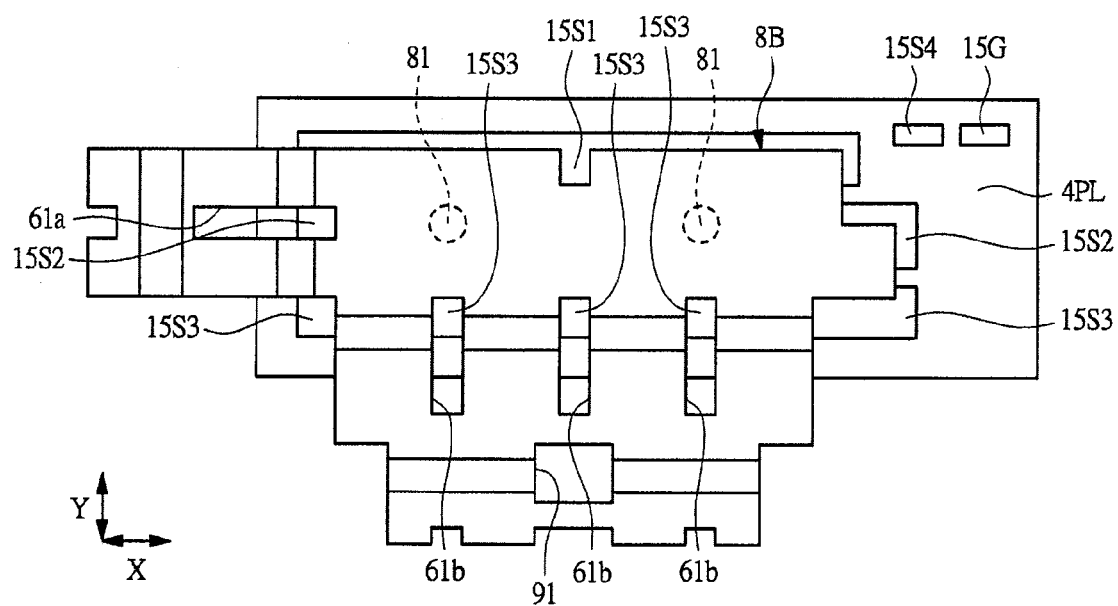
FIG. 49 is a plan view showing a state where the metal plate in FIG. 47 is joined to a semiconductor chip in the semiconductor device in FIG. 45.

(Second embodiment) FIG. 45 is a plan perspective view of the semiconductor device SM1 in the present embodiment, corresponding to FIG. 6 in the above-mentioned first embodiment. FIG. 46 is a plan view (top view) of the metal plate 8A used in the semiconductor device SM1 in FIG. 45 and FIG. 47 is a plan view (top view) of the metal plate 8B used in the semiconductor device SM1 in FIG. 45, corresponding to FIG. 14 and FIG. 15 in the above-mentioned first embodiment, respectively. FIG. 48 is a plan view (top view) showing a state where the metal plate 8A in FIG. 46 is joined to the semiconductor chip 4PH in the semiconductor device SM1 in FIG. 45, corresponding to the above-mentioned FIG. 35. FIG. 49 is a plan view (top view) showing a state where the metal plate 8B in FIG. 47 is joined to the semiconductor chip 4PL in the semiconductor device SM1 in FIG. 45, corresponding to the above-mentioned FIG. 36.

As can be seen from the comparison between FIG. 45 to FIG. 49 and FIG. 6, FIG. 14, FIG. 15, FIG. 35, and FIG. 36, the shapes of the metal plates 8A, 8B of the semiconductor device SM1 in the present embodiment shown in FIG. 45 differ from those of the semiconductor device SM1 in the above-mentioned first embodiment in the following points. Others are substantially the same as those in the above-mentioned first embodiment, and therefore, only the different points will be described.

As shown in FIG. 45, FIG. 46, and FIG. 48, in the present embodiment, the length (dimension in Y direction) of the opening 61 of the metal plate 8A is shorter than that of the metal plate 8A in the above-mentioned first embodiment (FIG. 14). That is, while in the above-mentioned first embodiment, as shown in FIG. 14 etc., one end part of the opening 61 of the metal plate 8A (end part on the side near the second part 8A2) reaches the second part 8A2 of the metal plate 8A, in the present embodiment, as shown in FIG. 45 etc., one end part of the opening 61 of the metal plate 8A (end part on the side near the second part 8A2) does not reach the second part 8A2 of the metal plate 8A but is located in the middle of the third part 8A3 of the metal plate 8A. In the present embodiment, by shortening the length of the opening 61 of the metal plate 8A (dimension in Y direction), the strength of the metal plate 8A can be increased.

However, in the present embodiment, as shown in FIG. 48, the opening 61 of the metal plate 8A crosses the long side of the semiconductor chip 4PH (long side on the side in opposition to the semiconductor chip 4PL) and extends as far as the middle in the third part 8A3 of the metal plate 8A when viewed in a planar manner. Because of this, as in the above-mentioned first embodiment, in the present embodiment also, the long side of the semiconductor chip 4PH (long side on the side in opposition to the semiconductor chip 4PL) crosses the opening 61 of the metal plate 8A when viewed in a planar manner. Then, the position of the other end part of the opening 61 of the metal plate 8A (end part on the side near the first part 8A1) is the same both in the above-mentioned first embodiment (refer to FIG. 14) and in the present embodiment (refer to FIG. 46).

Because of this, as in the above-mentioned first embodiment, in the present embodiment also, in the state where the metal plate 8A is joined to the semiconductor chip 4PH (after the solder reflow process in the above-mentioned step S4), as shown in FIG. 48, the opening 61 provided in the metal plate 8A overlaps in a planar manner part of the source electrode pads 12S1, 12S2 provided on the surface (top surface) of the semiconductor chip 4PH. That is, when viewed from above the semiconductor chip 4PH, the state is such that part of the source electrode pads 12S1, 12S2 of the semiconductor chip 4PH is exposed from the opening 61 of the metal plate 8A.

Consequently, as in the first embodiment, in the present embodiment also, it is possible to observe the state and amount of the adhesive layer 11b that joins the first part 8A1 of the metal plate 8A and the source electrode pads 12S1, 12S2 of the semiconductor chip 4PH by an external appearance inspection through the opening 61 of the metal plate 8A before the mold process in the above-mentioned step S7 is performed (preferably, after the solder reflow process in the above-mentioned step S4 and before the wire bonding process in the above-mentioned step S6). Due to this, the reliability of the semiconductor device SM1 can be further improved and the occurrence of defect, such as short circuit, can be found without the need to manufacture the semiconductor device SM1 through the final process of assembly, and therefore, it is possible to reduce the manufacturing cost of the semiconductor device SM1 and increase the production yield of the semiconductor device SM1.

This is substantially the same with the openings 61a, 61b of the metal plate 8B. That is, in the present embodiment, as shown in FIG. 45, FIG. 47, and FIG. 49, the length of the opening 61a (dimension in X direction) and the length of the opening 61b (dimension in Y direction) of the metal plate 8B are shorter than those of the metal plate 8B in the above-mentioned first embodiment (FIG. 15).

That is, in the above-mentioned first embodiment, as shown in FIG. 15 etc., one end part of the opening 61a of the metal plate 8B (end part on the side near the second part 8B2) reaches the second part 8B2 of the metal plate 8B and one end part of the opening 61b of the metal plate 8B (end part on the side near the third part 8B3) reaches the third part 8B3 of the metal plate 8B. In contrast to this, in the present embodiment, as shown in FIG. 47 etc., one end part of the opening 61a of the metal plate 8B (end part on the side near the second part 8B2) does not reach the second part 8B2 of the metal plate 8B but is located in the middle of the fourth part 8B4 of the metal plate 8B, and one end part of the opening 61b of the metal plate 8B (end part on the side near the third part 8B3) does not reach the third part 8B3 of the metal plate 8B but is located in the middle of the fifth part 8B5 of the metal plate 8B. In the present embodiment, by shortening the length of the openings 61a, 61b of the metal plate 8B, the strength of the metal plate 8B can be increased.

However, in the present embodiment, as shown in FIG. 49, the opening 61a of the metal plate 8B crosses the short side of the semiconductor chip 4PL (short side on the side in opposition to the lead wire 7LB) and extends as far as the middle in the fourth part 8B4 of the metal plate 8B and the opening 61b of the metal plate 8B crosses the long side of the semiconductor chip 4PL (long side on the side in opposition to the lead wire 7LB) and extends as far as the middle in the fifth part 8B5 of the metal plate 8B when viewed in a planar manner. Because of this, as in the above-mentioned first embodiment, in the present embodiment also, the short side of the semiconductor chip 4PL (short side on the side in opposition to the lead wire 7LB) crosses the opening 61a of the metal plate 8B and the long side of the semiconductor chip 4PL (long side on the side in opposition to the lead wire 7LB) crosses the opening 61b of the metal plate 8B when viewed in a planar manner. Then, the position of the other end part of the openings 61a, 61b of the metal plate 8B (end part on the side near the first part 8B1) is the same both in the above-mentioned first embodiment (refer to FIG. 15) and in the second embodiment (refer to FIG. 47).

Because of this, as in the above-mentioned first embodiment, in the present embodiment also, in the state where the metal plate 8B is joined to the semiconductor chip 4PL (after the solder reflow process in the above-mentioned step S4), as shown in FIG. 49, the openings 61a, 61b provided in the metal plate 8B overlap in a planar manner part of the source electrode pads 15S1, 15S2, 15S3 provided on the top surface of the semiconductor chip 4PL. That is, when viewed from above the semiconductor chip 4PL, the state is such that part of the source electrode pads 15S1, 15S2, 15S3 of the semiconductor chip 4PL are exposed from the openings 61a, 61b of the metal plate 8B.

Consequently, as in the first embodiment, in the present embodiment also, it is possible to observe the state and amount of the adhesive layer 11b that joins the first part 8B1 of the metal plate 8B and the source electrode pads 15S1 to 15S3 of the semiconductor chip 4PL by an external appearance inspection through the openings 61a, 61b of the metal plate 8A before the mold process in the above-mentioned step S7 is performed (preferably, after the solder reflow process in the above-mentioned step S4 and before the wire bonding process in the above-mentioned step S6). Due to this, the reliability of the semiconductor device SM1 can be further improved and the occurrence of defect, such as short circuit, can be found without the need to manufacture the semiconductor device SM1 through the final process of assembly, and therefore, it is possible to reduce the manufacturing cost of the semiconductor device SM1 and increase the production yield of the semiconductor device SM1.

Further, in the present embodiment, as shown in FIG. 45, FIG. 46, and FIG. 48, the width of the second part 8A2 of the metal plate 8A (dimension in X direction) is made narrower than that of the first part 8A1 and the third part 8A3 of the metal plate 8A (dimension in X direction). Furthermore, in the present embodiment, as shown in FIG. 45, FIG. 47, and FIG. 49, the width of the second part 8B2 (dimension in Y direction) is made narrower than that of the fourth part 8B4 (dimension in Y direction) and the width of the third part 8B3 (dimension in X direction) is made narrower than that of the fifth part 8B5 (dimension in X direction) in the metal plate 8B. Due to this, it is possible to reduce the area of application of the above-mentioned solder paste 11 to be applied onto the plated layer 9c of the die pad 7D2, the plated layer 9e1 of the lead wire 7LB, and the plated layer 9e2 of the lead wire 7LB.

In addition, in the present embodiment, as shown in FIG. 45, FIG. 47, and FIG. 49, in the metal plate 8B, the fifth part 8B5 in the region adjacent to the third part 8B3 is provided with an opening 91. By providing the opening 91 in the metal plate 8B in order to compensate for the reduction in the length of the openings 61a, 61b of the metal plate 8B, it is possible to balance the improvement of strength of the metal plate 8B and the facility of deformation of the metal plate 8B due to thermal stress. If not necessary, the formation of the opening 91 can be omitted.

As in the modifications in the above-mentioned FIG. 42 to FIG. 44, also in the present embodiment shown in FIG. 45 to FIG. 49, on the undersurface of the first part 8A1 of the metal plate 8A (surface in opposition to the semiconductor chip 4PH) and on the undersurface of the first part 8B1 of the metal plate 8B (surface in opposition to the semiconductor chip 4PL), the same projection 81 as the projection 81 on the metal plates 8A, 8B in the modifications in the above-mentioned FIG. 42 and FIG. 43 is formed in, for example, twos. It is possible to set the height of the projection 81 (height from the undersurface of the first part 8A1 of the metal plate 8A or from the undersurface of the first part 8B1 of the metal plate 8B) to, for example, about 0.05 mm. The section view through the projection 81 of the metal plates 8A, 8B is the same as the above-mentioned FIG. 44, and therefore, its schematic representation is omitted here. In the present embodiment also, the effect of the provision of the projections 81 on the metal plates 8A, 8B is the same as in the case of the metal plates 8A, 8B in the modifications in the above-mentioned FIG. 42 to FIG. 44, and it is possible to realize more accurately the preservation of the thickness of the adhesion layer 11b and the uniformity of the thickness of the adhesion layer 11b by providing the projections 81 on the metal plates 8A, 8B.

In addition, in the above-mentioned FIG. 6 of the above-mentioned first embodiment etc., the case is illustrated, in which the wires WA (here, two) are connected to each of the pads 12S3, 12S4, 12G of the semiconductor chip 4PH and the pads 15S4, 15G of the semiconductor chip 4PL, however, it is also possible to reduce the number of the wires WA to be connected to the individual pads to one. The semiconductor device SM1 in FIG. 45 shows the case where the number of the wires WA to be connected to each of the pads 12S3, 12S4, 12G of the semiconductor chip 4PH and the pads 15S4, 15G of the semiconductor chip 4PL, is reduced to one. By doing so, it is possible to reduce the total number of the wires WA, reducing the cost of the semiconductor device.

In the above, the invention accomplished by the present inventors has been specifically explained based on the embodiments. However, it cannot be overemphasized that the present invention is not restricted to the embodiments, and it can be changed variously in the range which does not deviate from the gist.

The present invention is effective when applied to a semiconductor device.

What is claimed is:

1. A semiconductor device including a DC-DC converter, comprising:
   (a) a high-side semiconductor chip in which a high-side MOSFET of the DC-DC converter is formed and which has a gate electrode pad, a source electrode pad, and a drain electrode of the high-side MOSFET;
   (b) a low-side semiconductor chip in which a low-side MOSFET of the DC-DC converter is formed and which has a gate electrode pad, a source electrode pad, and a drain electrode of the low-side MOSFET;
   (c) a driver semiconductor chip in which a driver circuit of the high-side MOSFET and the low-side MOSFET is formed;
   (d) a high-side chip mounting part over which the high-side semiconductor chip is mounted;
   (e) a low-side chip mounting part over which the low-side semiconductor chip is mounted;
   (f) a driver chip mounting part over which the driver semiconductor chip is mounted;
   (g) a high-side metal plate that electrically connects the source electrode pad of the high-side MOSFET provided on the high-side semiconductor chip and the low-side chip mounting part; and
   (h) a sealing body that covers a part of the high-side chip mounting part, a part of the low-side chip mounting part, a part of the driver chip mounting part, the high-side semiconductor chip, the low-side semiconductor chip, the driver semiconductor chip, and the high-side metal plate, wherein, on the top surface of the low-side chip mounting part, a low-side chip connecting plated layer formed in a region where the low-side semiconductor chip is mounted and a metal plate connecting plated layer formed in a region where the high-side metal plate is joined are provided, and wherein the low-side chip connecting plated layer and the metal plate connecting plated layer are separated.

2. The semiconductor device according to claim 1, wherein the low-side semiconductor chip is connected by soldering onto the low-side chip connecting plated layer of the low-side chip mounting part, and wherein the high-side metal plate is connected by soldering onto the metal plate connecting plated layer of the low-side chip mounting part.

3. The semiconductor device according to claim 2, wherein the gate electrode pad and the source electrode pad of the low-side MOSFET are formed on the surface of the low-side semiconductor chip, and wherein the drain electrode of the low-side MOSFET is formed on the back surface of the low-side semiconductor chip and connected by soldering to the low-side chip mounting part.

4. The semiconductor device according to claim 3, wherein the high-side chip mounting part and the low-side chip mounting part include copper or copper alloy.

5. The semiconductor device according to claim 4, wherein the low-side chip connecting plated layer and the metal plate connecting plated layer include a silver plated layer, respectively.

6. The semiconductor device according to claim 5, wherein the high-side metal plate includes copper or copper alloy.

7. The semiconductor device according to claim 6, wherein the high-side metal plate is connected by soldering to the source electrode pad of the high-side MOSFET provided on the high-side semiconductor chip.

8. The semiconductor device according to claim 7, wherein, on the top surface of the high-side chip mounting part, a high-side chip connecting plated layer is provided in a region where the high-side semiconductor chip is mounted, and wherein the high-side semiconductor chip is connected by soldering onto the high-side chip connecting plated layer of the high-side chip mounting part.

9. The semiconductor device according to claim 8, wherein the gate electrode pad and the source electrode pad of the high-side MOSFET are formed on the surface of the high-side semiconductor chip, and wherein the drain electrode of the high-side MOSFET is formed on the back surface of the high-side semiconductor chip and connected by soldering to the high-side chip mounting part.

10. The semiconductor device according to claim 9, further comprising a plurality of bonding wires that electrically connects the gate electrode pad and the source electrode pad of the high-side MOSFET provided on the high-side semiconductor chip, and the gate electrode pad and the source electrode pad of the low-side MOSFET provided on the low-side semiconductor chip to a plurality of pads of the driver semiconductor chip, respectively, wherein the bonding wires are covered with the sealing body.

11. The semiconductor device according to claim 10, wherein the width of the high-side metal plate is greater than each diameter of the bonding wires.

12. The semiconductor device according to claim 11, wherein the source electrode pad of the high-side MOSFET has a pad to which the high-side metal plate is coupled and a pad to which the bonding wire is connected.

13. The semiconductor device according to claim 12, wherein the high-side semiconductor chip and the low-side semiconductor chip have a pair of long sides and a pair of short sides intersecting therewith, respectively, wherein the long sides of the high-side semiconductor chip and those of the low-side semiconductor chip oppose to each other, and wherein the high-side metal plate is arranged so as to intersect with the long side of the high-side semiconductor chip opposing the low-side semiconductor chip.

14. The semiconductor device according to claim 13, wherein the high-side metal plate has a high-side chip contact portion connected by soldering to the source electrode pad of the high-side MOSFET provided on the high-side semiconductor chip, a mounting part contact portion connected by soldering to the metal plate connecting plated layer of the low-side chip mounting part, and an intermediate portion that couples the high-side chip contact portion and the mounting part contact portion.

15. The semiconductor device according to claim 14, wherein one or a plurality of first openings is formed in the intermediate portion of the high-side metal plate, wherein the first opening is formed so as to further extend as far as a part of the high-side chip contact portion of the high-side metal plate, and wherein the first opening overlaps in a planar manner a part of the source electrode pad of the high-side MOSFET provided on the high-side semiconductor chip.

16. The semiconductor device according to claim 14, wherein one or a plurality of first slits is formed on the mounting part contact portion of the high-side metal plate and the intermediate portion, wherein the first slit is formed so as to extend as far as a part of the high-side chip contact portion of the high-side metal plate, and wherein the first slit overlaps in a planar manner a part of the source electrode pad of the high-side MOSFET provided on the high-side semiconductor chip.

17. The semiconductor device according to claim 12, further comprising a ground terminal part that supplies a ground potential and a low-side metal plate that electrically connects the source electrode pad of the low-side MOSFET provided on the low-side semiconductor chip and the ground terminal part, wherein a part of the ground terminal part and the low-side metal plate are covered with the sealing body.

18. The semiconductor device according to claim 17, wherein the source electrode pad of the low-side MOSFET has a pad to which the low-side metal plate is coupled and a pad to which the bonding wire is connected.

19. The semiconductor device according to claim 18, wherein, on the top surface of the ground terminal part, a first plated layer and a second plated layer separated from each other are formed, wherein the low-side metal plate has a low-side chip contact portion connected by soldering to the source electrode pad of the low-side MOSFET provided on the low-side semiconductor chip, a first contact portion connected by soldering to the first plated layer of the ground terminal part, a second contact portion connected by soldering to the second plated layer of the ground terminal part, a first intermediate portion that couples the low-side chip contact portion and the first contact portion, and a second intermediate portion that couples the low-side chip contact portion and the second contact portion, and wherein the first intermediate portion and the first contact portion, and the second intermediate portion and the second contact portion are arranged so as to overlap with the two intersecting sides of the low-side semiconductor chip in plan view, respectively.

20. The semiconductor device according to claim 19, wherein, one or a plurality of second openings is formed in the first intermediate portion and the second intermediate portion of the low-side metal plate, wherein the second opening is formed so as to extend as far as a part of the low-side chip contact portion of the low-side metal plate, and wherein the second opening overlaps in a planar manner a part of the source electrode pad of the low-side MOSFET provided on the low-side semiconductor chip.

21. The semiconductor device according to claim 19, wherein, in the first contact portion and the first intermediate portion, and the second contact portion and the second intermediate portion of the low-side metal plate, one or a plurality of second slits is formed, respectively, wherein the second slit is formed so as to extend as far as a part of the low-side chip contact portion of the low-side metal plate, and wherein the second slit overlaps in a planar manner a part of the source electrode pad of the low-side MOSFET provided on the low-side semiconductor chip.

* * * * *